United States Patent
Pagnanelli

(10) Patent No.: US 8,299,947 B2
(45) Date of Patent: Oct. 30, 2012

(54) SAMPLING/QUANTIZATION CONVERTERS

(75) Inventor: Christopher Pagnanelli, Huntington Beach, CA (US)

(73) Assignee: Syntropy Systems, LLC, Costa Mesa, CA (US)

( * ) Notice: Subject to any disclaimer, the term of this patent is extended or adjusted under 35 U.S.C. 154(b) by 147 days.

(21) Appl. No.: 12/985,238

(22) Filed: Jan. 5, 2011

(65) Prior Publication Data

US 2011/0095927 A1   Apr. 28, 2011

Related U.S. Application Data

(63) Continuation-in-part of application No. 12/824,171, filed on Jun. 26, 2010, now Pat. No. 8,089,382.

(60) Provisional application No. 61/292,428, filed on Jan. 5, 2010, provisional application No. 61/381,055, filed on Sep. 8, 2010, provisional application No. 61/414,413, filed on Nov. 16, 2010, provisional application No. 61/221,009, filed on Jun. 26, 2009, provisional application No. 61/290,817, filed on Dec. 29, 2009.

(51) Int. Cl.
*H03M 3/00* (2006.01)

(52) U.S. Cl. ........ 341/143; 341/118; 341/120; 341/144; 341/155

(58) Field of Classification Search .......... 341/118–121, 341/131, 143, 144, 155
See application file for complete search history.

(56) References Cited

U.S. PATENT DOCUMENTS

| | | | |
|---|---|---|---|
| 5,075,679 A | 12/1991 | Gazsi | |
| 5,369,404 A * | 11/1994 | Galton | 341/143 |
| 5,568,142 A | 10/1996 | Velazquez et al. | |
| 6,177,893 B1 | 1/2001 | Velazquez et al. | |
| 6,249,238 B1 | 6/2001 | Steinlechner | |
| 6,359,576 B1 * | 3/2002 | Petrofsky | 341/143 |
| 6,473,013 B1 | 10/2002 | Velazquez et al. | |
| 6,518,905 B2 | 2/2003 | Siferd | |
| 6,538,588 B1 | 3/2003 | Bazarjani | |
| 6,577,259 B1 | 6/2003 | Jelonnek | |
| 6,683,550 B2 | 1/2004 | Al-Awadhi | |
| 6,750,795 B2 * | 6/2004 | Gupta | 341/143 |
| 6,771,198 B2 | 8/2004 | Azadet | |
| 6,795,002 B2 * | 9/2004 | Gupta | 341/143 |
| 6,842,129 B1 * | 1/2005 | Robinson | 341/143 |
| 6,873,280 B2 | 3/2005 | Robinson et al. | |
| 6,930,625 B1 | 8/2005 | Lin | |
| 6,980,147 B2 | 12/2005 | Mathis et al. | |

(Continued)

OTHER PUBLICATIONS

International Search Report and Written Opinion in PCT Application No. PCT/US2011/020268.

(Continued)

*Primary Examiner* — Linh Nguyen
(74) *Attorney, Agent, or Firm* — Joseph G. Swan, P.C.

(57) ABSTRACT

Provided are, among other things, systems, methods and techniques for converting a continuous-time, continuously variable signal into a sampled and quantized signal. According to one representative embodiment, an apparatus includes multiple continuous-time quantization-noise-shaping circuits, each in a separate processing branch and having an adder that includes multiple inputs and an output; an input signal is coupled to one of the inputs of the adder; the output of the adder is coupled to one of the inputs of the adder through a first filter; and the output of a sampling/quantization circuit in the same processing branch is coupled to one of the inputs of the adder through a second filter, with the second filter having a different transfer function than the first filter.

56 Claims, 33 Drawing Sheets

U.S. PATENT DOCUMENTS

| | | | |
|---|---|---|---|
| 7,193,544 B1 | 3/2007 | Fitelson et al. | |
| 7,289,054 B1 | 10/2007 | Watanabe | |
| 7,308,032 B2 | 12/2007 | Capofreddi | |
| 7,324,036 B2 | 1/2008 | Petre et al. | |
| 7,460,046 B2 * | 12/2008 | Di Giandomenico et al. | 341/143 |
| 7,519,513 B2 | 4/2009 | Pupalaikis et al. | |
| 7,528,754 B1 * | 5/2009 | Bakkaloglu et al. | 341/143 |
| 7,535,394 B2 | 5/2009 | Pupalaikis | |
| 7,548,179 B2 | 6/2009 | Jalan | |
| 7,554,472 B2 | 6/2009 | Puma | |
| 7,609,189 B1 * | 10/2009 | Tu et al. | 341/143 |
| 7,944,385 B2 * | 5/2011 | Le Guillou | 341/143 |
| 8,031,096 B2 * | 10/2011 | Kinyua | 341/143 |
| 8,094,051 B2 * | 1/2012 | Bos et al. | 341/143 |
| 8,159,380 B2 * | 4/2012 | Le Guillou et al. | 341/143 |
| 2006/0164272 A1 * | 7/2006 | Philips et al. | 341/143 |
| 2008/0310200 A1 | 12/2008 | Maksimovic et al. | |
| 2009/0066549 A1 | 3/2009 | Thomsen et al. | |
| 2009/0135038 A1 | 5/2009 | Das | |
| 2011/0199246 A1 | 8/2011 | Kinyua | |

OTHER PUBLICATIONS

Ortmans and Gerfers, "Continuous-Time Sigma-Delta A/D Conversion: Fundamentals, Performance Limits and Robust Implementations", ch. 3, Springer Berlin Heidelberg 2006.

I. Galton and H. Jensen, "Delta Sigma Modulator Based A/D Conversion without Oversampling", IEEE Transactions on Circuits and Systems, vol. 42, 1995.

I. Galton and T Jensen, "Oversampling Parallel Delta-Sigma Modulator A/D Conversion", IEEE Transactions on Circuits and Systems, vol. 43, 1996).

Aziz, P., "Multi-band Oversampled Noise Shaping Analog to Digital Conversion" (PhD Thesis), University of Pennsylvania, 1996.

A. Beydoun and P. Benabes, "Bandpass/Wideband ADC Architecture Using Parallel Delta Sigma Modulators", 14th European Signal Processing Conference, 2006.

O. Shoaei, W. M. Snelgrove, "A Multi-Feedback Design for LC Bandpass Delta-Sigma Modulators", Proceedings—International Symposium on Circuits and Systems, vol. 1, 1995.

D. Anastassiou, "Error Diffusion Coding in A/D Conversion," IEEE Transactions on Circuits and Systems, vol. 36, pp. 1175-1186, 1989.

Hoyos, Sebastian et al., "Analog to digital conversion of ultra-wideband signals in orthogonal spaces", IEEE Conference on Ultra Wideband Systems and Technologies, 2003, pp. 47-51.

Printout from http://www.eecg.toronto.edu/~kphang/ece1371/chap14_slides.pdf on Jul. 27, 2009.

Scott R. Velazquez, "High-Performance Advanced Filter Bank Analog-to-Digital Converter for Universal RF Receivers", Proceedings of the IEEE-SP International Symposium on Time-Frequency and Time-Scale Analysis, 1998. pp. 229-232.

Scott R. Velazquez et al., "Design of Hybrid Filter Banks for Analog/Digital Conversion", IEEE Transactions on Signal Processing, vol. 46, No. 4, Apr. 1998; pp. 956-967.

Scott R. Velazquez et al., "A hybrid filter bank approach to analog-to-digital conversion", Proceedings of the IEEE-SP International Symposium on Time-Frequency and Time-Scale Analysis (1994) pp. 116-119.

G. Ding et al., "Frequency-Interleaving Technique for High-Speed A/D Conversion", Proceedings of the 2003 International Symposium on Circuits and Systems, 2003, pp. 1-857-1-860.

P.P Vaidyanathan, "Analog/Digital Hybrid QMF Banks in A/D Conversion," Multirate Systems and Filter Banks, Englewood Cliffs, New Jersey: Prentice-Hall, 1993, pp. 163-164.

A. Petraglia and S.K. Mitra, "High-Speed A/D Conversion Using QMF Filter Banks," Proceeding IEEE International Symposium on Circuits and Systems, pp. 2797-2800, New Orleans, May 1990).

S.A. Jantzi, W.M. Snelgrove, and P.F. Ferguson Jr. "A Fourth-Order Bandpass Delta Sigma Modulator," IEEE Journal of Solid State Circuits, vol. 28, pp. 282-291, Mar. 1993.

Y. Matsuya, et. al. "A 16-bit Oversampling A-to-D Conversion Technology Using Triple-Integration Noise Shaping," IEEE Journal of Solid-State Circuits, vol. 22, pp. 921-929, Dec. 1987.

International Search Report and Written Opinion in corresponding PCT Application No. PCT/US2010/040115.

Eshraghi, A., et al., "A Comparative Analysis of Parallel Delta-Sigma ADC Architectures", IEEE Transactions on Circuits and Systems Part I: Regular Papers, vol. 51, No. 3, Mar. 1, 2004, pp. 450-458.

International Search Report and Written Opinion in corresponding PCT Application No. PCT/US2011/020274.

Philippe Benabes et al: "Extended frequency-band-decomposition sigma delta A/D converter", Analog Integrated Circuits and Signal Processing, Kluwer Academic Publishers, BO, vol. 61, No. 1, Jan. 9, 2009, pp. 75-85, XP019727213, ISSN: 1573-1979, DOI: D01:10.1007/S10470-008-9274-6.

Philippe Benabes et al: "A self-calibration scheme for extended frequency-band-decomposition sigma-delta ADC", Analog Integrated Circuits and Signal Processing, Kluwer Academic Publishers, BO, vol. 62, No. 3, Aug. 26, 2009, pp. 269-280, XP019766234, ISSN: 1573-1979.

Johns, D. and Martin, K., "Analog Integrated Circuit Design", John Wiley & Sons 1997, pp. 538-572.

Aziz, PM, et al., "Multi Band Sigma Delta Analog to Digital Conversion", IEEE International Conference on Acoustics, Speech, and Signal Processing, 1994. ICASSP-94, 1994.

Aziz, PM, et al., "An Overview of Sigma-Delta Converters: How a 1-bit ADC achieves more than 16-bit resolution", IEEE Signal Processing Magazine, vol. 13, Issue 1, Sep. 1996, pp. 61-84.

* cited by examiner

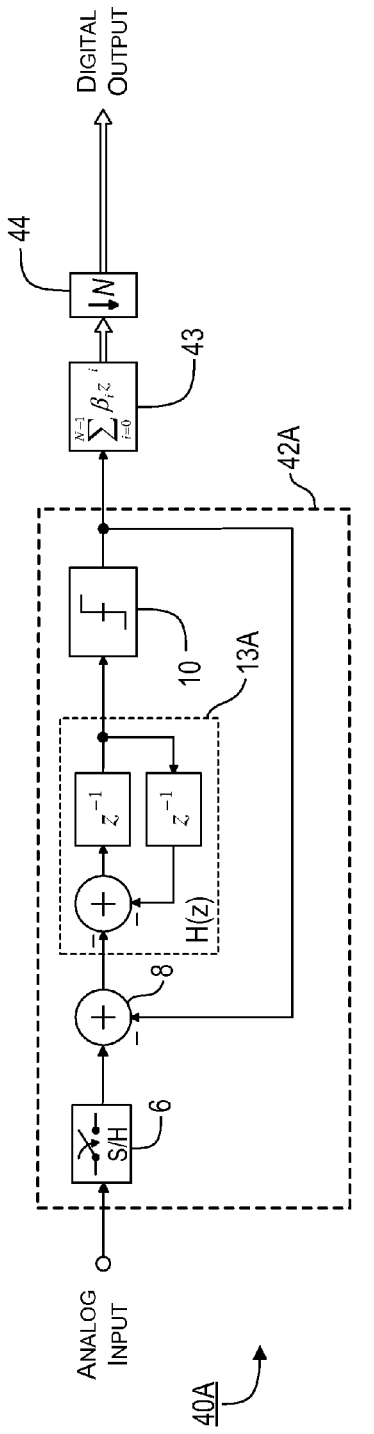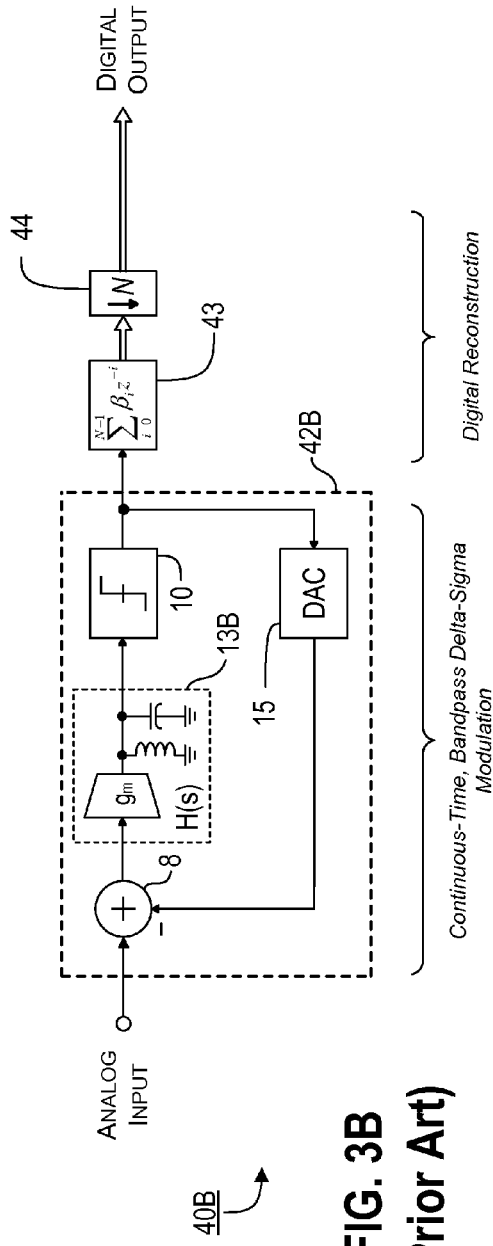
FIG. 3A (Prior Art)
FIG. 3B (Prior Art)

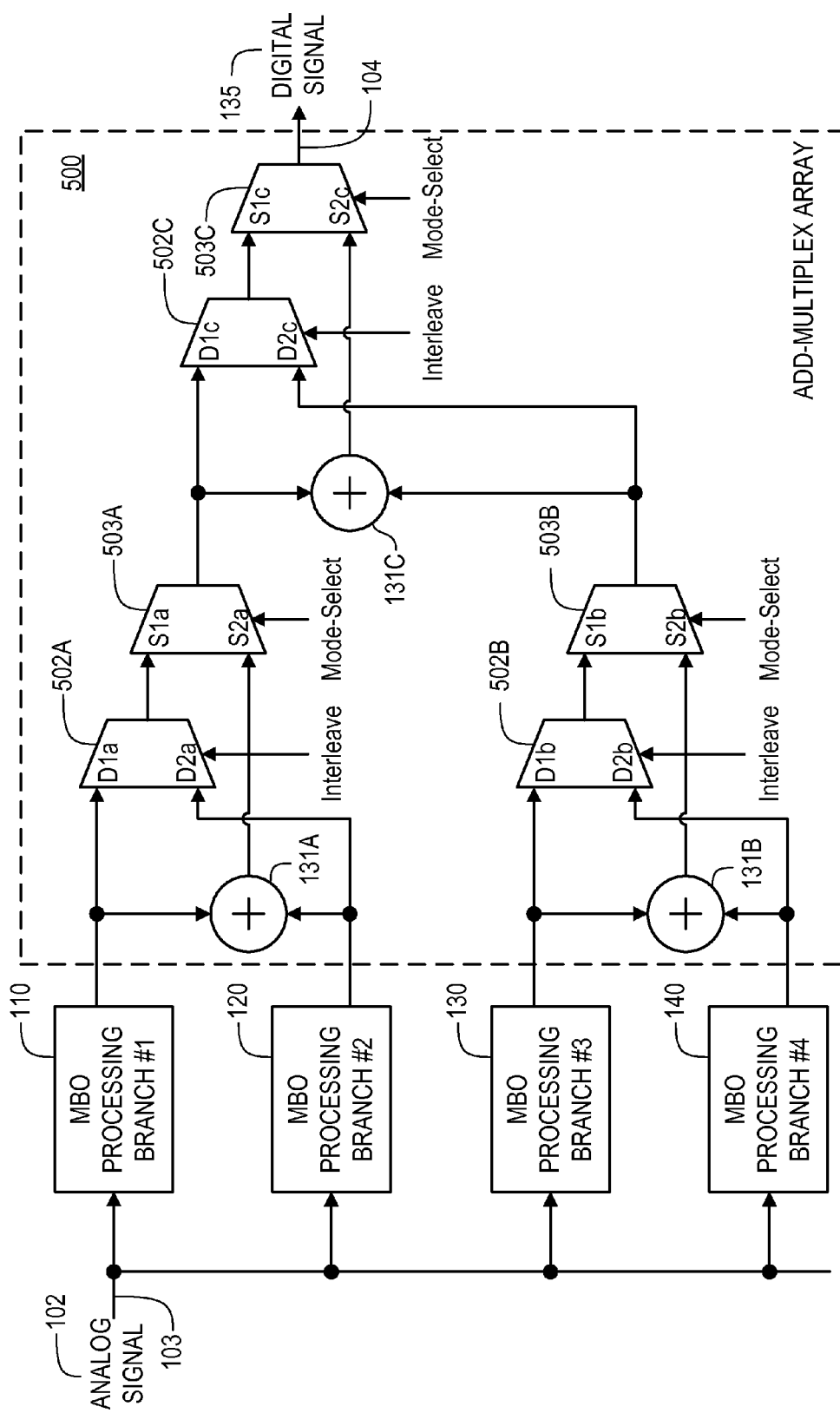

SAMPLING/QUANTIZATION CONVERTERS

This application is a continuation in part of U.S. patent application Ser. No. 12/824,171, filed on Jun. 26, 2010 and titled "Sampling/Quantization Converters" which, in turn, claimed the benefit of U.S. Provisional Patent Application Ser. No. 61/221,009, filed on Jun. 26, 2009, and titled "Method of Linear to Discrete Signal Transformation using Orthogonal Bandpass Oversampling (OBO)" and U.S. Provisional Patent Application Ser. No. 61/290,817, filed on Dec. 29, 2009, and titled "Sampling/Quantization Converters". The present application also claims the benefit of: U.S. Provisional Patent Application Ser. No. 61/414,413, filed on Nov. 16, 2010, and titled "Sampling/Quantization Converters"; U.S. Provisional Patent Application Ser. No. 61/381,055 (the '055 Application), filed on, filed on Sep. 8, 2010, and titled "Multi-Bit Sampling and Quantizing Circuit"; and U.S. Provisional Patent Application Ser. No. 61/292,428, filed on Jan. 5, 2010, and titled "Method and Apparatus for Multi-Mode Continuous-Time to Discrete-Time Transformation". The foregoing applications are incorporated by reference herein as though set forth herein in full.

FIELD OF THE INVENTION

The present invention pertains to systems, methods and techniques for converting a continuous-time continuously variable signal into a sampled, quantized discrete-time signal, and it is particularly applicable to very high sample-rate data converters with high instantaneous bandwidth.

BACKGROUND

Many applications in modern electronics require that continuous-time signals be converted to discrete signals for processing using digital computers and signal processors. Typically, this transformation is made using a conventional analog-to-digital converter (ADC). However, the present inventor has discovered that each of the presently existing ADC approaches exhibits shortcomings that limit overall performance at very high sample rates.

Due to parallel processing and other innovations, the digital information processing bandwidth of computers and signal processors has advanced beyond the capabilities of state-of-the art ADCs. Converters with higher instantaneous bandwidth are desirable in certain circumstances. However, existing solutions are limited by instantaneous bandwidth (effective sample rate), effective conversion resolution (number of effective bits), or both.

The resolution of an ADC is a measure of the precision with which a continuous-time continuously variable signal can be transformed into a quantized signal, and typically is specified in units of effective bits (B). When a continuous-time continuously variable signal is converted into a discrete-time discretely variable signal through sampling and quantization, the quality of the signal degrades because the conversion process introduces quantization, or rounding, noise. High-resolution converters introduce less quantization noise because they transform continuously variable signals into discrete signals using a rounding operation with finer granularity. Instantaneous conversion bandwidth is limited by the Nyquist criterion to a theoretical maximum of one-half the converter sample rate (the Nyquist limit). High-resolution conversion (of $\geq 10$ bits) conventionally has been limited to instantaneous bandwidths of about a few gigahertz (GHz) or less.

Converters that quantize signals at a sample rate ($f_S$) that is at or slightly above a frequency equal to twice the signal bandwidth ($f_B$) with several or many bits of resolution are conventionally known as Nyquist-rate, or baud-sampled, converters. Prior-art Nyquist-rate converter architectures include conventional flash and conventional pipelined analog-to-digital converters (ADCs). Conventional flash converters potentially can achieve very high instantaneous bandwidths. However, the resolution of flash converters can be limited by practical implementation impairments that introduce quantization errors, such as clock jitter, thermal noise, and rounding/gain inaccuracies caused by component tolerances. Although flash converters potentially could realize high resolution at instantaneous bandwidths greater than 10 GHz, this potential has been unrealized in commercial offerings. Conventional pipelined converters generally have better resolution than conventional flash converters, because they employ complex calibration schemes and feedback loops to reduce the quantization/rounding errors caused by these practical implementation impairments. However, pipelined converters typically can provide less than about 1 GHz of instantaneous bandwidth.

Another conventional approach that attempts to reduce quantization noise and errors uses an oversampling technique. Oversampling converters sample and digitize continuous-time, continuously variable signals at a rate much higher than twice the analog signal's bandwidth (i.e., $f_S \gg f_B$). Due to operation at very high sample rates, the raw high-speed converters used in oversampling approaches ordinarily are capable of only low-resolution conversion, often only a single bit. Conventional oversampling converters realize high resolution by using a noise shaping operation that ideally attenuates quantization noise and errors in the signal bandwidth, without also attenuating the signal itself. Through shaping of quantization noise and subsequent filtering (digital signal reconstruction), oversampling converters transform a high-rate, low-resolution output into a low-rate, high-resolution output.

FIGS. 1A-C illustrate block diagrams of conventional, low-pass oversampling converters. A typical conventional oversampling converter uses a delta-sigma ($\Delta\Sigma$) modulator 7A-C to shape or color quantization noise. As the name implies, a delta-sigma modulator 7A-C shapes the noise that will be introduced by quantizer 10 by performing a difference operation 8 (i.e., delta) and an integration operation 13A-C (i.e., sigma), e.g., $$I(z) = \frac{1}{1-z^{-1}} \text{ or } I(s) = \frac{1}{s \cdot RC}.$$

Generally speaking, the delta-sigma modulator processes the signal with one transfer function (STF) and the quantization noise with a different transfer function (NTF). Conventional transfer functions are of the form $STF(z)=z^{-1}$ and $NTF(z)=(1-z^{-1})^P$, where $z^{-1}$ represents a unit delay equal to $T_S=1/f_S$, and P is called the order of the modulator or noise-shaped response. The STF frequency response 30 and NTF frequency response 32 for a delta sigma modulator with P=1 are shown in FIG. 2.

There exist various types of conventional delta-sigma modulators that produce comparable signal and noise transfer functions. A delta-sigma modulator that employs an auxiliary sample-and-hold operation, either explicitly as in sample-and-hold circuit 6 in converters 5A&C shown in FIGS. 1A&C, respectively, or implicitly using switched-capacitor circuits (e.g., integrators), for example, is commonly referred to as a discrete-time, delta-sigma (DT ΔΣ) modulator. A delta-sigma modulator, such as circuit 7B shown in FIG. 1B, that does not employ an auxiliary sample-and-hold operation is commonly referred to as a continuous-time, delta-sigma (CT ΔΣ) modulator. Discrete-time modulators have been the preferred method in conventional converters because DT ΔΣ modulators are more reliable in terms of stable (i.e., insensitivity to timing variations) and predictable (i.e., linearity) performance. See Ortmans and Gerfers, "Continuous-Time Sigma-Delta A/D Conversion: Fundamentals, Performance Limits and Robust Implementations", Springer Berlin Heidelberg 2006. The converters 5A&B, shown in FIGS. 1A&B, respectively, employ delta-sigma modulators with filtering 13A&B in the feed-forward path from the output of the modulator subtractor 8 to the input of the quantizer 10, in an arrangement known as an interpolative structure. An alternative DT ΔΣ modulator is the error-feedback structure of converter 5C shown in FIG. 1C, which has no feed-forward filtering. See D. Anastassiou "Error Diffusion Coding in A/D Conversion," IEEE Transactions on Circuits and Systems, Vol. 36, 1989. The error-feedback structure is conventionally considered suitable for digital implementations (i.e., digital-to-analog conversion), but not for analog implementations due to its increased sensitivity to component mismatches compared to the interpolative structure. See Johns, D. and Martin, K., "Analog Integrated Circuit Design", John Wiley & Sons 1997.

As illustrated in FIGS. 1A-C, conventional oversampling converters employ a comb or sinc$^{P+1}$ filter 12 for output filtering and signal reconstruction. Conventional oversampling converters with a first-order noise-shaped response realize the comb filter 12 in three steps: second-order integration 12A, e.g., with a transfer function of $$T_{INT} = \frac{1}{(1-z^{-1})^2}$$

at the converter sample rate ($f_S$ or $f_{CLK}$), followed by downsampling 12B by the converter excess-rate oversampling ratio (N), followed by second-order differentiation 12C, e.g., with a transfer function of $$T_{DIFF} = (1-z^{-1})^2$$

at the converter output data rate. A generalized comb filter transfer function of $$T_{COMB} = \left(\frac{1-z^{-N}}{1-z^{-1}}\right)^{P+1},$$

where P is the order of the modulator, produces frequency response minima at multiples of the output data rate, and conventionally has been considered optimal for oversampling converters. Thus, in the specific example given above, it is assumed that a modulator with first-order response (i.e., P=1) is used.

The delta-sigma converters 5A-C illustrated in FIGS. 1A-C are conventionally known as low-pass, delta-sigma converters. A variation on the conventional low-pass converter, employs bandpass delta-sigma modulators to allow conversion of narrowband signals that are centered at frequencies above zero. Exemplary bandpass oversampling converters 40A&B, illustrated in FIG. 3A&B, respectively, include a bandpass delta-sigma modulator 42A or 42B, respectively, that provides, as shown in FIG. 4, a signal response 70 and a quantization noise response 71 with a minimum 72 at the center of the converter Nyquist bandwidth (i.e., ¼·$f_S$). After single-bit high-speed quantization/sampling 10 (or, with respect to converter 40A shown in FIG. 3A, just quantization, sampling having been performed in sample-and-hold circuit 6), filtering 43 of shaped quantization noise, similar to that performed in the standard conventional low-pass oversampling converter (e.g., any of converters 5A-C), is performed, followed by downsampling 44.

Bandpass delta-sigma modulators are similar to the more-common low-pass variety in several respects: The conventional bandpass delta-sigma modulator has both discrete-time (converter 40A shown in FIG. 3A) and continuous-time (converter 40B shown in FIG. 3B) forms Like the low-pass version, the bandpass delta-sigma modulator 42A&B shapes noise from quantizer 10 by performing a difference operation 8 (i.e., delta) and an integration operation 13A&B (i.e., sigma), respectively, where $$H(z) = -\frac{z^{-1}}{1+z^{-2}} \text{ and } H(s) = \frac{\sqrt{LC} \cdot s}{LC \cdot s^2 + 1} = \frac{\omega_0 \cdot s}{s^2 + \omega_0^2}\bigg|_{\omega_0 = \pi \cdot f_S/2}.$$

Also, the bandpass modulator processes the signal with one transfer function (STF) and the quantization noise with a different transfer function (NTF). The conventional bandpass DT ΔΣ modulator, shown in FIG. 3A, is considered second-order (i.e., P=2) and has a STF(z)=z$^{-1}$ and a NTF(z)=1+z$^{-2}$, where z$^{-1}$ represents a unit delay equal to T$_S$. Linearized, continuous-time transfer functions for the second-order CT ΔΣ modulator, shown in FIG. 3B, are of the form $$STF(s) = \frac{\omega \cdot s}{s^2 + \omega \cdot s + \omega^2} \text{ and } NTF(s) = \frac{s^2 + \omega^2}{s^2 + \omega \cdot s + \omega^2}.$$

It should be noted that discrete-time modulators have a signal transfer function (STF) that generally is all-pass, whereas continuous-time modulators have a linearized signal transfer function (STF) that generally is not all-pass (e.g., bandpass for the above example). Also, the noise transfer function (NTF) of a real bandpass delta-sigma modulator is at minimum a second-order response.

Conventional oversampling converters can offer very high resolution, but the noise shaping and signal reconstruction process generally limits the utility of oversampling converters to applications requiring only low instantaneous bandwidth. To improve the instantaneous bandwidth of oversampling converters, multiple oversampling converters can be operated in parallel using the time-interleaving (time-slicing) and/or frequency-interleaving (frequency-slicing) techniques developed originally for Nyquist converters (i.e., flash, pipelined, etc.). In time-interleaving, a high-speed sample clock is decomposed into lower-speed sample clocks at different phases. Each converter in the time-interleaved array is clocked with a different clock phase, such that the conversion operation is distributed in time across multiple converters. While converter #1 is processing the first sample, converter #2 is processing the next sample, and so on.

In frequency interleaving, the total bandwidth of the continuous-time signal is decomposed (i.e., divided) into multiple, smaller subbands. According to one representative implementation of a frequency interleaving ADC 70A, shown in FIG. 5A, the individual bands are separated out and downconverted to baseband. More specifically, the input signal 71 is provided to a set of multipliers 72 together with the band's central frequencies 74A-76A. The resulting baseband signals are then provided to low-pass, anti-aliasing filters 78. Each such filtered baseband signal is then digitized 80A, digitally upconverted 82A using digitized sinusoids 83A-C (or alternatively simply upsampled) and then bandpass filtered 84A-86A in order to restore it to its previous frequency band. Finally, the individual bands are recombined in one or more adders 88. Each converter 80A in the interleaved array is able to operate at a submultiple of the overall sample rate, according to the Nyquist criterion, due to the reduced signal bandwidth in each of the subdivided, downcoverted bands.

The conventional parallel delta-sigma analog-to-digital converter (ΠΔΣ ADC) 70B, shown in FIG. 5B, is similar in design and operation to the conventional frequency-interleaved converter 70A shown in FIG. 5A, except that oversampling converters 80B are used in place of multi-bit digitizers 80A and anti-aliasing filters 78. See I. Galton and H. Jensen, "Delta Sigma Modulator Based A/D Conversion without Oversampling", IEEE Transactions on Circuits and Systems, Vol. 42, 1995 and I. Galton and T Jensen, "Oversampling Parallel Delta-Sigma Modulator A/D Conversion", IEEE Transactions on Circuits and Systems, Vol. 43, 1996). As shown in FIG. 5B, the primary advantage of the prior-art ΠΔΣ converter 70B is that the oversampling operation of the delta-sigma modulators 89 eliminates the need for the anti-aliasing function provided by the analog filter bank. The conventional ME ADC generally employs discrete-time, low-pass delta-sigma modulators 89 and uses continuous-time Hadamard sequences ($v_i(t)$) 74B-76B and discrete-time Hadamard sequences ($u_i[n]$) 89A-C, instead of sinusoidal waveforms, to reduce the circuit complexity associated with the downconversion 72B and upconversion 82B operations. In some instances, bandpass delta-sigma modulators are used to eliminate the need for analog downconversion completely, in a process sometimes called Direct Multiband Delta-Sigma Conversion (MBΔΣ). See Aziz, P., "Multi-band Oversampled Noise Shaping Analog to Digital Conversion" (PhD Thesis), University of Pennsylvania, 1996 and A. Beydoun and P. Benabes, "Bandpass/Wideband ADC Architecture Using Parallel Delta Sigma Modulators", 14$^{th}$ European Signal Processing Conference, 2006. In addition to multiband delta-sigma modulation, conventional frequency-interleaved, oversampling converters (i.e., ΠΔΣ ADC and MBΔΣ) employ conventional, decimating comb ($sinc^{P+1}$) low-pass filters (ΠΔΣ ADC) or a conventional, transversal finite impulse response (FIR) filter bank (MBΔΣ) for signal reconstruction.

The present inventor has discovered that conventional ΠΔΣ converters, as shown in FIG. 5B, and conventional MBΔΣ converters have several disadvantages that limit their utility in applications requiring very high instantaneous bandwidth and high resolution. These disadvantages, which are discussed in greater detail in the Description of the Preferred Embodiment(s) section, include: (1) use of delta-sigma modulation (Galton, Aziz, and Beydoun) impairs high-frequency operation because the sample-and-hold function limits the performance of DT ΔΣ modulators and non-ideal circuit behavior can degrade the noise-shaped response and stability of CT ΔΣ modulators; (2) use of decimating comb filters for signal reconstruction in ΠΔΣ converters (Galton) introduces amplitude and phase distortion that is not completely mitigated by the relatively complex output equalizer (i.e., equalizer 90 having transfer function F'(z) in FIG. 5B); (3) use of Hadamard sequences for downconversion and upconversion in ΠΔΣ converters introduces conversion errors related to signal-level mismatches and harmonic intermodulation products (i.e., intermodulation distortion); (4) use of conventional FIR filter-bank technology (as in Aziz) or Hann window function filters (as in Beydoun) for signal reconstruction in MBΔΣ converters limits the practical number of parallel processing branches due to signal-processing complexities (i.e., number of multiply/accumulate operations), particularly for high-frequency, multirate (i.e., polyphase) filter topologies; and (5) absence of feedback from the signal-reconstruction filter outputs to the ΔΣ modulator, means that ΔΣ modulator component tolerances can degrade converter performance by creating mismatches between the notch frequency ($f_{notch}$) in the NTF and the center frequency of the narrowband reconstruction filter response. Possibly due to these disadvantages, the instantaneous bandwidth and resolution performance of conventional ΠΔΣ and MBΔΣ converters have not been able to surpass that of conventional pipelined converters.

In addition to ΠΔΣ and MBΔΣ, parallel arrangements of delta-sigma modulators are the subject of several United States patents, such as U.S. Pat. Nos. 7,289,054, 6,873,280, and 6,683,550. However, these patents generally fail to adequately address the primary issues associated with the high-resolution, high-sample-rate conversion of continuous-time signals to discrete-time signals. One technique, described in U.S. Pat. No. 7,289,054, uses digitization of noise shaping circuit residues for increasing converter precision, rather than using reconstruction filter banks for quantization noise reduction. Another technique, described in U.S. Pat. No. 6,873,280, addresses conversion of digital (discrete-time, discretely variable) signals to other forms, rather than the conversion of analog (continuous-time, continuously variable) signals to digital signals. A third technique, described in U.S. Pat. No. 6,683,550, employs multi-bit, first-order modulators which are not suitable for high-precision, bandpass oversampling applications since these application require modulators that are at least second order.

SUMMARY OF THE INVENTION

The present invention provides an improved ADC, particularly for use at very high sample rates and instantaneous bandwidths approaching the Nyquist limit.

Thus, one specific embodiment of the invention is directed to an apparatus for converting a continuous-time, continuously variable signal into a sampled and quantized signal. The apparatus includes: an input line for accepting an input signal that is continuous in time and continuously variable; a plurality of processing branches coupled to the input line; and an adder coupled to outputs of the plurality of processing branches, with each of the processing branches including: (a) a continuous-time filter, preferably using a Diplexer Feedback Loop (DFL), for shaping quantization and other noise, (b) a sampling/quantization circuit coupled to the output of the quantization-noise-shaping continuous-time filter, (c) a digital bandpass filter, preferably a Bandpass Moving Average filter, coupled to an output of the sampling/quantization circuit, and (d) one or more lines coupling the input and output of the sampling/quantization circuit back into the quantization-noise-shaping continuous-time filter. Each of the quantization-noise-shaping continuous-time filters has an adder that includes multiple inputs and an output, with: (1) the input signal being coupled to one of the inputs of the adder, (2) the output of the adder being coupled to a sampling/quantization circuit input and to one of the inputs of the adder through a first filter, and (3) the output of the sampling/quantization circuit in the same processing branch being coupled to one of the inputs of the adder through a second filter that has a different transfer function than the first filter. The quantization-noise-shaping continuous-time filters in different ones of the processing branches produce quantization noise minima at different frequencies, and the quantization noise minimum for each of the quantization-noise-shaping continuous-time filters corresponds to a frequency band selected by the digital bandpass filter in the same processing branch.

Such an apparatus typically can provide a better combination of high resolution and wide bandwidth than is possible with conventional converters and can be used for various commercial, industrial and military applications, e.g., in various direct conversion sensors, software-defined or cognitive radios, multi-channel communication receivers, all-digital RADAR systems, high-speed industrial data acquisition systems.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 3A is a block diagram of a single-band bandpass oversampling converter having a discrete-time, interpolative delta-sigma modulator with second-order response; and FIG. 3B is a block diagram of a single-band bandpass oversampling converter having a continuous-time, interpolative delta-sigma modulator with second-order response.

FIG. 20 is a block diagram of a Multi-Mode MBO converter that employs an output Add-Multiplex Array (AMA) network to enable: (a) isolation of individual MBO processing branches for operation as multiple narrowband output channels, or (b) combination of individual MBO processing branches for operation as fewer wideband output channels.

DESCRIPTION OF THE PREFERRED EMBODIMENT(S)

The present disclosure is related to the disclosure set forth in the application by the present inventor, titled "Multimode Sampling/Quantization Converters", which is being filed on the same day as the present application. The foregoing application is incorporated by reference herein as though set forth herein in full.

A preferred converter according to the present invention uses a technique that sometimes is referred to herein as Multi-Channel Bandpass Oversampling (MBO). Such a technique shares some structural similarities with conventional parallel delta-sigma (ΠΔΣ) and multiband delta-sigma (MBΔΣ) analog-to-digital converters, in that the MBO converter also consists of multiple, parallel, oversampling converters. However, a MBO converter according to the preferred embodiments of the present invention incorporates one or more of the following technological innovations to improve instantaneous bandwidth and resolution: (1) continuous-time, Diplexer Feedback Loops (DFLs) are used in place of delta-sigma (ΔΣ) modulators, e.g., to improve quantization noise shaping at very high converter sample rates; (2) bandpass (preferably second-order or higher) oversampling eliminates the need for analog downconversion using sinusoidal waveforms or Hadamard sequences (e.g., as in ΠΔΣ converters); (3) Bandpass Moving Average (BMA) filter banks are used in place of decimating comb filters (i.e., ΠΔΣ), conventional FIR filter banks (i.e., MBΔΣ), or Hann window function FIR filters to minimize phase and amplitude distortion and significantly reduce signal-processing complexity; and/or (4) active noise shaping circuit calibration is employed to reduce conversion performance losses caused by mismatches between the notch frequencies ($f_{notch}$) of the noise shaping circuit (preferably, a DFL) and the center frequencies of the signal reconstruction (preferably BMA) filters. Such techniques can in some respects be thought of as a unique and novel method of combining two distinct conventional techniques—continuous-time, bandpass oversampling and multi-channel, frequency-interleaving. As discussed in more detail below, the use of such techniques often can overcome the problems of limited conversion resolution and precision at very high instantaneous bandwidths.

Figure 1A:
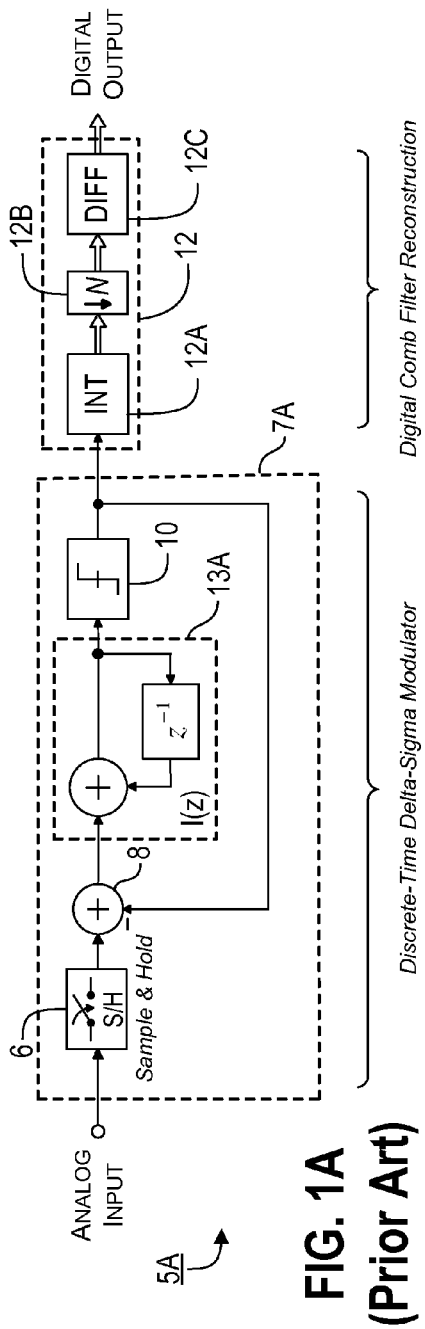
FIG. 1A is a block diagram of a conventional low-pass oversampling converter having a discrete-time, interpolative delta-sigma modulator with first-order response.
Figure 2:
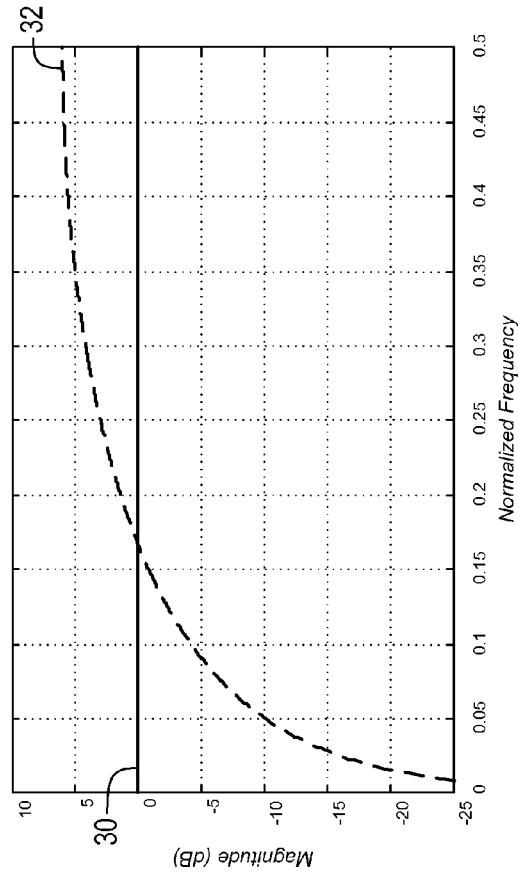
FIG. 2 illustrates the input signal transfer function (STF) and quantization noise transfer function (NTF) for a conventional, first-order, low-pass delta-sigma modulator.
Figure 1B:
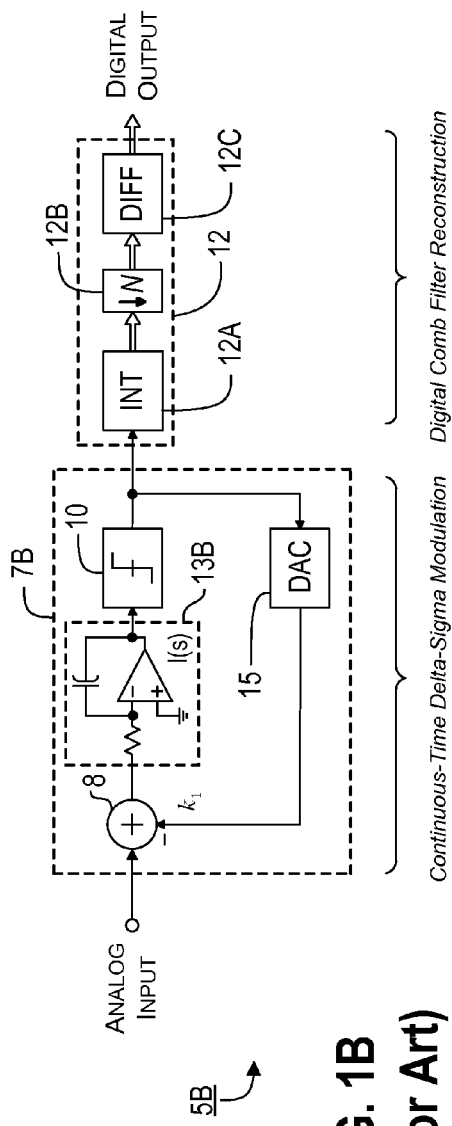
FIG. 1B is a block diagram of a conventional low-pass oversampling converter having a continuous-time, interpolative delta-sigma modulator with first-order response.
Figure 1C:
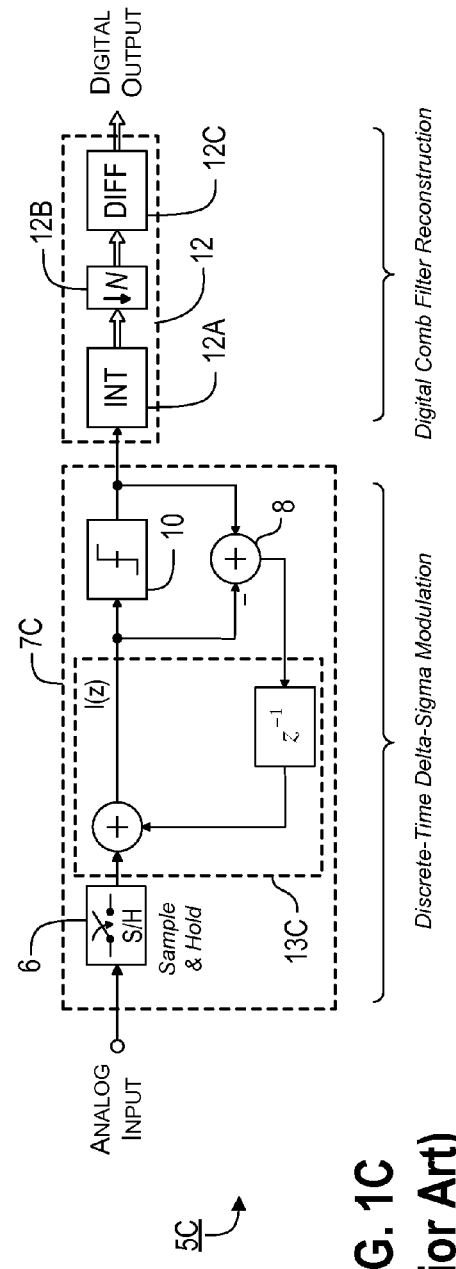
FIG. 1C is a block diagram of a conventional oversampling low-pass converter having a discrete-time, error-feedback delta-sigma modulator with first-order response.
Figure 4:
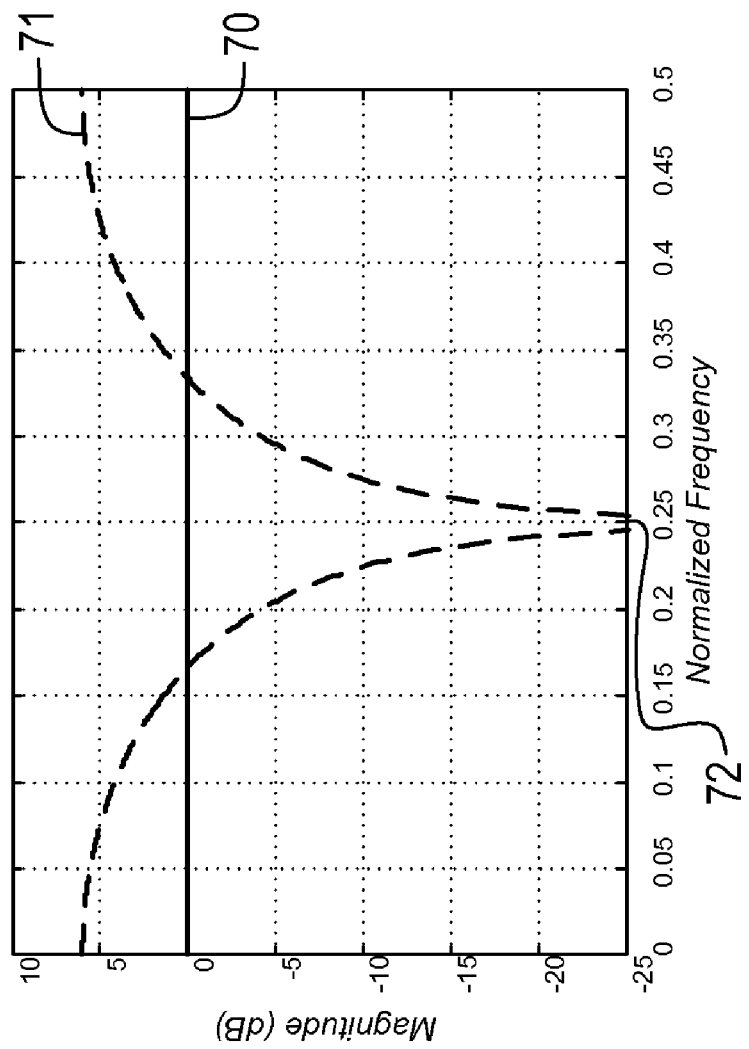
FIG. 4 illustrates the input signal transfer function (STF) and quantization noise transfer function (NTF) for the delta-sigma modulator of the single-band bandpass converters shown in FIGS. 3A&B.
Figure 5A:
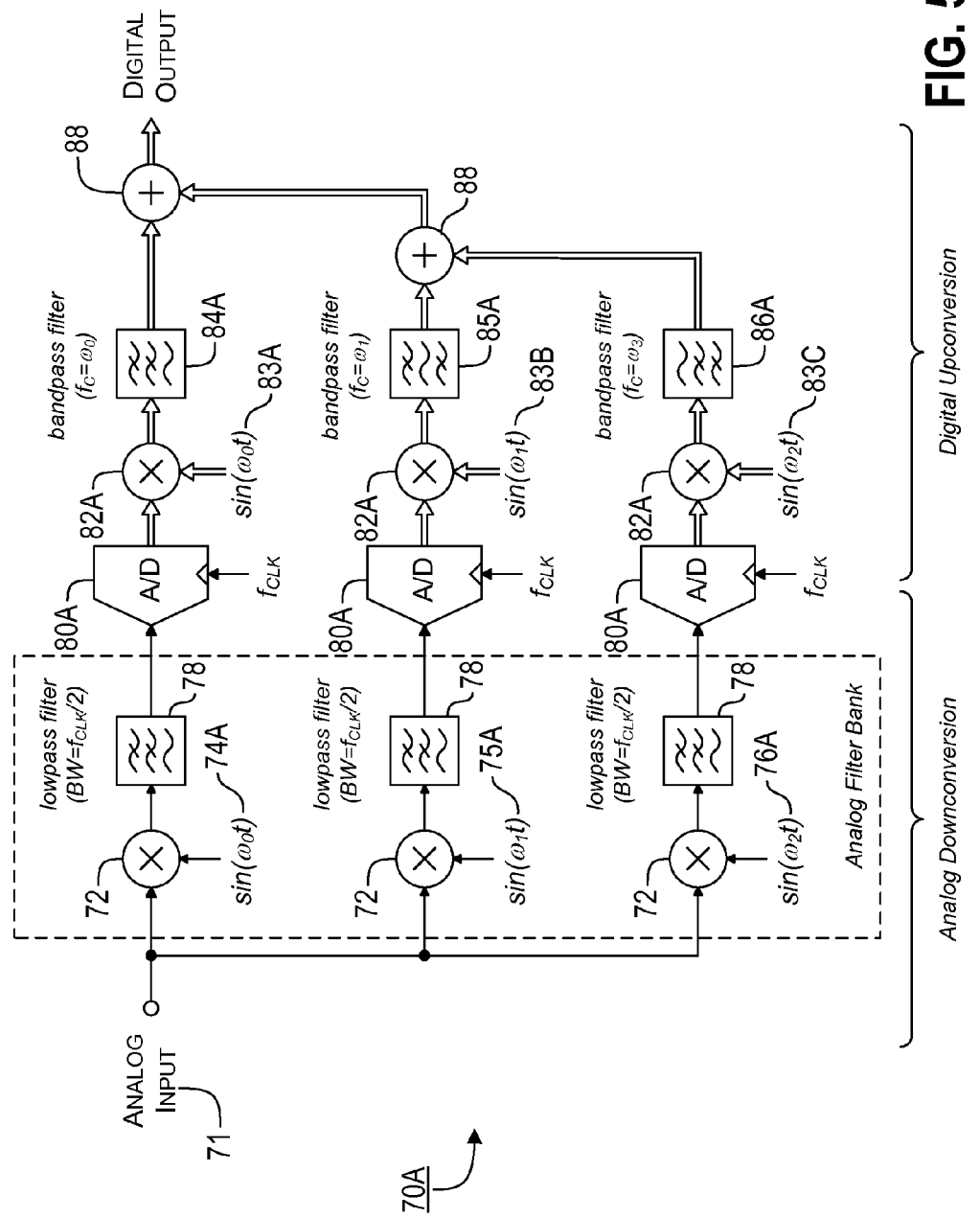
FIG. 5A is a block diagram of a conventional frequency-interleaving converter.
Figure 5B:
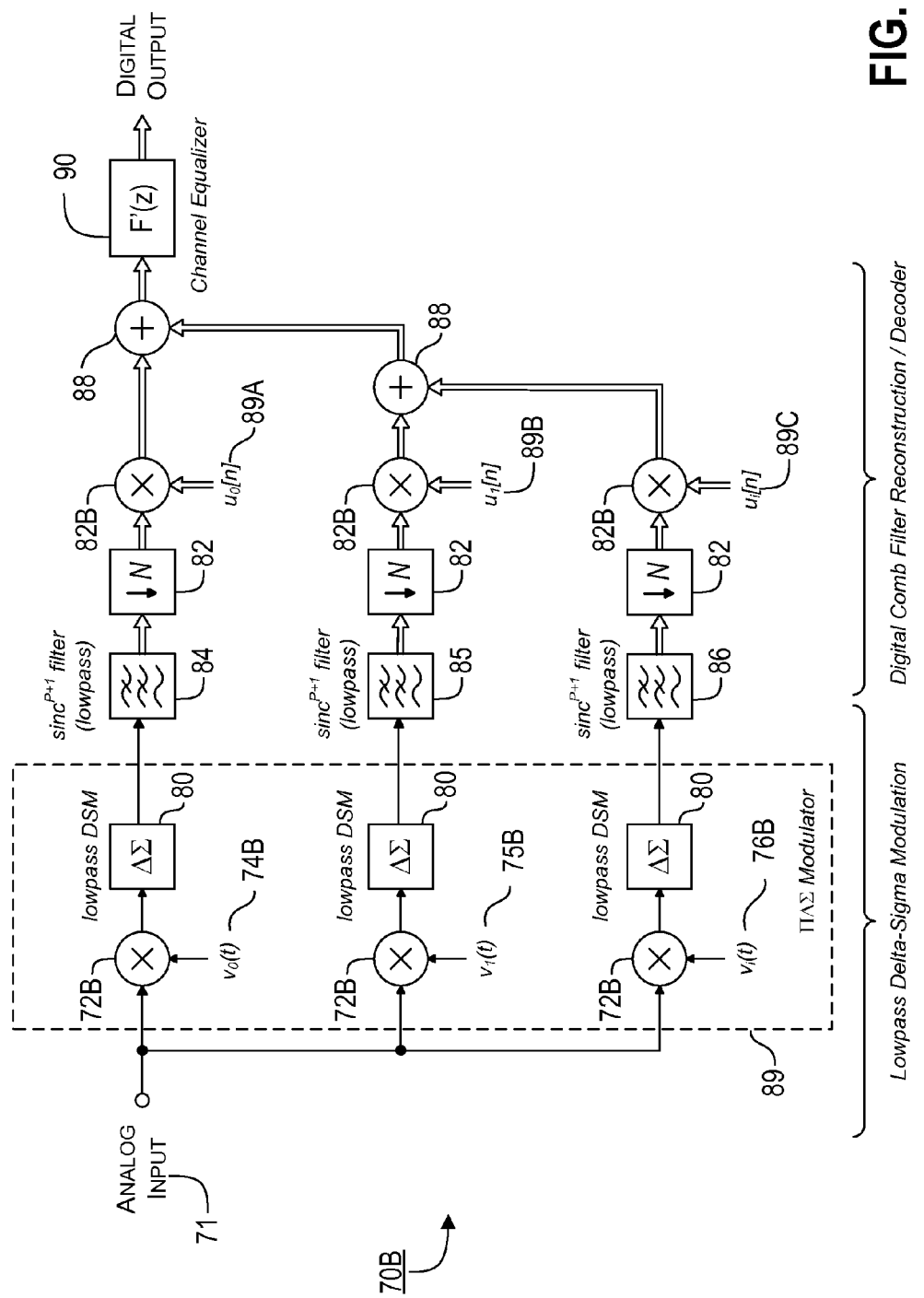
FIG. 5B is a block diagram of a conventional parallel delta-sigma modulator converter (ΠΔΣ ADC).
Figure 6A:
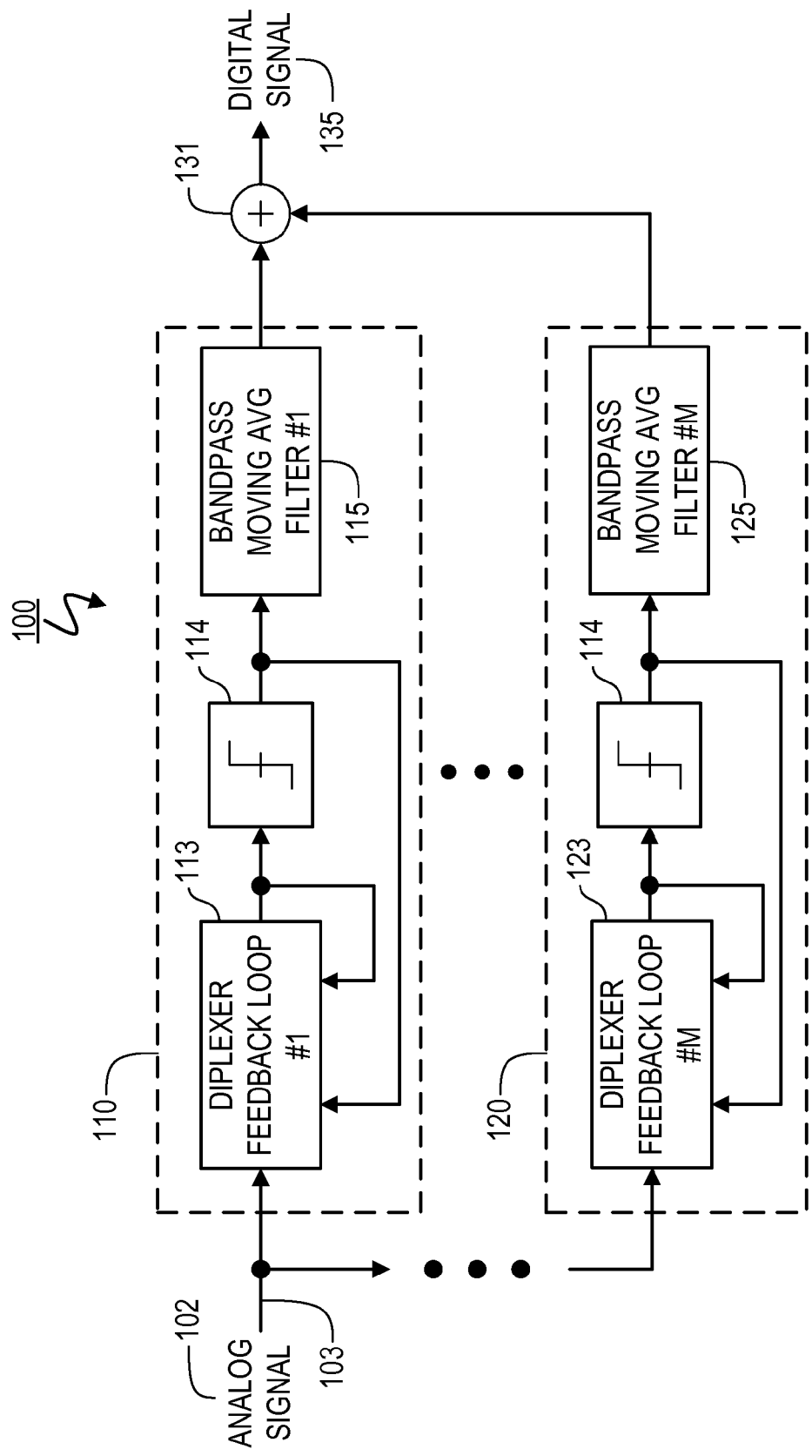
FIG. 6A is a simplified block diagram of a Multi-Channel Bandpass Oversampling (MBO) converter according to a representative embodiment of the present invention.

A simplified block diagram of one converter 100 according to the preferred embodiments of the present invention is illustrated in FIG. 6. In the preferred embodiments, converter 100 separately processes M different frequency bands for a continuous-time continuously variable signal 102, using a separate branch (e.g., branch 110 or 120) to process each such band, and then sums up all the branch outputs in an adder 131 in order to provide the output digital signal 135. In one embodiment of the invention, the M different frequency bands are orthogonal, or at least approximately orthogonal, with respect to the converter output data rate. More specifically, the signal 102 is input on a line 103 that could be implemented, e.g., as a physical port for accepting an external signal or as an internal wire, conductive trace or a similar conductive path for receiving a signal from another circuit within the same device. In the present embodiment, the input signal 102 is provided directly to each of the branches (e.g., branches 110 and 120). However, in alternate embodiments the input line 103 can be coupled to such branches in any other manner. As used herein, the term "coupled", or any other form of the word, is intended to mean either directly connected or connected through one or more other processing blocks, e.g., for the purpose of preprocessing. It should also be noted that any number of branches may be used and, as discussed in more detail below, increasing the number of branches generally increases the resolution of the converter 100.

In any event, in the present embodiment each such branch (e.g., branch 110 or 120) primarily processes a different frequency band and includes: a Diplexer Feedback Loop (DFL) or other quantization-noise-shaping circuit (e.g., circuit 113 or 123), a sampling/quantization circuit 114, and a Bandpass Moving Average (BMA) reconstruction filter or other bandpass reconstruction filter (e.g., filter 115 or 125). Each quantization-noise-shaping circuit (e.g., DFL 113 or 123) realizes a quantization noise response (NTF) with a minimum (i.e., notch or null) at or near the frequency band(s) (more preferably, the center of the frequency band(s)) that is/are intended to be processed by its respective branch. Each sampling/quantization circuit 114 preferably is identical to the others and is implemented as a single-bit quantizer, sometimes referred to herein as a hard limiter.

As discussed in greater detail below, the signal input into sampling/quantization circuit 114 and the signal output by sampling/quantization circuit 114 preferably are fed back, diplexed (i.e., independently filtered, combined, and then optionally jointly filtered), and combined with the input signal 102 so that quantization errors in earlier samples can be taken into account in generating later quantized samples. Each digital bandpass filter, preferably a Bandpass Moving Average filter (e.g., filter 115 or 125), selects out the frequency band being processed within its respective branch. The adder 131 can be implemented, e.g., as a single adder with multiple inputs or as a series of two-input adders.

Use of a hard limiter for the sampling/quantization circuits 114 generally is preferred because, due to its simplicity, a hard limiter usually allows for the maximum possible sampling rate and is not as subject to differential nonlinearities or rounding errors (as opposed to quantization noise) associated with multi-bit quantizers. However, use of multi-bit quantizers potentially can improve converter resolution at the expense of instantaneous bandwidth. In the preferred embodiments, the sampling rate of the individual sampling/quantization circuits 114 is the output data rate for the converter 100 as a whole, meaning that no downsampling is performed (i.e., N=1), although in alternate embodiments it might be desirable to perform some (e.g., limited, such as by a factor of no more than 2 or 4) downsampling. At the same time, a desired overall effective resolution of the converter 100 generally can be achieved, independent of the sampling rate ($f_S$), by appropriately selecting design parameters such as the number of processing branches (corresponding to the number of individual frequency bands processed) and the quality of the filters used (e.g., the order of the noise-shaped response and the stopband attenuation of the bandpass filter).

Noise Shaping Considerations

In the embodiment described above, each of the quantization-noise-shaping circuits (e.g., 113 and 123) is a DFL because such a circuit has been found to achieve the best combination of effectiveness, ease of construction and ease of configuration. However, it should be noted that it is possible to use other kinds of noise shaping circuits in alternate embodiments of the invention. In any event, the primary considerations for the noise shaping circuits to be used preferably derive from the desire for stable and accurate operation at very high sample rates. Therefore, each noise shaping circuit according to the preferred embodiments has at least the following three properties: (1) the primary performance impairments of the noise shaping circuit, such as those related to settling-time errors, sampling uncertainty/jitter, thermal noise, and quantization/rounding errors, are subject to noise shaping; (2) the performance of the noise shaping circuit is relatively insensitive to non-ideal circuit behavior and excess feedback loop delay; and (3) the noise shaping circuit can be implemented using high-frequency design techniques, such as those utilizing distributed-element circuits and monolithic microwave integrated circuits (MMICs). Achieving these properties generally precludes the use of conventional delta-sigma modulators for the noise shaping operation.

For instance, the conventional DT ΔΣ modulator is not suitable for use in the MBO converter because the auxiliary (explicit or implicit) sample-and-hold operation of the DT ΔΣ modulator introduces impairments, such as settling-time errors and sampling uncertainty/jitter, that are not subject to noise shaping and, therefore, limit the performance of the DT ΔΣ modulator at high frequencies. In addition, the operating frequency of the DT ΔΣ modulator is limited by the sampling speed of the auxiliary, high-precision sample-and-hold operation.

The conventional CT ΔΣ modulator is not suitable for use in the MBO converter because, although the impairments of the single, coarse sampling operation can be subject to noise shaping, the feed-forward filtering of the conventional CT ΔΣ modulator generally requires high-linearity, transconductance stages (i.e., current sources), high-gain operational amplifiers (i.e., voltage sources), high-quality (Q), lumped-element parallel resonators (i.e., discrete inductors and capacitors), and/or clocked feedback digital-to-analog converters (DACs). Although a CT ΔΣ modulator can operate at higher frequencies than the DT ΔΣ modulator, due to the absence of an auxiliary sample-and-hold function, the performance of CT ΔΣ modulator implementations is limited by the non-ideal behavior of the active and reactive lumped circuit elements that comprise the continuous-time filter in the modulator feed-forward path, particularly when operating at very high sample rates. At very high frequencies, such as microwave frequencies, lumped-element devices instead behave like distributed-element devices: the output impedance degradation of transconductance stages and limited gain of operational amplifiers causes them to behave less like current or voltage sources and more like basic amplifiers (i.e., power output versus current or voltage output); and the parasitic impedances of reactive components, like inductors and capacitors, cause them to behave like low-Q series or parallel resonators. Still further, the non-ideal behavior of lumped circuit elements degrades the linearity and bandwidth of the feed-forward filter and thereby limits the operating frequency of the CT ΔΣ modulator.

Other problems with the CT ΔΣ modulator are that: (i) the settling errors and sampling jitter of the clocked feedback digital-to-analog converter (DAC) are not subjected to noise shaping and (ii) the excess loop delay introduced by the finite settling time of the feedback DAC degrades noise shaping performance and stability by increasing the order of an interpolative modulator. The conventional solution to the latter problem of excess loop delay is to bring multiple feedback paths into the continuous-time, feed-forward filter using clocked DACs that produce different output waveforms, such non-return-to-zero (NRZ), return-to-zero (RZ) and half-delayed return-to-zero (HRZ) pulses. See O. Shoaei, W. M. Snelgrove, "A Multi-Feedback Design for LC Bandpass Delta-Sigma Modulators", Proceedings—International Symposium on Circuits and Systems, Vol. 1, 1995. However, at very high sampling frequencies, this solution only aggravates existing performance limitations related to the non-ideal behavior of the active and reactive lumped circuit elements comprising the feed-forward filter and complicates problems associated with DAC settling errors and sampling jitter.

Instead, the present inventor has discovered a new technique for shaping quantization and other noise, referred to herein as a Diplexer Feedback Loop (DFL), that, compared to conventional delta-sigma modulators, incorporates several significant technological innovations to improve operating frequency and performance stability. First, the DFL operates as a continuous-time circuit (i.e., processing continues-time continuously variable signals), as opposed to a discrete-time circuit. Thus, there is no high-precision, auxiliary sample-and-hold function (explicit or implicit), or clocked feedback DAC function, that limits speed and accuracy. Second, the DFL can be configured for bandpass (e.g., second order or higher) noise shaping or for low-pass noise shaping. Thus, the DFL noise shaper has utility in converter applications where the input signal is not centered at zero frequency. Third, the DFL employs passive feedback filter (diplexer) structures that produce quantization noise notches at pre-selected frequencies, but are relatively insensitive to excess feedback loop delay. These passive filters are capable of high-frequency operation because they can be implemented using distributed-element and microwave design techniques. Fourth, the DFL can employ tunable feedback elements for dynamic calibration of the quantization noise response (NTF). Thus, the performance of the noise shaper can be made significantly less sensitive to component or manufacturing tolerances. Fifth, the architecture of the DFL is such that the digital-to-analog conversion operation in the feedback path (feedback DAC) is subject to noise shaping. Therefore, impairments introduced by DAC settling errors and noise can be significantly attenuated during the signal reconstruction process. For these reasons, among others, the preferred embodiment of the MBO converter uses the DFL approach for shaping quantization and other noise.

Figure 6B:
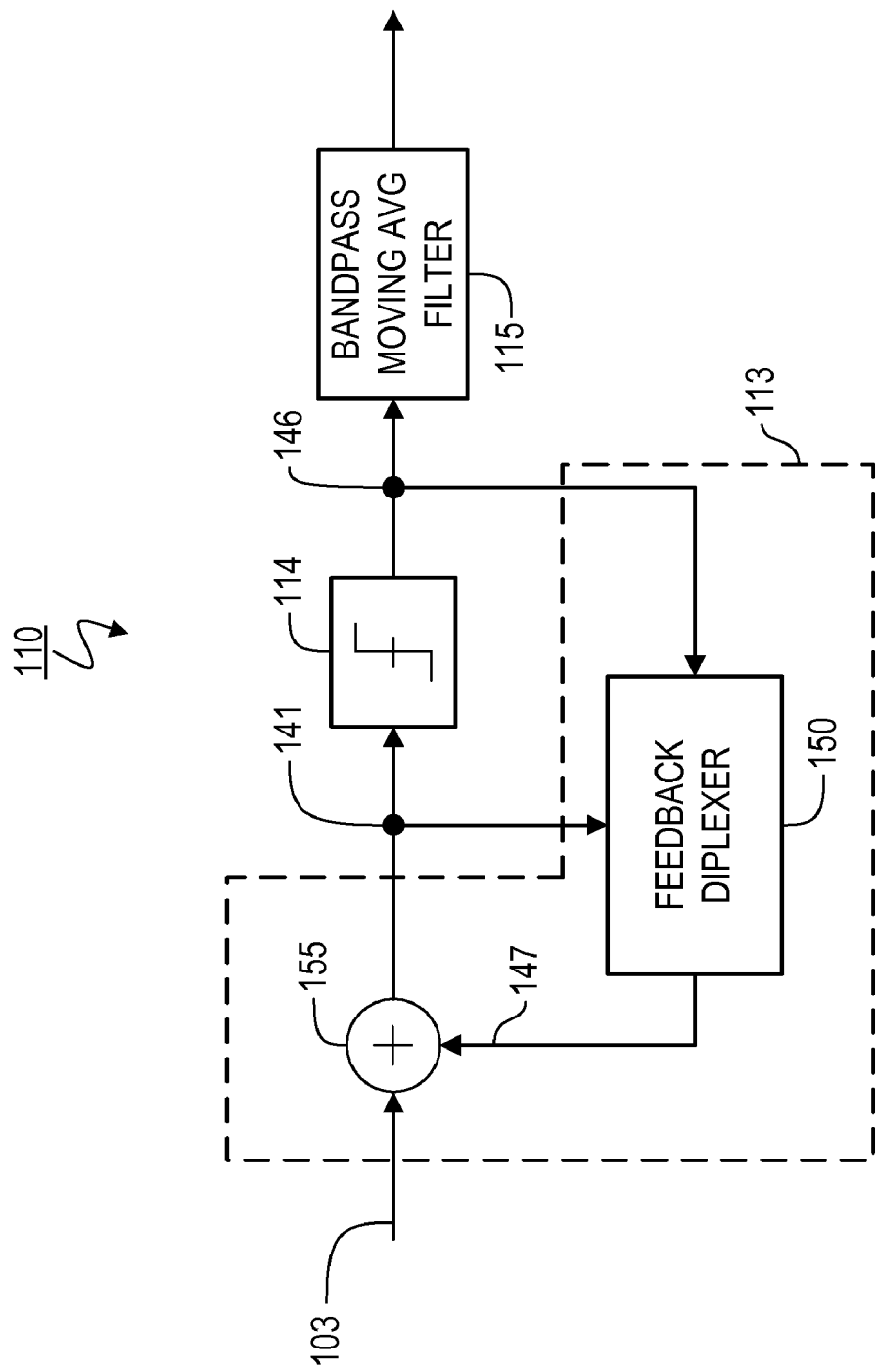
FIG. 6B is a more detailed block diagram of an exemplary MBO processing branch according to a representative embodiment of the present invention.

A simplified block diagram of a MBO processing branch having a Diplexer Feedback Loop 113 that utilizes a feedback diplexer 150 is shown in FIG. 6B. As illustrated, the feedback diplexer 150 inputs the signal 141 that is input into sampling/quantizing circuit 114, inputs the signal 146 that is output from sampling/quantizing circuit 114, and outputs a correction signal 147 that is additively combined (in adder 155) with the signal on input line 103. Preferably, signal 147 is produced by separately filtering signals 141 and 146 and then additively combining the filtered signals.

Figure 7:
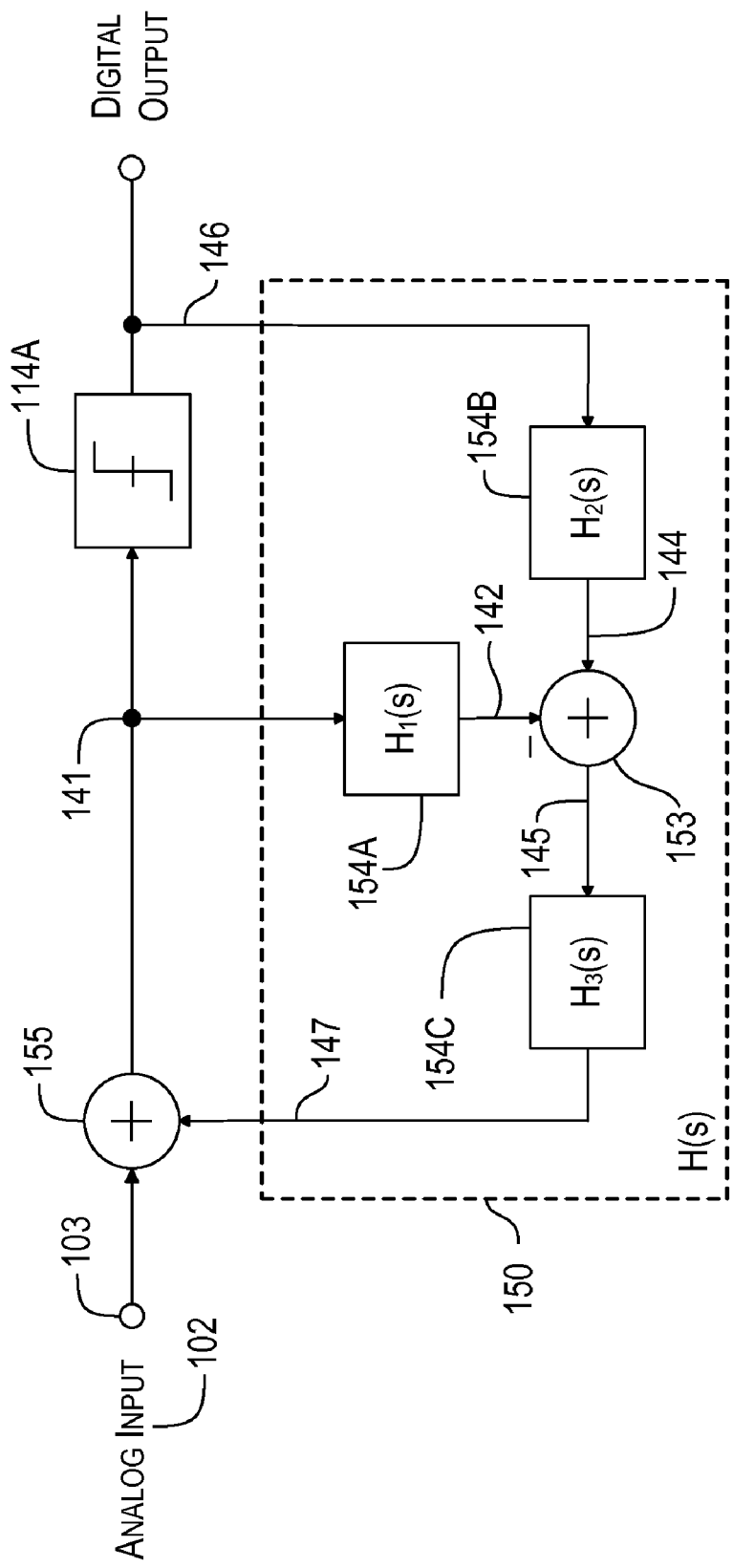
FIG. 7 is a block diagram illustrating a Diplexer Feedback Loop (DFL) according to a representative embodiment of the present invention that employs single-bit quantization and a feedback diplexer to produce quantization noise response minima at arbitrary frequencies.
Figure 8:
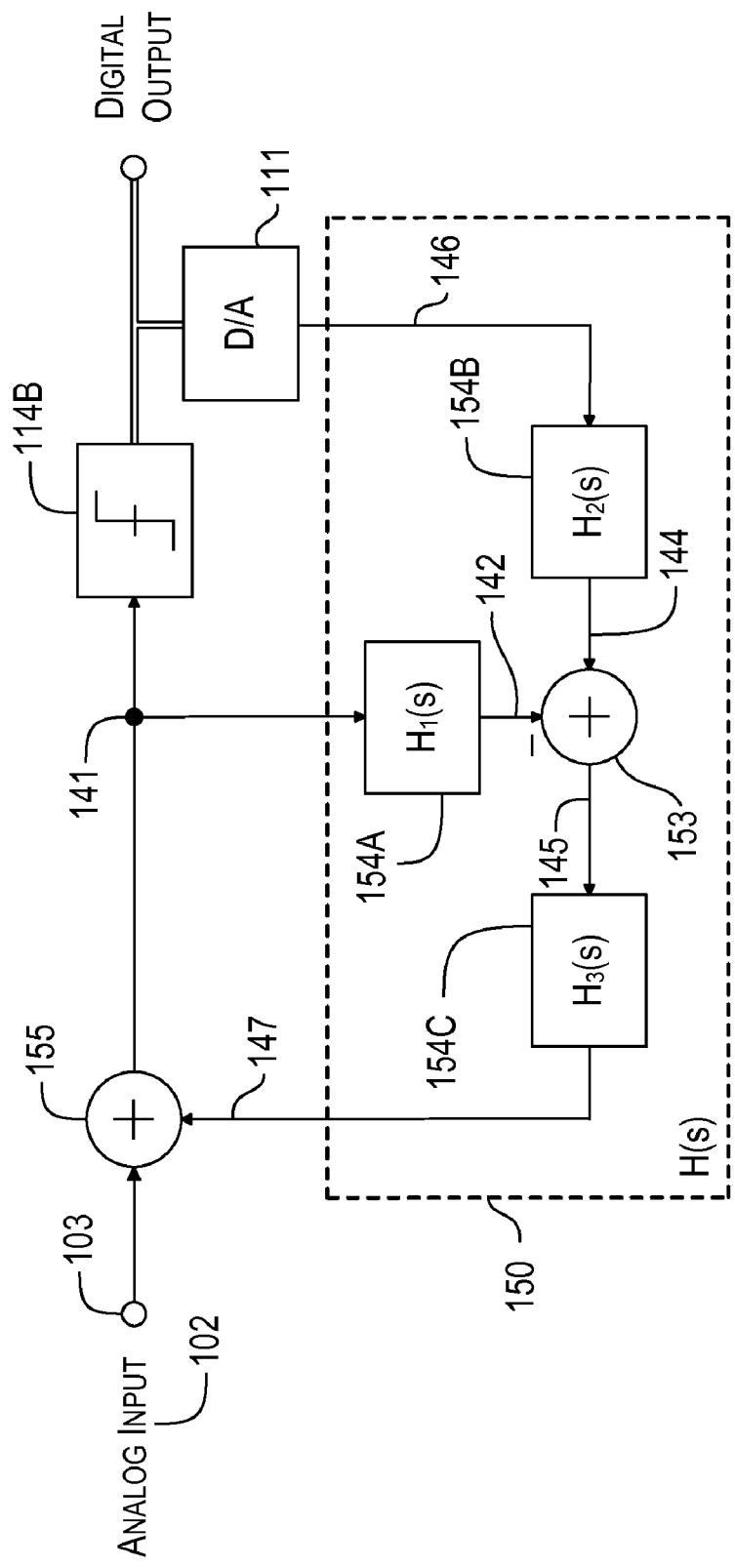
FIG. 8 is a block diagram illustrating a Diplexer Feedback Loop (DFL) according to a representative embodiment of the present invention that employs multi-bit quantization and a feedback diplexer to produce quantization noise response minima at arbitrary frequencies.

A simplified block diagram of an exemplary DFL, employing a feedback diplexer 150 in combination with a single-bit sampling/quantization circuit 114A, is shown in FIG. 7; and a simplified block diagram of an exemplary DFL, employing a feedback diplexer 150, in combination with a multi-bit sampling/quantization circuit 114B and digital-to-analog converter 111, is shown in FIG. 8. In the preferred embodiments of the invention, the shaping of quantization noise is continuous-time and does not employ any filtering in the modulator feed-forward path (between adder 155 and sampler/quantizer 114A or 114B).

In DFL feedback diplexer 150, a signal 141 (that is output from adder 155 and input into sampler/quantizer 114A) is independently filtered 154A (which preferably includes moderate amplification, as discussed in greater detail below), using a filter transfer function $H_1(s)$, thereby resulting in signal 142. At the same time, the output of sampler/quantizer 114A is independently filtered 154B, using a filter transfer function $H_2(s)$, thereby resulting in signal 144. Then, signal 142 is subtracted from signal 144 in subtractor 153, and the resulting combined signal 145 is filtered 154C, using a filter transfer function $H_3(s)$, thereby resulting in signal 147. Finally, signal 147 is combined with the input signal 102 in adder 155. Similar processing is illustrated in FIG. 8, although in that embodiment a digital-to-analog converter 111 is used to convert the multi-bit output of sampling/quantization circuit 114B into a continuous-time continuously variable signal that can be fed back into and processed by DFL feedback diplexer 150. The process of independently filtering signals and then combining them sometimes is referred to in the prior art as diplexing. In the present embodiment, filters 154A-C include just basic amplifiers, attenuators, distributed delay elements, and reactive components. Depending upon the filter parameters, filters 154A&B can be all-pass or can have appreciable magnitude variation across the relevant bandwidth that is being processed in the corresponding processing branch.

As illustrated in FIGS. 7 and 8, the DFL can be implemented in conjunction with either single-bit or multi-bit sampling/quantization circuits, which round an analog signal into discrete values. For embodiments employing a multi-bit sampling/quantization circuit, the improved circuit described in the '055 Application is preferred. However, it is also possible to use any other multi-bit sampling/quantization circuit, such as the conventional circuit described in the '055 Application.

In the current embodiment, the quantization noise-shaped response resulting from the use of DFL feedback diplexer 150 can be configured to produce a minimum at a selected (e.g., predetermined) frequency. Preferably, the DFL feedback diplexer 150 first inputs the signals at the input and output of the sampler/quantizer (114A or 114B), and then filters or pre-processes those inputs to produce a correction signal 147 that is added to the current value of the continuous-time, continuously variable input signal 102. Generally speaking, the addition of the correction signal ensures that future sample values will compensate for earlier quantization errors, while the preprocessing of the quantization error prior to such addition ensures that the quantization noise introduced by sampler/quantizer 114 will be shifted away from the frequency band of the input signal that is being processed by the current processing branch (e.g., branch 110 or 120).

As will be readily appreciated, filter 154C can be moved upstream of adder 153 (e.g., one instantiation in each branch) and/or any portion or all of its desired transfer function can be incorporated (or integrated) into each of filters 154A&B. Also, the phase response of filter 154B, or any portion thereof, may be moved to the output (i.e., before the branch-off point of signal 146) of the sampling/quantization circuit 114A or 114B, or may be integrated with the sampling/quantization circuit 114A or 114B itself, without affecting the quality of the quantization noise transfer function (NTF). In any event, the combined filtering performed on signal 141 is $H_1(s) \cdot H_3(s)$, and the combined filtering performed on signal 146 is $H_2(s) \cdot H_3(s)$. Each such combined filtering preferably produces frequency-dependent delaying (e.g., by less than or equal to twice the sampling period used in sampler/quantizer 114) and frequency-dependent amplification (e.g., by no more than 10 dB) over a bandwidth no greater than twice $f_S$, as discussed in greater detail below. At bandwidths much greater than three times $f_S$, such combined filtering preferably produces frequency-dependent delaying that approaches zero and frequency-dependent attenuation with a slope of 18 dB per octave to 30 dB per octave. Once again, the term "coupled", as used herein, or any other form of the word, is intended to mean either directly connected or connected through one or more other processing blocks, e.g., for the purpose of preprocessing. The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion.

Like the CT ΔΣ modulator, the DFL circuit, comprised of feedback diplexer 150 and quantizer 114, has the advantage that impairments related to the single, coarse sampling operation 114 can be subjected to the noise-shaped response of the circuit. Unlike the CT ΔΣ modulator, however, impairments related to the feedback digital-to-analog converter (DAC) 111 can also be subjected to the noise-shaped response of the DFL circuit. Because of the arrangement of the individual diplexer filters 154A-C in the feedback path of the noise shaping circuit, quantization noise notches are produced by filter structures with transmission zeros, instead of transmission poles. Therefore, unlike the CT ΔΣ modulator, the DFL does not require high-linearity transconductance stages (i.e., current sources) or high-gain operational amplifiers (i.e., voltage sources) with high-Q parallel resonators. Instead, only basic amplifiers (i.e., amplifiers with power output) with moderate gain preferably are used, e.g., to compensate for signal losses through the feedback loop of the DFL. Also, the feedback filter responses (e.g., the responses of feedback diplexer 150) can be produced by passive, distributed-element components such as transmission lines and attenuators. Furthermore, as discussed in greater detail below, sensitivities to component tolerances can be mitigated by using programmable gain elements (i.e., amplifiers and/or attenuators).

Referring to the circuits shown in FIGS. 7 and 8, the linearized signal transfer function (STF) and noise transfer function (NTF), between the input 103 and the output of the sampling/quantization circuit 114A or 114B, preferably are: STF(s)≈1 (i.e., approximately all-pass), and $$NTF(s) = \frac{1 + G \cdot H_1(s) \cdot H_3(s)}{1 + H_3(s) \cdot (G \cdot H_1(s) - H_2(s))},$$

such that for exemplary diplexer responses given by $$H_1(s) = \frac{\phi_1}{G} \cdot e^{-sT_3} + \frac{\phi_0}{G} \cdot e^{-sT_1},$$

$$H_2(s) = \phi_1 \cdot e^{-sT_4} + \phi_0 \cdot e^{-sT_2} \text{ and}$$

$$H_3(s) = \frac{\beta_0}{\beta_3 s^3 + \beta_2 s^2 + \beta_1 s + \beta_0},$$

the resulting overall DFL noise transfer function is $$NTF(s) = \frac{\beta_3 s^3 + \beta_2 s^2 + \beta_1 s + \beta_0 \cdot}{\beta_3 s^3 + \beta_2 s^2 + \beta_1 s + \beta_0 \cdot} \cdot \frac{(1 + \phi_1 \cdot e^{-sT_3} + \phi_0 \cdot e^{-sT_1})}{[1 + \phi_1 \cdot (e^{-sT_3} - e^{-sT_4}) + \phi_0 \cdot (e^{-sT_1} - e^{-sT_2})]}.$$

It can be shown that the DFL, for the appropriate choice of parameters (i.e., $T_1$, $T_2$, $T_3$, $T_4$, $\phi_0$, $\phi_1$, $\beta_0$, $\beta_1$, $\beta_2$ and $\beta_3$), produces second-order noise-shaped responses that are comparable to conventional delta-sigma ($\Delta\Sigma$) modulator noise-shaped responses, but with performance that is stable and tolerant of feedback delay variation.

The values of the parameters in the above exemplary NTF equation determine the frequency location of the notch, or null, in the quantization noise response ($f_{notch}$). In one embodiment, the location of the frequency notch is coarsely determined by $\beta_i$ and the delay parameters, $T_i$, in increments greater than or equal to $\frac{1}{10} \cdot f_S$ and the location of the frequency notch is finely determined by the coefficient parameter, $\phi_1$, in increments less than or equal to $\frac{1}{8} \cdot f_S$. Table 1 provides exemplary, normalized (i.e., $f_S=1$ Hz and $Z=1$ ohm) DFL parameters as a function of the NTF notch frequency. As indicated in Table 1, the mapping of DFL parameters to the quantization noise notch frequency ($f_{notch}$) may not be a one-to-one function (e.g., non-isomorphic). However, the DFL parameters and the quantization noise notch frequency are related such that, for fixed $\phi_i$ and $\beta_i$, the quantization noise notch frequency decreases when the primary filter coarse tuning parameter $T_1$ increases, and increases when the primary filter coarse tuning parameter $T_1$ decreases. This behavior is different from that of a conventional, bandpass delta-sigma modulator, where the equivalent of this coarse tuning parameter is either fixed by the sampling operation of the modulator (i.e., DT $\Delta\Sigma$) or is embedded in the response of a continuous-time integrator (i.e., CT $\Delta\Sigma$).

114 sampling clock. Furthermore, in the preferred embodiments the following relationships apply (at least approximately, but more preferably, exactly): (1) the relationship between $T_1$ and $T_S$ is $T_1=2 \cdot T_S - \tau_{GD}$; (2) the relationship between $T_2$ and $T_S$ is $T_2=\frac{3}{2} \cdot T_S - \tau_{GD}$; (3) the relationship between $T_3$ and $T_S$ is $T_3=T_S - \tau_{GD}$; and (4) the relationship between $T_4$ and $T_S$ is $T_4=\frac{1}{2} \cdot T_S - \tau_{GD}$. Under these conditions, the signal transfer function (STF) of the noise shaping filter is approximately all-pass, i.e., $STF(s)=k \cdot e^{-s\tau}$, across the bandwidth of a given MBO processing branch. In general, the signal transfer function (STF) of the DFL has approximately the preferred all-pass response when the relationship between $T_1$, $T_2$, $T_3$ and $T_4$ is such that: $T_3-T_4=\frac{1}{2} \cdot T_S$ and $T_1-T_2=\frac{1}{2} \cdot T_S$. Also, it is preferable that each delay variable $T_i$ includes the propagation, or settling, delays of any corresponding active component(s). Therefore, it is preferred that the propagation delay of the sampling circuits and/or amplifiers is less than $\frac{1}{4} \cdot T_S$ (i.e., a condition causing $T_4 \geq 0$ in the preferred embodiments) to enable the placement of quantization noise notches at frequencies up to $\frac{1}{2} \cdot f_S$ (i.e., the Nyquist bandwidth).

More generally, in the preferred embodiments of the DFL noise shaping circuit, each of the first diplexer filter response, which in the present embodiment is given by the convolution of filter $H_1(s)$ 154A with filter $H_3(s)$ 154C, and the second diplexer filter response, which in the present embodiment is given by the convolution of filter $H_2(s)$ 154B and filter $H_3(s)$ 154C, is the weighted sum (or difference) of two filter responses $W_{ij}(s)$, such that:

$$H_1(s) \cdot H_3(s) = \phi_{00} \cdot W_{00}(s) + \phi_{01} \cdot W_{01}(s) \text{ and}$$

$$H_2(s) \cdot H_3(s) = \phi_{10} \cdot W_{10}(s) + \phi_{11} \cdot W_{12}(s),$$

where $\phi_{ij}$ are positive or negative scalars. The above scalar values are analogous in function to the fine-tuning parameters $\phi_i$ discussed earlier with respect to an exemplary embodiment of the DFL, and generally determine the fine frequency location ($f_{notch}$) and depth of the null in the quantization noise transfer function (NTF). Therefore, the values of $\phi_{ij}$ depend

TABLE 1

Exemplary Normalized Diplexer Feedback Loop Parameters

| NTF Notch Freq. ($f_{notch}/f_{CLK}$) | $\frac{T_1}{T_{CLK}}$ | $\frac{T_2}{T_{CLK}}$ | $\frac{T_3}{T_{CLK}}$, $\frac{T_4}{T_{CLK}}$ | $\phi_0$ | $\phi_1$ | $\beta_0$ | $\beta_1$ | $\beta_2$ | $\beta_3$ |
|---|---|---|---|---|---|---|---|---|---|
| 0.00 | 8.00 | 7.50 | 4.00 | 2.00 | −3.00 | 6.1E−5 | 3.1E−3 | 7.9E−2 | 1.0 |
| 0.00 | 2.50 | 2.00 | 1.00 | 1.00 | −2.00 | 3.9E−3 | 4.9E−2 | 3.1E−1 | 1.0 |
| 0.01 | 8.00 | 7.50 | 4.00 | 1.80 | −2.70 | 6.1E−5 | 3.1E−3 | 7.9E−2 | 1.0 |
| 0.02 | 7.00 | 6.50 | 3.50 | 1.60 | −2.20 | 6.1E−5 | 3.1E−3 | 7.9E−2 | 1.0 |
| 0.05 | 7.00 | 6.50 | 3.50 | 1.10 | −0.20 | 6.1E−5 | 3.1E−3 | 7.9E−2 | 1.0 |
| 0.10 | 3.75 | 3.25 | 1.875 | 1.00 | 0 | 4.8E−4 | 1.2E−2 | 1.6E−1 | 1.0 |
| 0.15 | 2.70 | 2.20 | 1.35 | 1.00 | 0 | 3.9E−3 | 4.9E−2 | 3.1E−1 | 1.0 |
| 0.20 | 1.85 | 1.35 | 0.925 | 1.00 | 0 | 3.9E−3 | 4.9E−2 | 3.1E−1 | 1.0 |
| 0.25 | 1.35 | 0.85 | 0.675 | 1.00 | 0 | 3.9E−3 | 4.9E−2 | 3.1E−1 | 1.0 |
| 0.25 | 1.60 | 1.10 | 0.80 | 1.00 | 0 | 1.3E−2 | 1.1E−1 | 4.7E−1 | 1.0 |
| 0.30 | 1.00 | 0.50 | 0.50 | 1.00 | 0 | 3.9E−3 | 4.9E−2 | 3.1E−1 | 1.0 |
| 0.30 | 1.25 | 0.75 | 0.625 | 1.00 | 0 | 1.3E−2 | 1.1E−1 | 4.7E−1 | 1.0 |
| 0.35 | 1.00 | 0.50 | 0.50 | 1.00 | 0 | 1.3E−2 | 1.1E−1 | 4.7E−1 | 1.0 |
| 0.40 | 1.00 | 0.50 | 0.50 | 0.90 | 0.20 | 3.1E−2 | 2.0E−1 | 6.3E−1 | 1.0 |
| 0.45 | 0.75 | 0.25 | 0.25 | 1.00 | 0 | 3.1E−2 | 2.0E−1 | 6.3E−1 | 1.0 |
| 0.50 | 0.75 | 0.25 | 0.25 | 0.95 | 0.22 | 3.1E−2 | 2.0E−1 | 6.3E−1 | 1.0 |

In one embodiment of the DFL, the $\beta_i$ parameters determine the cut-off frequency ($f_{3\ dB}$), or 3 dB bandwidth, of a third-order, low-pass filter response. In the preferred embodiments, the low-pass filter response defined by the $\beta_i$ parameters is such that $f_{3\ dB} > f_S$ and the in-band propagation delay ($\tau_{GD}$) is less than $\frac{1}{4} \cdot T_S$, where $T_S$ is the period of the quantizer on the desired frequency notch location. To reduce complexity, the first and second diplexer filter responses can use common scalar values (i.e., $\phi_{00}=\phi_{10}$ and $\phi_{01}=\phi_{11}$), because the characteristics of the NTF quantization noise null are primarily determined by $\phi_{00}$ and $\phi_{01}$, with $\phi_{10}$ and $\phi_{11}$ having a secondary effect. The filter responses $W_{ij}(s)$ preferably have group delay and insertion gain that are constant at frequencies lying within the 20 dB bandwidth of the NTF quantization noise response (i.e., frequencies near $f_{notch}$) and approach zero at frequencies greater than those lying within the 20 dB bandwidth of the NTF quantization noise response (e.g., frequencies much greater than $f_{notch}$).

To maintain low complexity, the filter responses $W_{ij}(s)$ preferably are low-pass responses of second to fifth order and, more preferably, are given by:

$$W_{ij}(s) = \frac{\beta''_{ij0} \cdot e^{-sT_{ij}}}{\sum_{k=0}^{5} \beta''_{ijk} \cdot s^k}.$$

In this particular case, the amplitude response of the low-pass filter $W_{ij}(s)$ is determined by the denominator coefficients $\beta''_{ijk}$, which establish the filter cutoff frequency $f_{3\,dB}$ and filter out-of-band, roll-off factor (e.g., 12 dB per octave for a second-order filter). The group delay (propagation delay) response of the low-pass filter $W_{ij}(s)$ is determined by the denominator coefficients $\beta''_{ijk}$ and the coarse tuning (delay) parameter $T_{ij}$ in the numerator. Furthermore, the filter coefficients $\beta''_{ijk}$ can be derived using normalized filter polynomials for standard analog filter types, such as Bessel and equiripple filters which are preferable because they exhibit near constant group delay across the passband of the filter. Therefore, the general forms of the two diplexer filters preferably are:

$$H_1(s) \cdot H_3(s) = \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k}$$

and $$H_2(s) \cdot H_3(s) = \varphi_{10} \cdot \frac{\beta''_{100} \cdot e^{-sT_{10}}}{\sum_{k=0}^{5} \beta''_{10k} \cdot s^k} + \varphi_{11} \cdot \frac{\beta''_{110} \cdot e^{-sT_{11}}}{\sum_{k=0}^{5} \beta''_{11k} \cdot s^k}.$$

This results in a DFL noise-shaped response that is generally of the form:

$$NTF(s) = \frac{1 + G \cdot \left( \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k} \right)}{1 + G \cdot \left( \varphi_{00} \cdot \frac{\beta''_{000} \cdot e^{-sT_{00}}}{\sum_{k=0}^{5} \beta''_{00k} \cdot s^k} + \varphi_{10} \cdot \frac{\beta''_{100} \cdot e^{-sT_{10}}}{\sum_{k=0}^{5} \beta''_{10k} \cdot s^k} + \varphi_{01} \cdot \frac{\beta''_{010} \cdot e^{-sT_{01}}}{\sum_{k=0}^{5} \beta''_{01k} \cdot s^k} - \varphi_{11} \cdot \frac{\beta''_{110} \cdot e^{-sT_{11}}}{\sum_{k=0}^{5} \beta''_{11k} \cdot s^k} \right)}$$

Without loss of noise shaping performance, the complexity of the above general DFL quantization noise transfer function (i.e., and therefore the complexity of the DFL circuit) can be reduced by making the substitutions: (1) $\beta''_{00k} = \beta''_{01k} = \beta'_{0k}$, (2) $\beta''_{10k} = \beta''_{11k} = \beta'_{1k}$, (3) $\phi_0 = 1/G \cdot \phi_{01} = \phi_{11}$, and (4) $\phi_1 = 1/G \cdot \phi_{00} = \phi_{10}$. These substitutions result in the preferred DFL noise transfer function which is given by:

$$NTF(s) = \frac{\left( 1 + \frac{\beta'_{00}}{\sum_{k=0}^{5} \beta'_{0k} \cdot s^k} \cdot (\phi_1 \cdot e^{-sT_3} + \phi_0 \cdot e^{-sT_1}) \right)}{1 + \left( \frac{\beta'_{00}}{\sum_{k=0}^{5} \beta'_{0k} \cdot s^k} \cdot (\phi_1 \cdot e^{-sT_3} + \phi_0 \cdot e^{-sT_1}) - \frac{\beta'_{10}}{\sum_{k=0}^{5} \beta'_{1k} \cdot s^k} \cdot (\phi_1 \cdot e^{-sT_4} + \phi_0 \cdot e^{-sT_2}) \right)},$$

where $T_1 = T_{01}$, $T_2 = T_{11}$, $T_3 = T_{00}$, and $T_4 = T_{10}$. In addition, for the particular case where the low-pass filter responses $W_{ij}(s)$ are third order and equal, such that $\beta'_{0k} = \beta'_{1k} = \beta_k$, the preferred DFL noise transfer further reduces to $$NTF(s) = \frac{\beta_3 s^3 + \beta_2 s^2 + \beta_1 s + \beta_0 \cdot (1 + \phi_1 \cdot e^{-sT_3} + \phi_0 \cdot e^{-sT_1})}{\beta_3 s^3 + \beta_2 s^2 + \beta_1 s + \beta_0 \cdot [1 + \phi_1 \cdot (e^{-sT_3} - e^{-sT_4}) + \phi_0 \cdot (e^{-sT_1} - e^{-sT_2})]},$$

which is the same equation that was discussed above in reference to the Table 1 parameters. Therefore, the exemplary DFL diplexer responses defined in Table 1 are just special cases of the general form of the preferred DFL quantization noise response. Although the preferred quantization noise transfer function (NTF) defined above can be derived from diplexer filter responses that are the weighted sum (or difference) of two low-pass filter responses, as discussed above, other derivation methods and approaches are also possible, such as those based on iterative design methods, for example.

The sampler/quantizer 10 of the discrete-time, delta-sigma modulator introduces a transfer function $H_Q(z)$ that is unity, such that $H_Q(z) = 1$. However, for continuous-time noise shaping circuits, such as the Diplexer Feedback Loop (DFL), the sampler/quantizer 114A introduces a non-unity, zero-order-hold transfer function given by $$H_Q(s) = \frac{1 - e^{-sT_s}}{s},$$

where $T_S$ is the quantizer sample clock period and $T_S = 1/f_S$. This transfer function has a constant group delay (i.e., propagation delay) equal to $\frac{1}{2} \cdot T_S$. In addition, the sampler/quantizer has finite, extra transport delay $\tau_{PD}$. Therefore, the diplexer filter responses of the DFL preferably are different in amplitude, phase/group delay, or both to compensate for the sampler/quantizer 114A zero-order hold response, plus any additional transport delay $\tau_{PD}$ associated with the sampler/quantizer 114A. For this reason, the DFL diplexer filter responses preferably are different and account for the overall transfer function of the sampler/quantizer 114A.

Figure 9A:
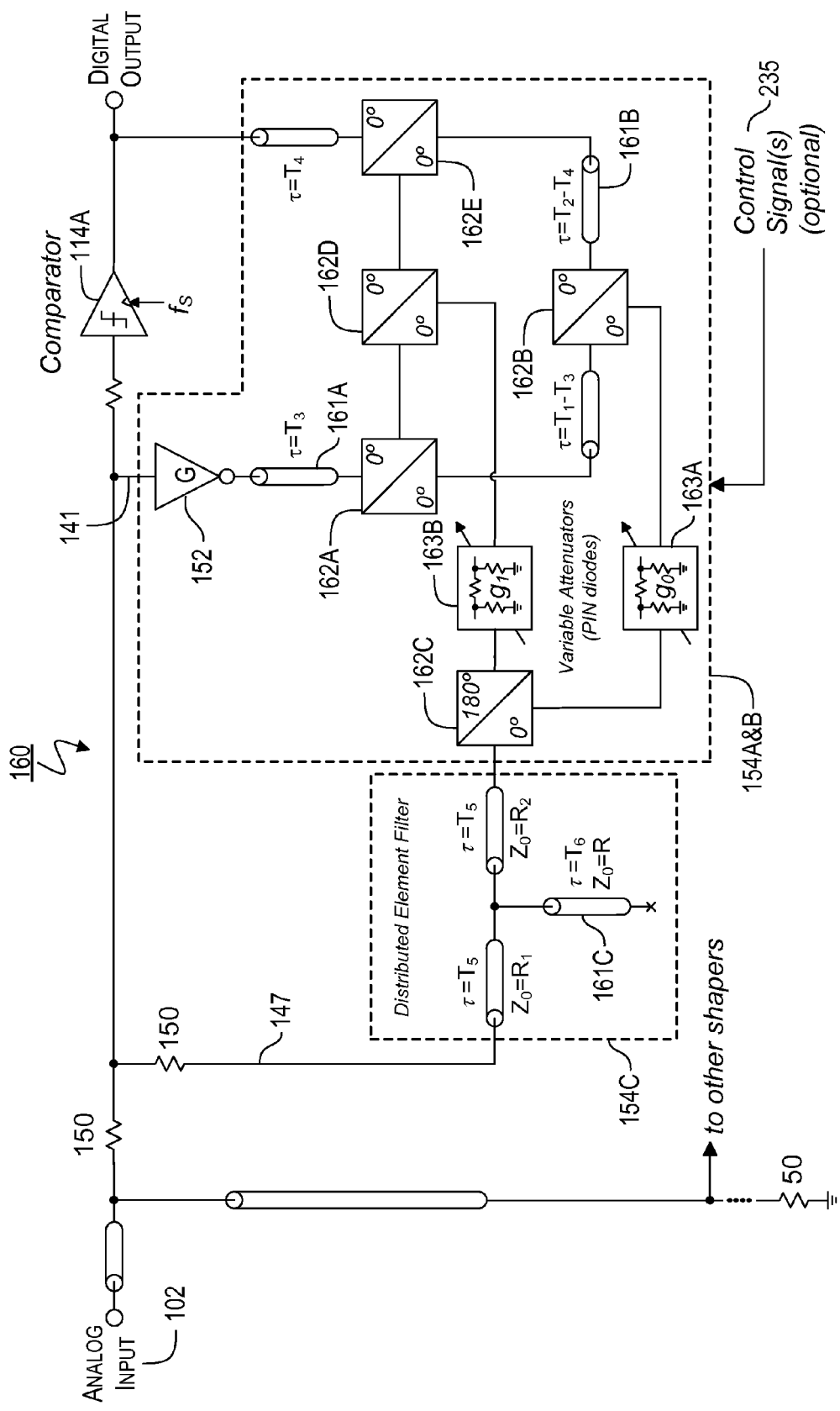
FIGS. 9A&B are circuit diagrams illustrating exemplary implementations of Diplexer Feedback Loop (DFL) noise shaping for negative trimming/calibration of $f_{notch}$ values using reactive networks for signal summing and signal distribution.
Figure 9B:
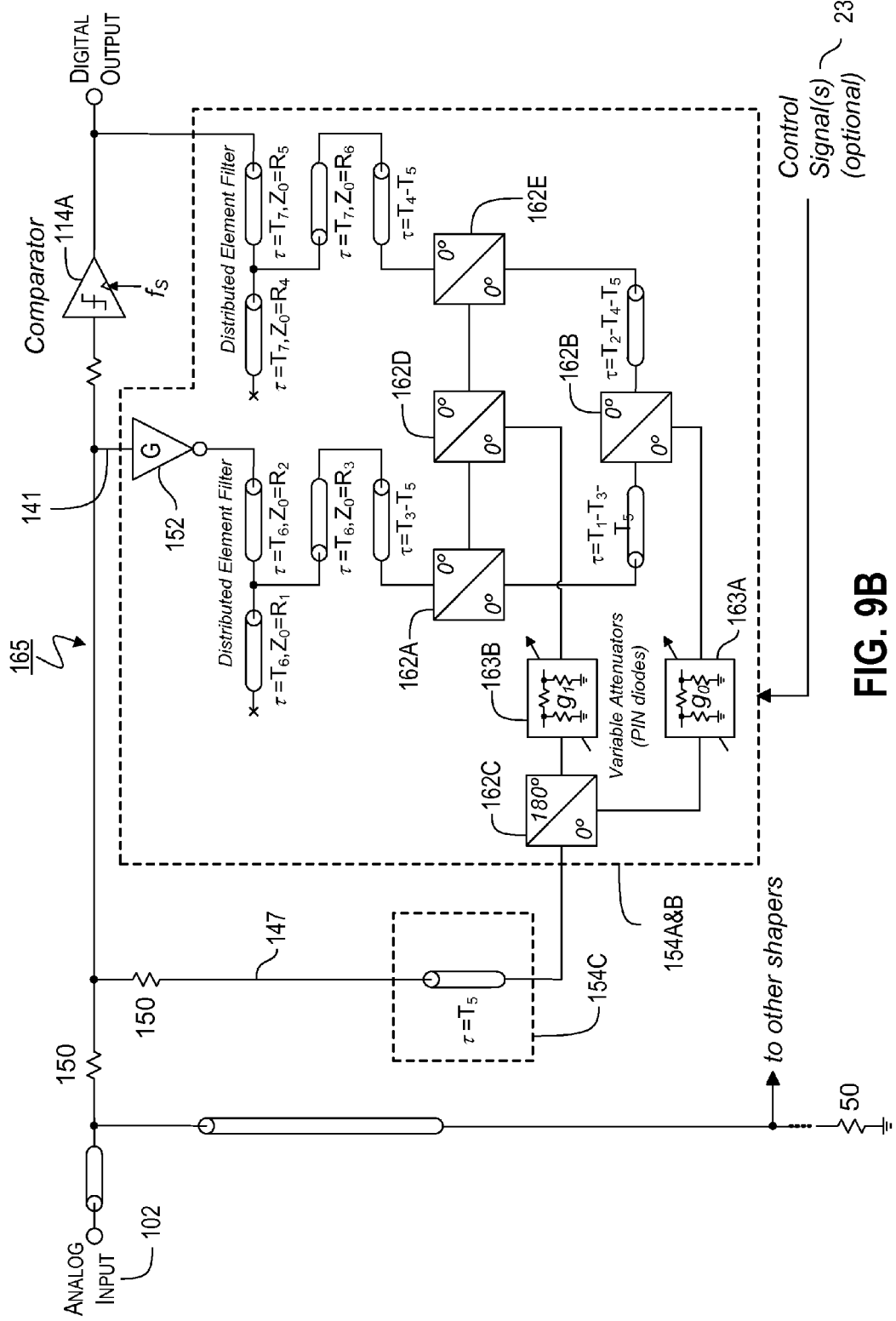
FIGS. 9C&G are circuit diagrams illustrating exemplary implementations of Diplexer Feedback Loop (DFL) noise shaping for positive trimming/calibration of $f_{notch}$ values using multi-bit quantization and reactive networks for signal summing and signal distribution.
FIG. 9D is a circuit diagram illustrating an exemplary implementation of Diplexer Feedback Loop (DFL) noise shaping for negative trimming/calibration of $f_{notch}$ values using resistive networks for signal summing and signal distribution.
FIGS. 9E&F are circuit diagrams illustrating exemplary implementations of Diplexer Feedback Loop (DFL) noise shaping for positive trimming/calibration of $f_{notch}$ values using resistive networks for signal summing and signal distribution.
Figure 9C:
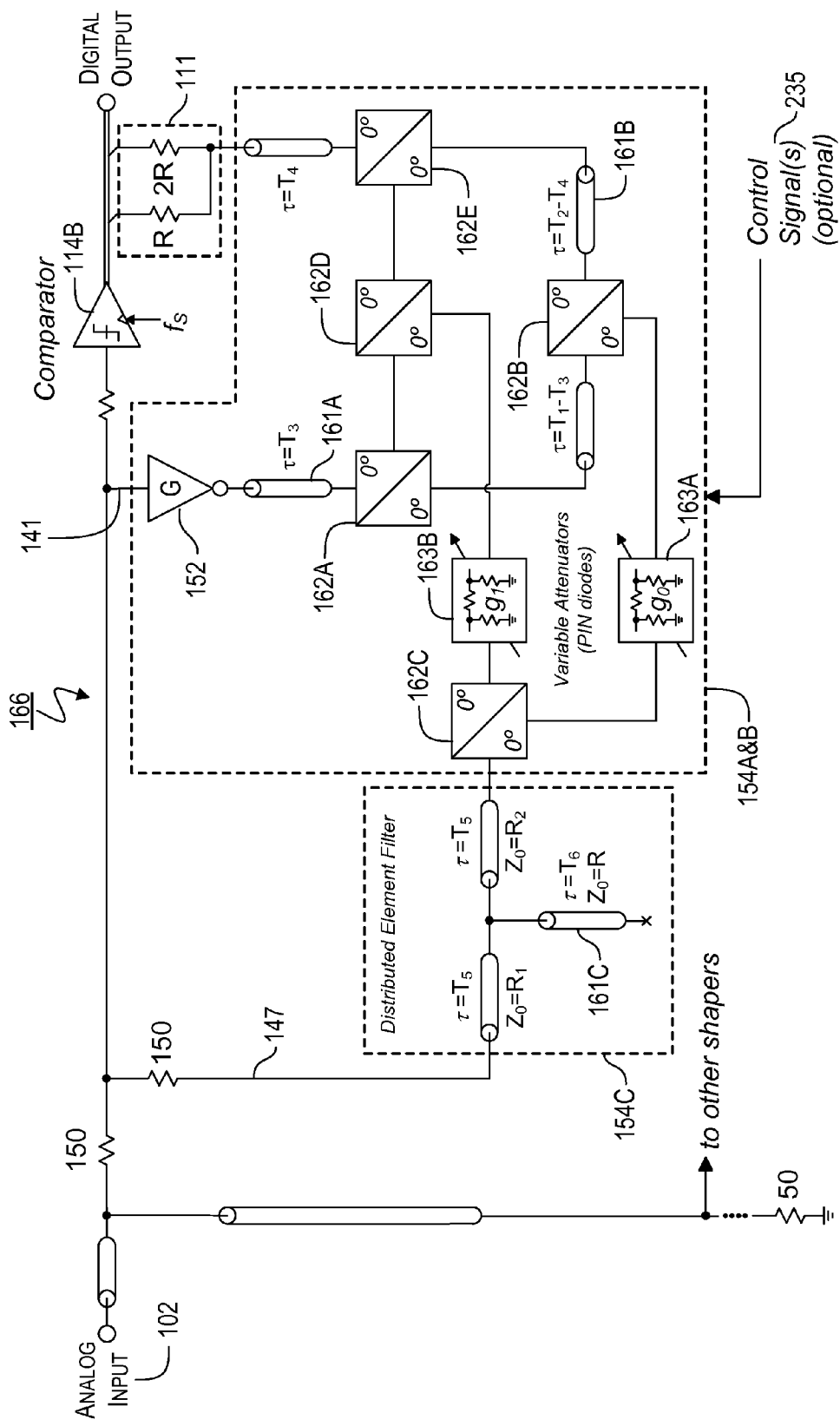
Figure 9D:
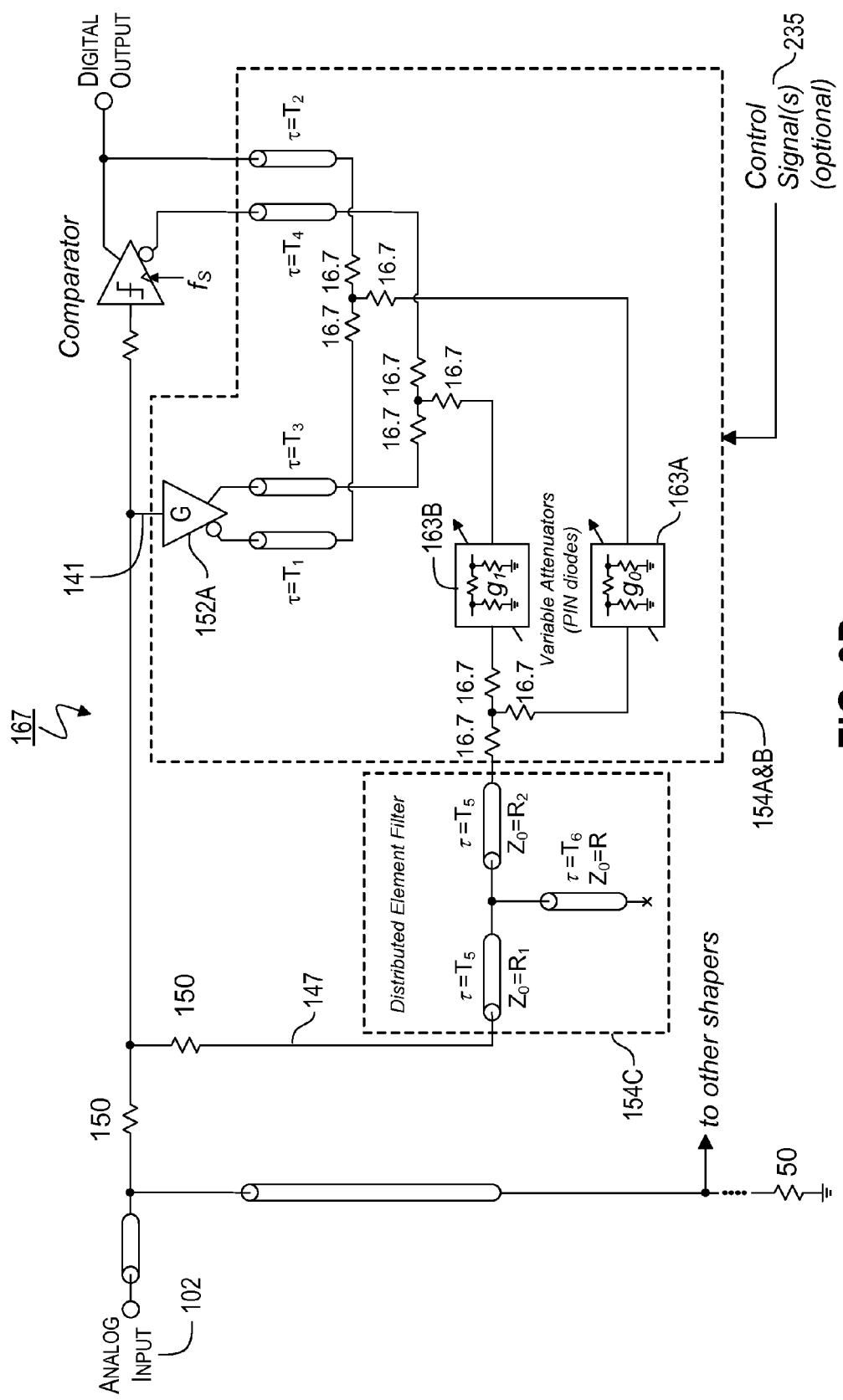
Figure 9E:
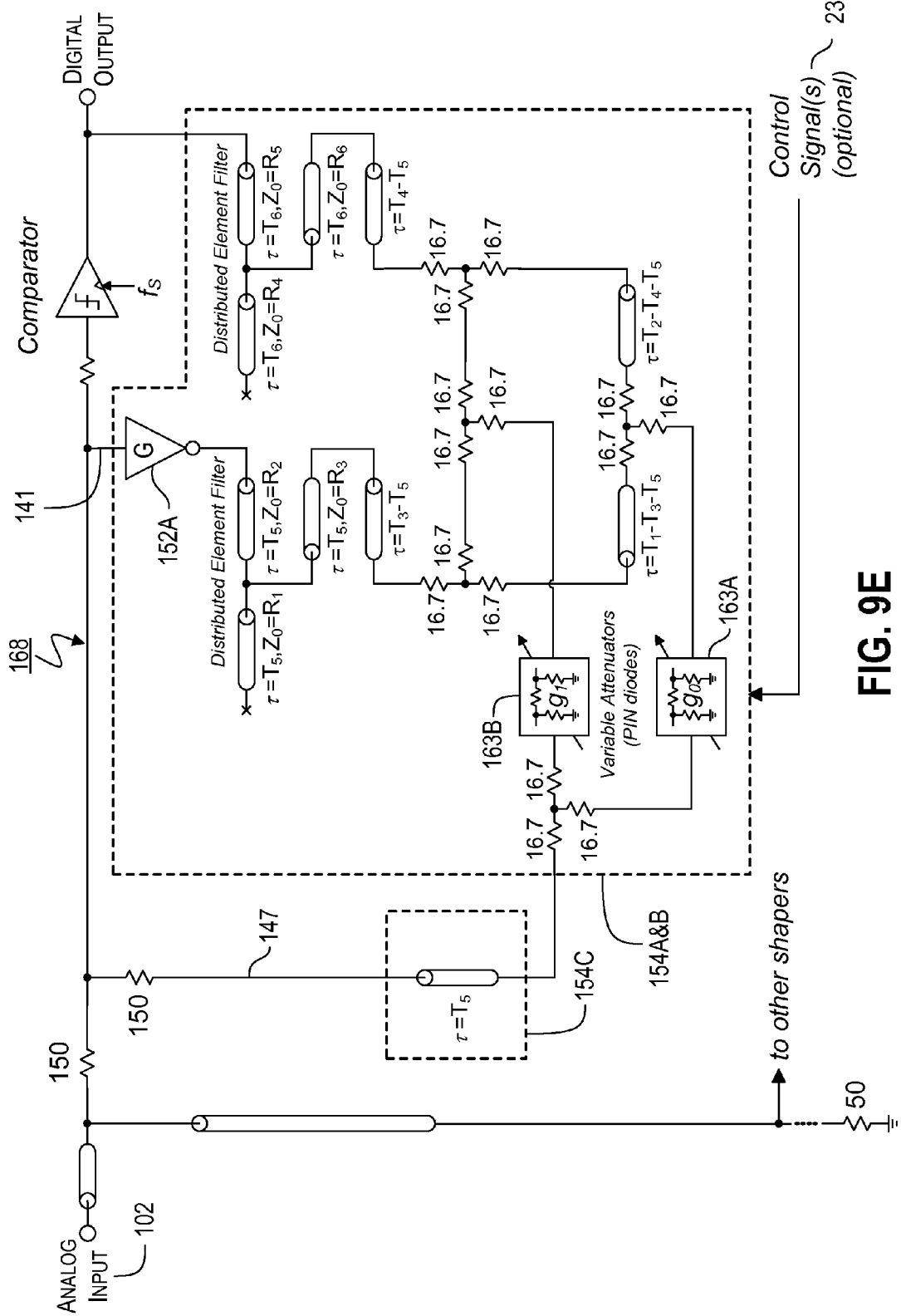
Figure 9F:
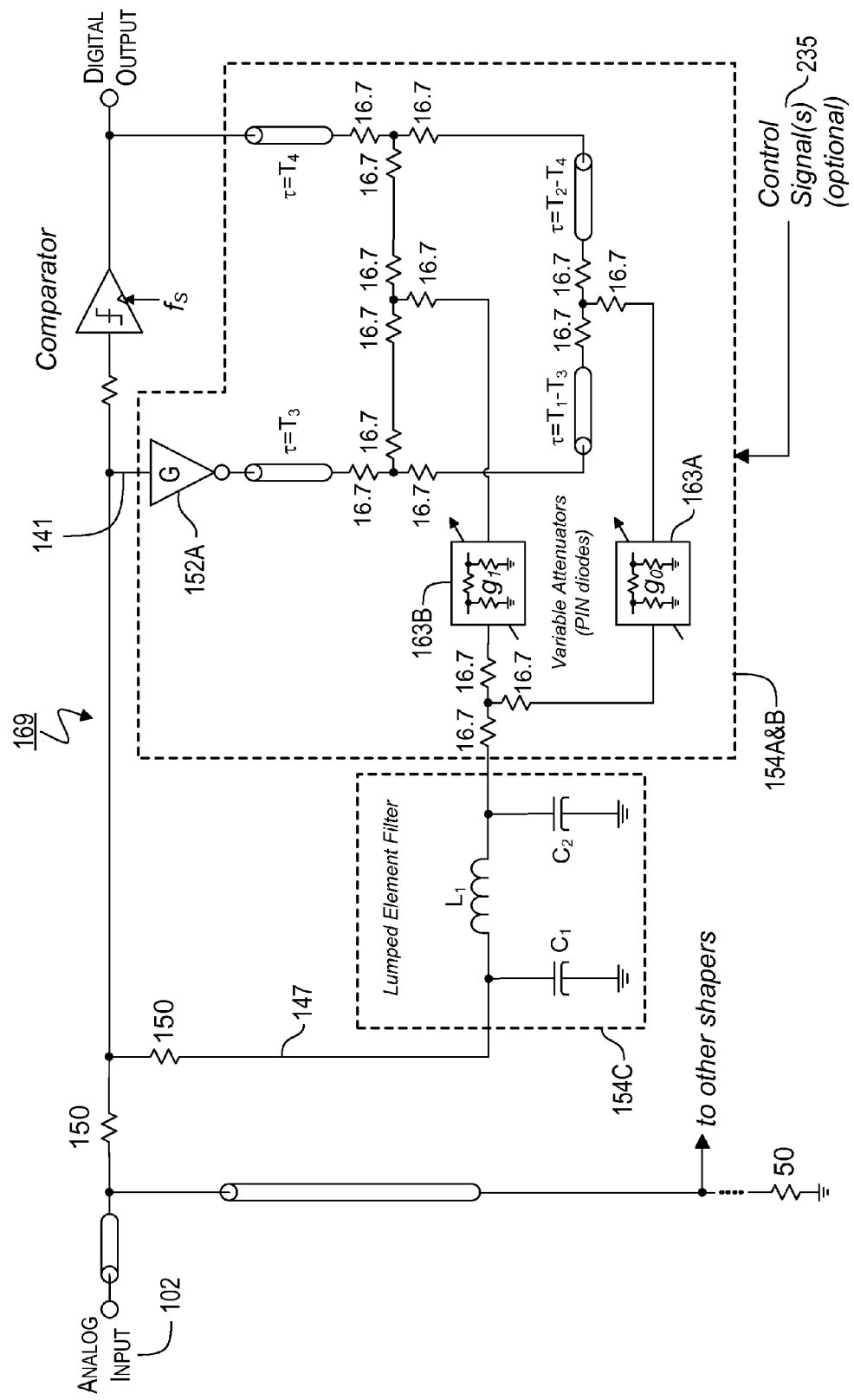
Figure 9G:
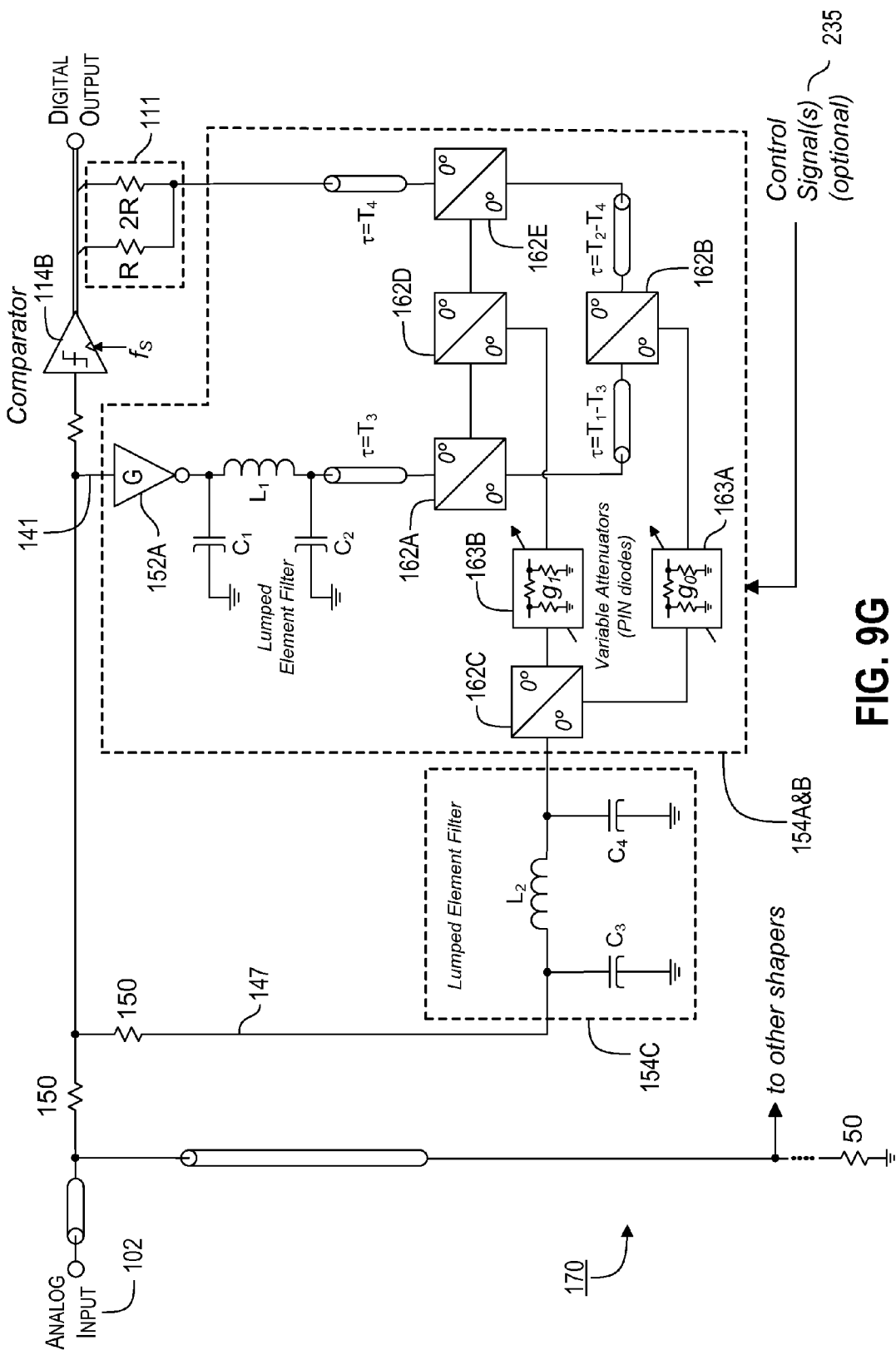
Figure 10:
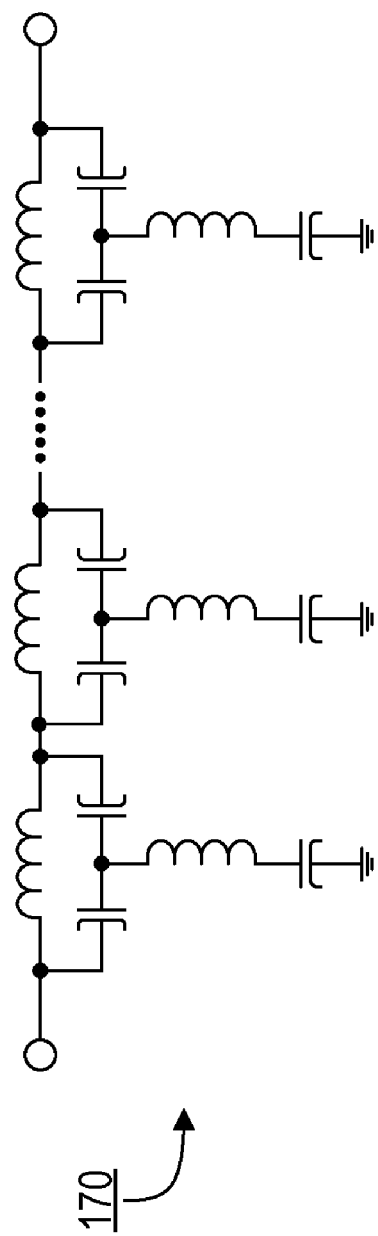
FIG. 10 illustrates a circuit diagram of a conventional, lumped-element delay network for use in a representative embodiment of the present invention.

The general and preferred DFL diplexer responses defined above, and the specific exemplary DFL diplexer responses parameterized in Table 1, can be realized using high-frequency design techniques, such as those based on distributed-element microwave components and monolithic microwave integrated circuits (MMICs). Exemplary implementations that include a Diplexer Feedback Loop filter 150 are: circuits 160 and 165 (shown in FIGS. 9A&B) for negative values of $\phi_1$ and a single-bit sampler/quantizer 114A; and circuit 166 (shown in FIG. 9C) for positive values of $\phi_1$ and a multi-bit sampler/quantizer 114B. These implementations are based on a single-ended controlled-impedance (i.e., 50 ohm) system, and the delay ($e^{-sT}$) elements (e.g., delay elements 161A-C) are realized using transmission lines. Unlike continuous-time or discrete-time delta-sigma modulators, the preferred DFL circuit 113 requires only 50-ohm, moderate gain (i.e., basic) amplifier blocks and distributed passive elements (e.g., attenuators, power splitters and transmission lines), except for the high-speed limiter (or, with respect to circuit 166, the multi-bit quantizer). In the exemplary circuits shown in FIG. 9A&B, the quantizer 114A is a hard limiter that produces a single-bit output. The hard limiter has the advantages of high-speed operation and precise quantization, but multi-bit quantizers instead could be used to improve converter resolution and performance stability, as illustrated by sampler/quantizer 114B in FIG. 9C (which, as noted above, preferably is implemented as discussed in the '055 Application). Also, in the exemplary circuits shown in FIGS. 9A-C, the parameters $\phi_i$ are determined by the value of a variable attenuator (163A or 163B, respectively) with $\phi_i = g_i G$. Alternate variable attenuators can be implemented using semiconductor devices, such as PIN diodes and field-effect transistors (FETs), or can be implemented using a switched array of fixed resistor networks. Still further, the value of $\phi_i$ instead could be set based on the gain of a programmable gain amplifier. In FIGS. 9A-C, the amplifier 152 provides a gain G of about 20 dB (although higher gains up to, e.g., approximately 40 dB instead could be provided to compensate for higher signal losses through the feedback path of the DFL). In alternate embodiments, the total gain G can be distributed across multiple amplifier devices, such as for example replacing one 20 dB gain device with two 10 dB gain devices. Also, in these embodiments signal summing and signal distribution is accomplished via power splitters and combiners (e.g., 162A-E) that, for example, can be implemented using a combination of coupled transmission lines, active devices, and/or reactive (magnetic) networks (e.g., Wilkinson divider, Lange coupler, branchline hybrid, etc.). However, other means of signal summing and distribution exist, including resistive networks known as Wye splitters/combiners, as shown for circuits 167 (which potentially has the same DFL transfer functions as circuit 160 discussed above) and 168 (which potentially has the same DFL transfer functions as circuit 166 discussed above) in FIGS. 9D&E, respectively. Resistive splitters have the advantages of very broadband operation and small size, but reactive splitters can be used to reduce signal losses and reduce amplifier gain. In addition, this DFL circuit is easily adapted for differential systems, and the basic design can be altered for construction using uncontrolled impedance devices (i.e., transconductance stages) or lumped element components, without loss of generality. For example, instead of transmission lines, any or all of the delay elements can be implemented using active or reactive structures, such as buffers or as passive lattice structures, such as the circuit 170 shown in FIG. 10. In addition, some or all of the diplexer filter 150 responses can be realized using lumped element components, as shown for circuits 169 and 170 in FIGS. 9F&G, respectively.

Figure 11:
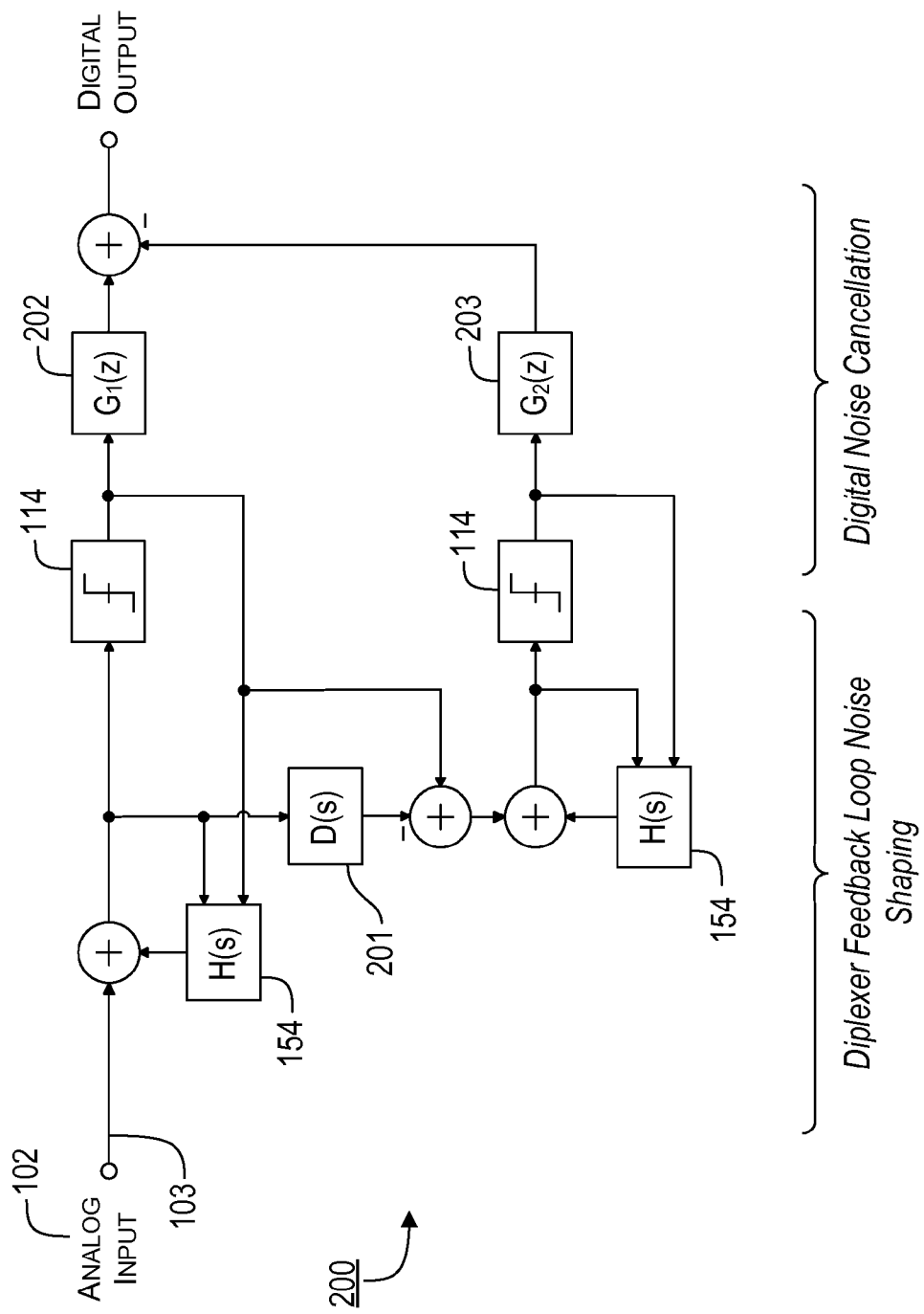
FIG. 11 is a block diagram of an exemplary fourth-order Diplexer Feedback Loop (DFL) noise shaping circuit using a parallel circuit arrangement.

Each of the DFL circuits shown in FIGS. 9A-G has a second-order noise-shaped response. However, like the MASH (i.e., Multi-stAge SHaping) structures used with conventional DT ΔΣ modulators, it is possible to realize improved noise shaping performance by adding additional DFL stages in a parallel arrangement to create higher-order responses. A DFL 200 with fourth-order noise-shaped response is shown in FIG. 11. Higher-order cascade (i.e., series) structures also are possible, but the parallel arrangement generally exhibits better stability than the cascade structure, particularly for high-order (i.e., >3) noise-shaped responses and single-bit sampling. However, the parallel structure generally requires the digital interface to handle two single-bit inputs rather than one single-bit input. The transfer functions of the additional filters 201, 202 and 203 shown in FIG. 11 preferably are:

$$D(s) = e^{-sT_S}$$

$$G_1(z) = z^{-1} \text{ and}$$

$$G_2(z) = 1 + \rho_1 \cdot z^{-1} + \rho_0 \cdot z^{-2},$$

respectively, where $T_S$ is the quantizer sample clock period and the $\rho_i$ values are chosen such that the response of $G_2(z)$ closely matches the NTF response of the first DFL stage within the signal bandwidth of the associated processing branch. The coefficient $\rho_1$ is calculated based on the NTF notch frequency ($f_{notch}$) of the first stage according to $\rho_1 \approx -2 \cdot \cos(2 \cdot \pi \cdot f/f_S)$, and the coefficient $\rho_0$ is determined based on the Q of the quantization noise response first stage, such that $\rho_0 \approx 1$. Higher-order noise-shaped responses generally enable more quantization noise to be removed by the Bandpass Moving Average reconstruction (or other reconstruction) filter(s) that follow the noise shaping circuit (i.e., preferably a DFL).

For the exemplary DFL parameter values given in Table 1, the mapping of filter parameters to the quantization noise notch frequency ($f_{notch}$) is not a one-to-one function (e.g., non-isomorphic). However, the filter parameters and the quantization noise notch frequency are related such that: (1) for fixed $\phi_i$ and $\beta_i$, the quantization noise notch frequency decreases with increasing primary coarse tuning parameter $T_1$; and (2) for fixed $\beta_i$ and $T_i$, the quantization noise notch frequency increases with increasing fine tuning parameter $\phi_1$. The latter relationship suggests a method for calibrating the DFL response to account for component tolerances. For the second-order DFL circuits shown in FIGS. 9A-G, the parameters $T_i$ and $\beta_i$ determine the coarse location of a relatively narrowband null ($f_{notch}$) in the quantization noise response, while the fine location of the notch frequency and its quality (Q) factor (i.e., notch depth) are determined by the tuning parameters $\phi_i = g_i G$. Given that, ultimately, the shaped quantization noise is passed through a narrowband Bandpass Moving Average (BMA) reconstruction or other bandpass filter, the noise at the BMA filter output typically will not be at the minimum level if the location of the quantization noise null is not precisely aligned with the center frequency of the BMA filter response. Use of a variable attenuator or variable-gain amplifier allows the DFL tuning parameters, $\phi_i$, to be dynamically adjusted, or adjusted based on manufacturing trim operations.

Figure 12A:
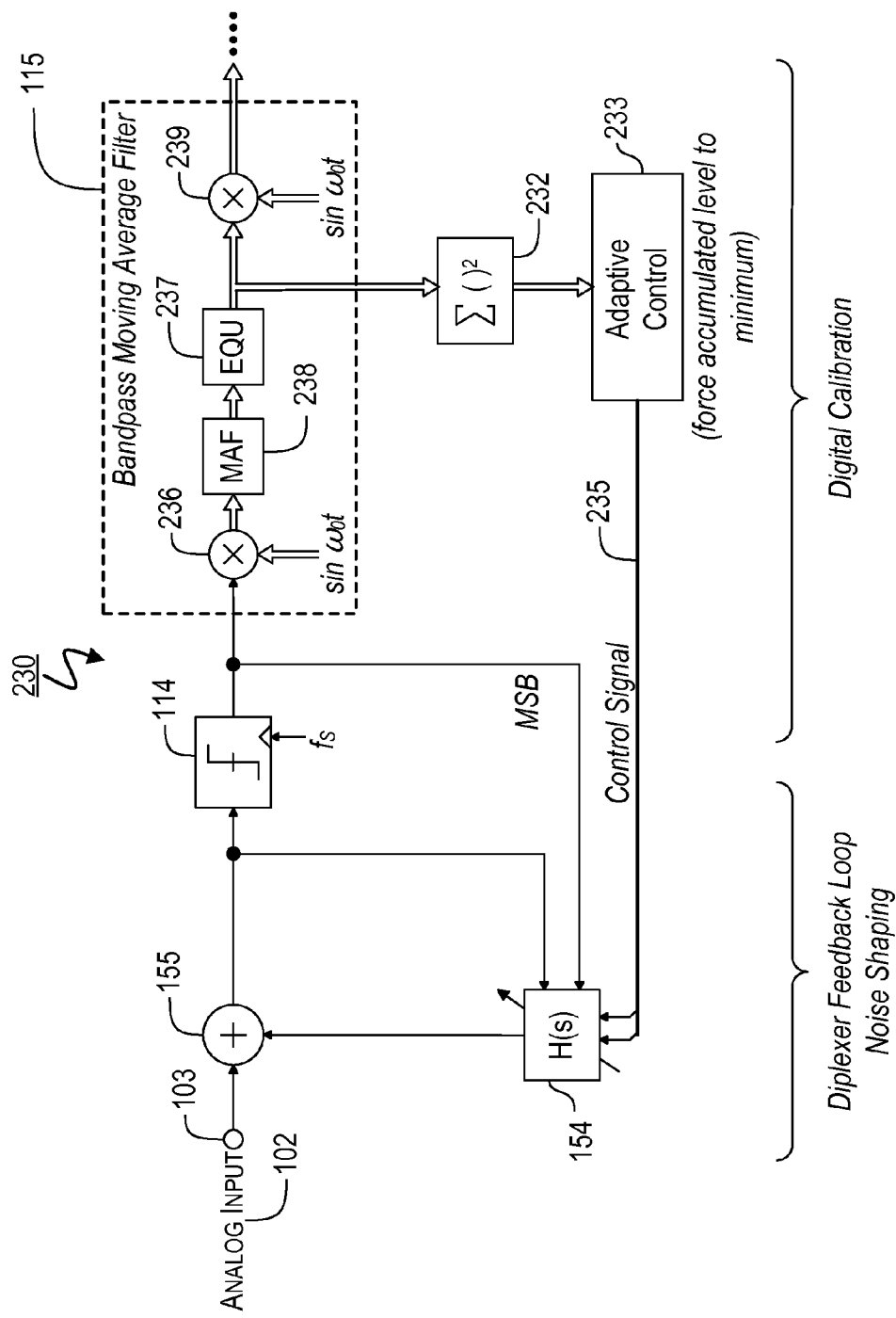
FIGS. 12A&B illustrate second- and fourth-order Diplexer Feedback Loop (DFL) noise shaping circuits, respectively, that use active calibration.
Figure 12B:
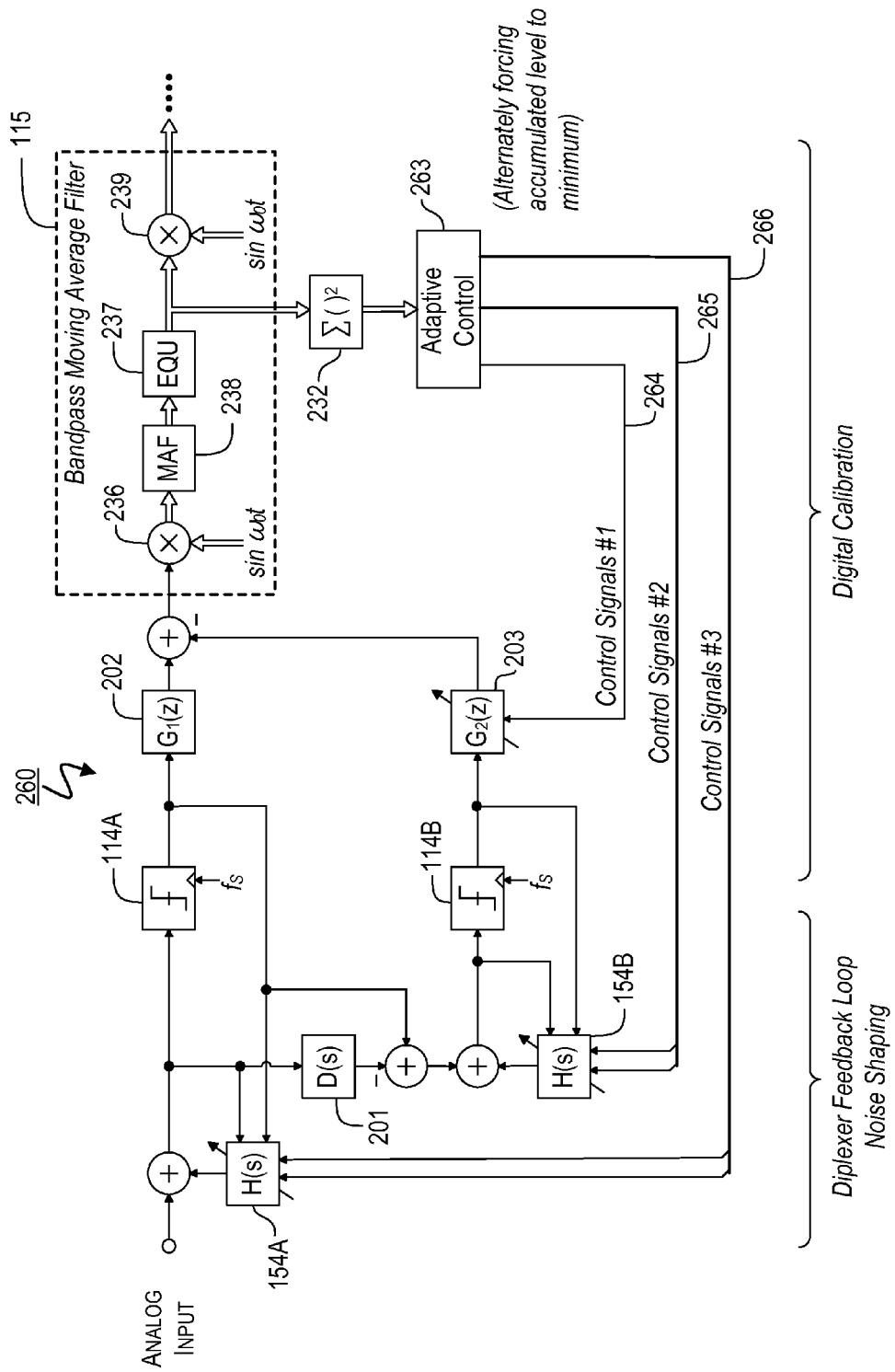

An exemplary coefficient calibration (i.e., tuning) circuit 230 is shown in FIG. 12A for single-stage noise shaping, and an exemplary circuit 260 is shown in FIG. 12B for multi-stage noise shaping. Because the quantization noise of the DFL is additive with respect to the input signal, the level at the output of the moving average filter 238 (MAF) is proportional to the level of added quantization noise. When the DFL response is properly tuned, such that the fine tuning parameters $\phi_i$ produce a quantization noise null at the correct frequency (i.e., the downconversion frequency, or center frequency of the BMA filter response), the added quantization noise is at a minimum. By sensing the power at the moving average filter (MAF) output, using a square law operation 232 (as shown in FIGS. 12A&B) or an absolute value operation, it is possible to adjust the DFL fine tuning parameters $\phi_i$ using, e.g., an algorithm that employs joint optimization, decision-directed feedback, gradient descent, and/or least squared error (LSE) principles within processing block 233 in circuit 230, or processing block 263 in circuit 260, until the level at the MAF output is forced to a minimum. With respect to circuit 230, based on the level at the MAF output (e.g., as determined in block 232), the algorithm generates control signal(s) 235 that correct for errors in the DFL response using fine tuning parameters $\phi_i$. With respect to circuit 260, based on the level at the MAF output (e.g., as determined in block 232), the algorithm generates control signals 265 and 266 that correct for errors in the response of each DFL (154A and 154B), and generates control signal 264 that adjusts the response of filter 203 to compensate for feedback loop gain errors in the first stage of the noise shaping circuit (i.e., the stage that includes blocks 114A and 154A). Because the noise shaping circuit topology depends on the sign of fine tuning parameter $\phi_1$, e.g., as illustrated in FIGS. 9A&C, the preferred calibration approach is one where the coarse location of $f_{notch}$ is set intentionally low or high, using filter parameters $T_i$ and $\beta_i$, such that the noise-shaped response can be fine tuned with strictly positive or negative values of $\phi_1$.

In some applications, such as those where the notch frequencies ($f_{notch}$) of each DFL are user-programmable for multi-mode operation (as discussed in more detail in the Overall Converter Considerations section), it can be beneficial to allow the fine tuning parameters $\phi_i$ to tune $f_{notch}$ across as much of the overall $\frac{1}{2} \cdot f_S$ converter bandwidth as possible. This also permits a single DFL circuit to be replicated multiple times in the multi-channel converter assembly, which can have manufacturing and other benefits. For these reasons, the coarse tuning elements $\beta_i$ and $T_i$ preferably are fixed such that the bandwidths $f_{3\ dB}$ of the diplexer low-pass responses $W_{ij}(s)$ are greater than $\frac{1}{2} \cdot f_S$, and such that the group delays D associated with the diplexer low-pass responses are $Dw_{00}=T_S$, $Dw_{01}=2 \cdot T_S$, $Dw_{10}=\frac{1}{2} \cdot T_S - \tau_{PD}$, and $Dw_{11}=3/2 \cdot T_S - \tau_{PD}$, where $\tau_{PD}$ is the extra transport delay of the sampler/quantizer (i.e., delay in excess of the sampler/quantizer zero-order hold response group delay). Under these conditions, varying the DFL fine-tuning parameter $\phi_1$ over a range of −2 to +2 places the notch frequency $f_{notch}$ of the DFL quantization noise transfer function (NTF) at arbitrary locations across the overall data converter bandwidth, and the DFL signal transfer function (STF) is approximately all-pass across the bandwidth of the respective MBO processing branch. Furthermore, the DFL fine-tuning parameter $\phi_0$ can be varied to maximize the depth of the null in the DFL quantization noise transfer function (NTF), a condition that occurs when the overall insertion gain/loss of the first diplexer filter response (i.e., the convolution of filter $H_1(s)$ 154A with filter $H_3(5)$ 154C in the present embodiment) is unity at the NTF notch frequency ($f_{notch}$).

The required accuracy of $f_{notch}$ depends on the intended resolution of the data converter, which is commonly specified in terms of effective number of bits, B. For example, an oversampled converter with M branches having quantization noise responses $NTF_1$, has a resolution of $$B = -\frac{1}{2} \cdot \log_2 \sum_{i=1}^{M} \left( \int_0^{f_S/2} |NTF_i(e^{2\pi jfT}, P) \cdot F_i(e^{2\pi jfT})|^2 df \right),$$

where $F_i(e^{2\pi jfT})$ are the frequency responses of the Bandpass Moving Average (BMA) reconstruction filters. Differentiation of the above equation with respect to the DFL parameters (e.g., $T_1, T_2, T_3, T_4, \phi_0, \phi_1, \beta_0, \beta_1,$ and $\beta_2$, for the exemplary embodiment discussed above) provides the mathematical relationship between converter resolution and filter parameter accuracy.

The resolution of the converter improves rapidly as DFL parameter accuracy improves to better than ±1%. Data converter applications targeting effective resolution of 10 bits or more preferably have DFL parameter tolerances of better than ±0.1% ($\sim \frac{1}{2}^9 \cdot 100\%$). On the other hand, data converter applications targeting less effective resolution can accommodate larger tolerances. For example, tolerances of ±3% usually are sufficient for data converter applications targeting effective resolution of 5 bits or less. Although electronic components can be manufactured to accuracies of ±1% or better, use of a variable attenuator or variable-gain amplifier allows the DFL fine tuning parameters, $\phi_i$, to be dynamically adjusted, or adjusted based on manufacturing trim operations.

In general, M noise shaping DFLs produce M quantization noise response nulls at frequencies spaced across the Nyquist ($\frac{1}{2} \cdot f_S$ or 0.5 of the normalized frequency) bandwidth of the converter. A converter 100 consisting of M processing branches sometimes is described herein as having a frequency-interleaving factor of M, or an interleaved oversampling ratio of M. Unlike conventional oversampling converters (i.e., as described by Galton and Beydoun), where the conversion accuracy is primarily, or significantly, a function of an excess-rate oversampling ratio (N), defined as the ratio between the converter sample/clock rate and the converter output signal bandwidth ($\frac{1}{2} \cdot f_S/f_B$), the conversion accuracy of the MBO converter primarily depends on the interleave factor (M). The MBO converter performance is less dependent on the traditional excess-rate oversampling ratio N, because N is preferably kept low (preferably, less than 4 and, more preferably, 1) and M is preferably substantially higher than N (e.g., at least $2 \cdot N$ or at least $4 \cdot N$). For the MBO converter, it still is appropriate to refer to an "effective" oversampling ratio, which is defined as M×N. It is noted that this effective oversampling ratio is different than the effective resolution of the converter 100, which also depends on the quality of the noise shaping and reconstruction filters employed. Because the effective oversampling ratio of the MBO converter 100 directly depends on the number of converter processing branches (i.e., the frequency interleave factor), the effective oversampling ratio can be increased, without increasing the converter sample rate clock, by using additional processing branches (or noise shaping DFL circuits).

As discussed above, the notch frequency ($f_{notch}$) the DFL response is coarsely determined by a delay parameter, $T_1$, in conjunction with associated parameters $\beta_i$. Increasing the coarse tuning parameter $T_1$, relative to the sampling rate period ($1/f_S$), generally has the consequence of reducing the effective order of the DFL circuit's quantization noise-shaped response. Similarly, decreasing the coarse tuning parameter $T_1$, relative to the sampling rate period ($1/f_S$), generally has the consequence of increasing the effective order of the DFL's quantization noise-shaped response. For this reason, in representative embodiments of the invention, it is sometimes preferable for the M quantization noise response nulls to be at frequencies ($f_{notch}$) that are not uniformly spaced across the (signal) bandwidth of the converter. In contrast, quantization noise nulls are spaced evenly across the converter bandwidth in conventional ΠΔΣ and MBΔΣ converters.

Bandpass (Signal Reconstruction) Filter Considerations

The primary considerations for the bandpass filters used in MBO signal reconstruction according to the preferred embodiments of the present invention are: (1) design complexity (preferably expressed in terms of required multiplications and additions), (2) frequency response (particularly stopband attenuation), (3) amplitude and phase distortion, and (4) latency. The best converter-resolution performance is obtained for quantization noise-reduction filters (i.e., reconstruction filters) having frequency responses that exhibit high stopband attenuation, which generally increases with increasing filter order. In addition, it is preferable for the filter responses to have suitable (e.g., perfect or near-perfect) signal-reconstruction properties to prevent performance degradation due to intermodulation distortion and/or amplitude and phase distortion. For example, it can be shown that the decimating sinc$^{P+1}$ (comb) filter responses that conventionally have been considered near-optimal in oversampling converters and are used in ΠΔΣ conversion (e.g., as in Galton), do not in fact exhibit the near-perfect reconstruction filter bank properties that are preferred in parallel oversampling converters with many processing branches (e.g., M>8). Filter distortion is a particularly important consideration because, unlike quantization noise, filter distortion levels do not improve as filter order increases or as the number of parallel-processing branches M increases. Therefore, filter distortion prevents converter resolution from improving with increasing filter order or with increasing M. Also, although stopband attenuation generally increases with filter order, increases in filter order result in greater processing latency, especially for transversal, finite-impulse-response (FIR) filters. Bandpass filters with low latency are preferred to support applications where latency can be a concern, such as those involving control systems and servo mechanisms.

The conventional signal-reconstruction methods used in ΠΔΣ converters (such as in Galton) and in MBΔΣ converters (such as in Aziz and Beydoun) are not suitable for the present MBO converters because they: (1) introduce unacceptable levels of intermodulation distortion (i.e., the ΠΔΣ scheme where low-pass ΔΣ modulators are used in conjunction with Hadamard sequences for frequency translation); (2) they produce unacceptable amounts of amplitude and phase distortion (e.g., the conventional sinc$^{P+1}$ filters used in ΠΔΣ) that cannot be mitigated by increasing the number of parallel processing branches (M); and/or (3) they entail a degree of signal-processing complexity that can be a problem for converters with a large number of processing branches (e.g., the conventional Hann FIR filters and FIR filter banks used in MBΔΣ). For these reasons, signal reconstruction in the MBO converter preferably is based on an innovation described herein as Bandpass Moving Average (BMA) signal reconstruction, which can result in: (1) high levels of stopband (i.e., quantization noise) attenuation, (2) negligible intermodulation distortion, (3) insignificant amplitude and phase distortion, and (4) significantly lower complexity than conventional approaches.

The desired bandpass filter frequency response preferably depends on the intended resolution of the converter (B), on the order of the noise-shaped transfer function (P), and on the effective oversampling ratio of the converter (M×N). For an oversampling converter with M processing branches, $$B = -\frac{1}{2} \cdot \log_2\left[\sum_{i=1}^{M}\left(\int_0^{f_s/2} |NTF_i(e^{2\pi jfT}, P) \cdot F_i(e^{2\pi jfT})|^2 df\right)\right]$$

where $NTF_i(e^{2\pi jfT}, P)$ are noise-shaped transfer functions of order P, where $F_i(e^{2\pi jfT})$ are the frequency responses of the digital bandpass (signal reconstruction) filters, and where the square-bracketed term in the above equation represents an overall level of quantization noise attenuation. In addition, for near-perfect signal reconstruction, the digital bandpass filter bank preferably introduces negligible or no amplitude and phase distortion. Near-perfect signal reconstruction preferably requires that:

$$\sum_{i=1}^{M} F_i(z) = k \cdot z^{-n}, \text{ for } k = \text{constant (i.e., strictly complementary)}$$

$$\sum_{i=1}^{M} |F_i(e^{2\pi jfT})|^2 = \text{constant (i.e., power complementary)}$$

$$\sum_{i=1}^{M} F_i(z) = A(z), \text{ for } A(z) \to \text{all-pass (i.e., all-pass complementary)}$$

To the extent that the digital reconstruction filter bank introduces appreciable amplitude and phase distortion, the minimum signal-to-distortion power ratio (SDR) of the filter bank preferably depends on the intended effective resolution (B) of the converter, and is approximately given by SDR≧6 B, or 6 dB per bit.

Figure 13A:
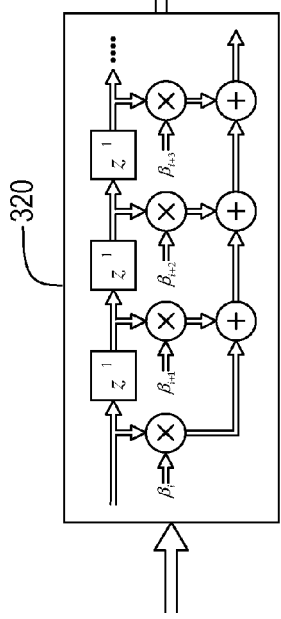
FIG. 13A is a block diagram illustrating a conventional structure for implementing a bandpass, signal-reconstruction filtering using a digital (e.g., Hann) bandpass finite-impulse-response (FIR) filter.

For high-resolution converter applications (e.g., requiring up to 10 bits of conversion accuracy), the present inventor has discovered that conventional FIR filter banks, such as those used in MBΔΣ (such as in Aziz) converters and the FIR window filters (i.e., Hann filters) described by Beydoun, have suitable quantization noise attenuation and signal-reconstruction properties for one-sided bandwidths of ½·f$_s$/(N·M) and impulse-response lengths of 4·N·M, or potentially 30% less than that as described in Beydoun (i.e., length 256 filter with N=10 and M=8). Conventionally, it is well-understood that bandpass responses for digital signal reconstruction filter banks can be devised (such as in Aziz and Beydoun) using a two-step process. First, conventional techniques, such as the Parks-McClellan algorithm and window-based methods, are used to design a low-pass FIR filter response with suitable signal reconstruction properties (i.e., prototype filter); and if necessary, the prototype response is refined using iterative routines, spectral factorization, or constrained optimization techniques. Next, a low-pass to bandpass transformation is performed via multiplication of the prototype filter coefficients by a cosine wave having a frequency equal to the desired center frequency ($\omega_0$) of the bandpass filter (i.e., cosine-modulated filter banks). The result is a transversal FIR bandpass filter 320, such as that illustrated in FIG. 13A, that performs bandpass filtering by a direct means. The present inventor has determined that a 256-tap transversal FIR prototype design based on a Hann window (i.e., Beydoun), ensures greater than 62 decibels (dB) of quantization noise attenuation (i.e., 10-bit resolution), with negligible amplitude and phase distortion, for fourth-order noise shaping and an oversampling ratio of N×M=10×8=80.

Figure 13B:
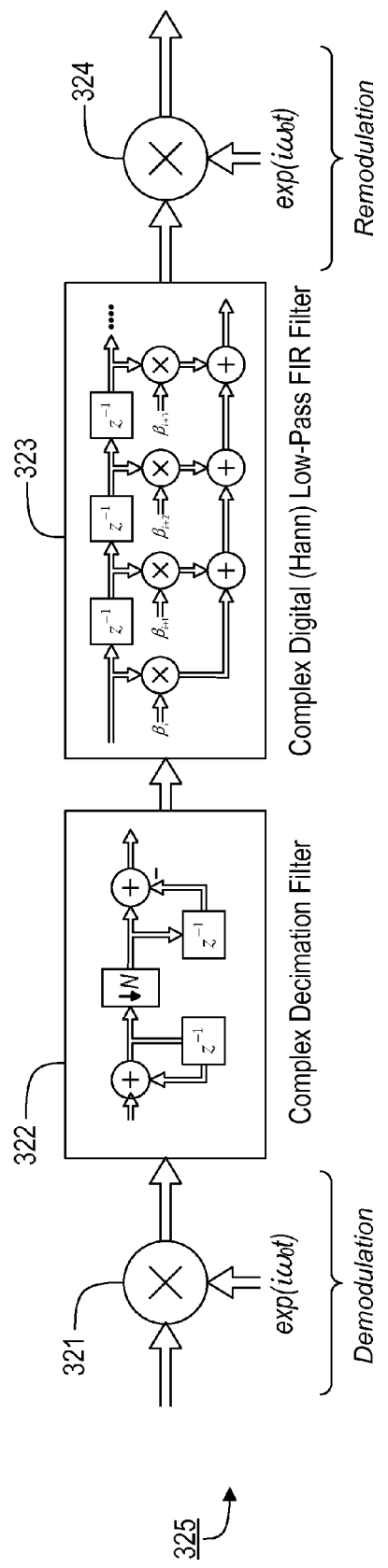
FIG. 13B is a block diagram illustrating a conventional structure for bandpass, signal-reconstruction filtering using: (a) digital demodulation, (b) decimation, (c) complex digital (e.g., Hann) low-pass FIR filtering, and (d) remodulation.
Figure 13C:
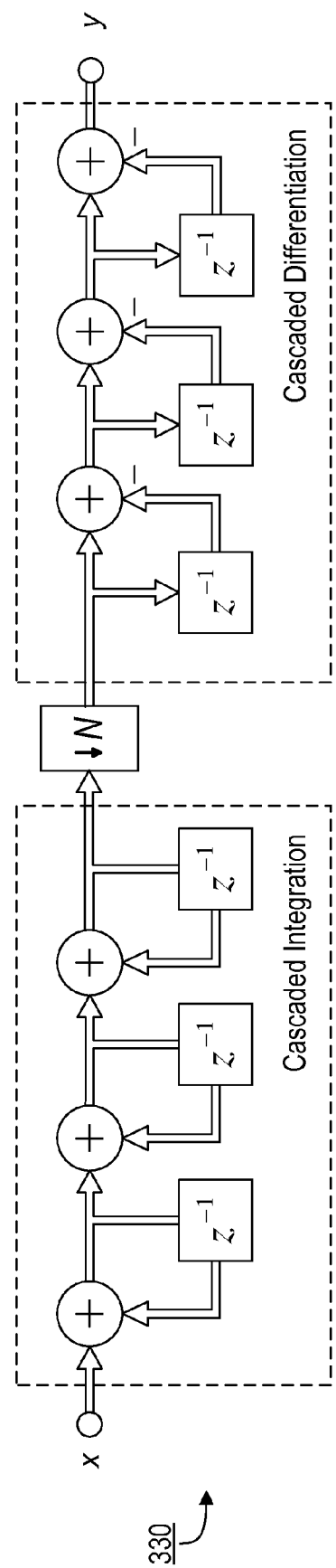
FIG. 13C is a block diagram illustrating a conventional structure for low-pass, signal reconstruction using a cascaded-integrator, digital comb (i.e., $\text{sinc}^3$) filter with decimation by N.

However, the present inventor has discovered that the performance of conventional, bandpass filter banks is realized at the expense of very high complexity, as these transversal filters require up to 2·M multiplications and 4·M additions per processing branch. Generally (as described in Beydoun), a small reduction in filter complexity is realized for MBΔΣ converters with an excess-rate oversampling ratio N>1 when, as shown in FIG. 13B, such bandpass filters 320 are implemented using an indirect method involving four steps: (1) downconversion 321 (i.e., demodulation) using exponential sequences to shift the applicable band (having a center frequency of $\omega_0$) to a center frequency of zero, (2) decimation 322 (i.e., by the excess-rate oversampling ratio N), (3) low-pass filtering 323 with the prototype FIR response (i.e., Hann window filter), and (4) upconversion 324 (i.e., remodulation) to shift the applicable band back to its original frequency range. The latter, indirect method potentially reduces the complexity of the signal reconstruction process by reducing the data rates associated with the digital window (e.g., Hann) FIR filters, but is only advantageous for N>>1 (i.e., Beydoun).

Compared to conventional FIR filter banks, the present inventor has discovered that conventional comb filters offer a much lower complexity signal-reconstruction alternative, because conventional comb filters are recursive structures that require no multiplication operations. For example, a conventional two-factor comb filter has transfer function $$C_2(z) = \left(\frac{1-z^{-J_1}}{1-z^{-1}}\right)^{p_1} \cdot \left(\frac{1-z^{-J_2}}{1-z^{-1}}\right)^{p_2},$$

where $J_2=J_1+1$, $p_1+p_2=P+1$, and P is the order of the delta-sigma modulator noise-shaped response (i.e., Galton). Conventional comb (i.e., $\text{sinc}^{P+1}$) filters are also implemented using a simpler, single-factor transfer function of the form $$C_1(z) = \left(\frac{1-z^{-kN}}{1-z^{-1}}\right)^{P+1},$$

where k·N is the effective oversampling ratio of the converter (i.e., k=M). This single-factor form has frequency response nulls at multiples of the output data rate, which conventionally has been considered near-optimal for oversampling converters in general. Conventionally (i.e., ΠΔΣ ADC), comb filter banks are used in conjunction with low-pass ΔΣ modulators, where the required analog downconversion operation is based on Hadamard sequences that are rich in harmonic content. A consequence of this rich harmonic content is intermodulation distortion (i.e., related to harmonic intermodulation products) that degrades signal reconstruction quality. In addition, the present inventor has discovered that, unlike conventional FIR filter banks, conventional comb filter banks introduce appreciable amplitude and phase distortion.

Examples are the conventional two-factor comb filters $C_2(z)$ that have been devised for ΠΔΣ converters (i.e., Galton). For ΠΔΣ converters with effective oversampling ratio N×M=1×16=16 and sixth-order noise shaping (P=6), a two-factor comb filter having $J_1=19$, $J_2=20$, $p_1=3$, and $p_2=4$ has been devised. Compared to conventional FIR filter banks, the present inventor has determined that such a comb filter realizes a nearly equal quantization noise attenuation level of 61 dB (i.e., ~10-bit resolution), but achieves a much lower signal-to-distortion power ratio (SDR) of 16 dB (i.e., <3-bit resolution). Furthermore, the two-factor comb filter $C_2(z)$ conceived for ΠΔΣ conversion with effective oversampling ratio N×M=10×4=40 and fourth-order noise shaping (P=4), has $J_1=50$, $J_2=51$, $p_1=3$, and $p_2=2$. The present inventor has ascertained that this second filter attenuates quantization noise by more than 59 dB (i.e., ~10-bit resolution), but with an SDR of only 2 dB (i.e., ~½-bit resolution). In addition, the present inventor has determined that for a ΠΔΣ converter with the same 40-times oversampling ratio, a conventional $\text{sinc}^{P+1}$ filter of single-factor form (i.e., $C_1(z)$ with k=M) offers an improved SDR of 24 dB (i.e., 6-bit resolution), but the penalty is a lower quantization noise attenuation level of 54 dB (i.e., ~9-bit resolution). Therefore, with SDR levels reaching only 24 dB, the demonstrated signal reconstruction properties of conventional comb ($\text{sinc}^{P+1}$) filter responses are inadequate for high-resolution (i.e., 10 bits or greater), oversampling converters with many parallel processing branches (i.e., M>8). Consequently, to overcome the SDR limitations of conventional comb filters, especially two-factor comb filters that exhibit high levels of quantization noise attenuation, relatively complex output equalizers (e.g., Galton) are employed in conventional ΠΔΣ oversampling converters to reduce the amplitude and phase distortion that otherwise limits converter resolution to about 6 bits. These output equalizers, however, increase circuit complexity and cannot perfectly eliminate the amplitude and phase distortion of the comb filter bank because they conventionally require FIR approximations to what are non-causal IIR responses (e.g., as described by Galton).

Apparently not understood by Beydoun, the present inventor has discovered that recursive window filters are a better alternative to conventional, transversal FIR filter banks (and comb filters), because recursive window filters exhibit equivalent properties to transversal window filters, but typically can be implemented more efficiently (i.e., with fewer adds and multiplies). For example, consider a low-pass prototype filter with impulse response $$h_{win}(n) = a_0 - a_1 \cdot \cos\left(\frac{2\pi n}{L-1}\right) + a_2 \cdot \cos\left(\frac{4\pi n}{L-1}\right) - a_3 \cdot \cos\left(\frac{6\pi n}{L-1}\right),$$

where $a_0=0.35875$, $a_1=0.48829$, $a_2=0.14128$, $a_3=0.01168$, and L=4·(N·M−1). This filter, which is defined in the prior art as a Blackman-Harris window filter (a similar structure exists for the Hann window), realizes signal-to-distortion power ratios of greater than 84 dB (i.e., 14-bit resolution) and provides greater than 59 decibels (dB) of quantization noise attenuation (i.e., ~10-bit resolution), for fourth-order noise shaping and 64 processing branches (M). As significantly, this filter has a recursive transfer function equal to $$T_{win}(z) = a_0 \cdot \frac{1-z^{-L}}{1-z^{-1}} - \sum_{i=1}^{3} a_i \cdot \frac{\left[1-\cos\left(\frac{2\pi i}{L-1}\right)\right] \cdot (z^{-1}+z^{-L}) + z^{-(L+1)}}{1 - 2\cdot\cos\left(\frac{2\pi i}{L-1}\right) \cdot z^{-1} + z^{-2}},$$

which requires only 10 multiply operations for low-pass filtering, regardless of the filter impulse response length L. Additional multiplication operations are required for transforming the low-pass prototype response to a bandpass response, using downconversion followed by upconversion, but the recursive window filters still represent a considerable complexity savings over the transversal FIR approach described by Beydoun. However, the present inventor has discovered that when recursive window filters of this form are implemented using high-frequency, parallel-processing methods, such as polyphase decomposition, the complexity costs associated with coefficient dynamic range expansion can exceed any complexity savings afforded by the recursive structure.

A preferable alternative to conventional signal reconstruction methods and recursive window filters is an innovation referred to herein as Bandpass Moving Average (BMA) signal reconstruction. The BMA filter bank method features high stopband attenuation and negligible amplitude and phase distortion, in conjunction with low complexity. Conventional comb, or $\text{sinc}^{P+1}$, filters (i.e., Galton) can be considered a subset of a more general class of low-pass filters that can be called cascaded moving average filters. The present inventor has discovered that although conventional comb filter banks do not exhibit near-perfect signal reconstruction properties, certain types of cascaded moving average filters (MAF) do exhibit near-perfect signal reconstruction properties. These moving average filters are similar to conventional comb filters, except that: (1) the overall filter order is not constrained to be P+1, (2) the $J_1$ and $J_2$ parameters of the two-factor form $C_2(z)$ are not constrained to the relationship $J_2=J_1+1$, and (3) the k·M product of the single-factor form $C_1(z)$ is not constrained to equal N·M, the effective oversampling ratio of the converter (i.e., the filter frequency response is not constrained to have nulls at multiples of the output data rate). By removing the constraints that are conventionally placed on $\Pi\Delta\Sigma$ comb filters, the present inventor has been able to devise recursive, moving average prototype responses that have near-perfect reconstruction properties and are suitable for signal reconstruction in MBO converters that have many parallel processing branches.

Figure 14A:
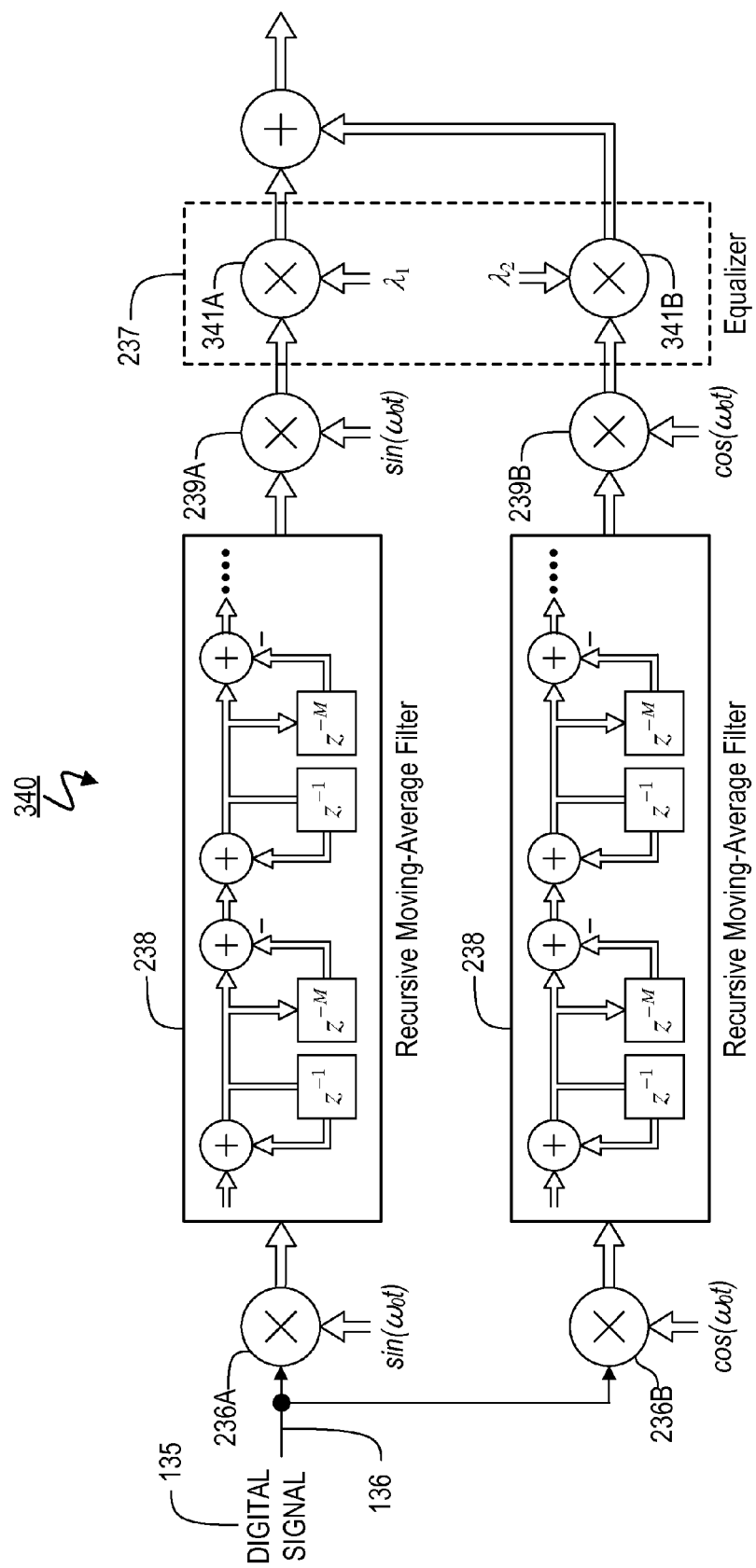
FIG. 14A is a block diagram of a Bandpass Moving Average (BMA) signal-reconstruction filter according to a representative embodiment of the invention that includes a single, complex tap equalizer and recursive moving average filters with quadrature frequency conversion.

A block diagram of an exemplary BMA filter 340 is given in FIG. 14A. As FIG. 14A illustrates, a BMA filter according to the present embodiment of the invention consists of: (1) a quadrature downconverter (i.e., dual multipliers 236A&B) that uses sine and cosine sequences to shift the band of the input digital signal 135 from a center frequency of $\omega_0$ (i.e., the center frequency of the associated MBO processing branch) to a center frequency of zero; (2) a cascaded moving average filter 238 (MAF) array that preferably attenuates quantization noise without introducing appreciable amplitude or phase distortion using operations comprising only adders and delay registers (i.e., no multipliers); (3) a complex single-tap equalizer 237 (i.e., dual multiplier) that applies an amplitude and/or phase correction factor to the output of the moving average filter 238 (i.e., via scalar coefficients $\lambda_1$ and $\lambda_2$); and (4) a quadrature upconverter (i.e., dual multipliers 239A&B) that uses sine and cosine sequences to shift the equalizer 237 output from a center frequency of zero back to a center frequency of $\omega_0$ (i.e., the original center frequency of the associated MBO processing branch). BMA 340 introduces negligible intermodulation distortion and negligible amplitude and phase distortion by combining cascaded moving average filters 238 having near-perfect reconstruction properties, with sinusoid-based quadrature downconversion 236A&B and upconversion 239A&B operations for transforming prototype BMA 340 low-pass responses to bandpass responses (i.e., as opposed to the Hadamard conversion described in Galton for $\Pi\Delta\Sigma$). Furthermore, these low-complexity BMA 340 filter structures do not require separate decimation filters 322 (as described by Beydoun).

Figure 14B:
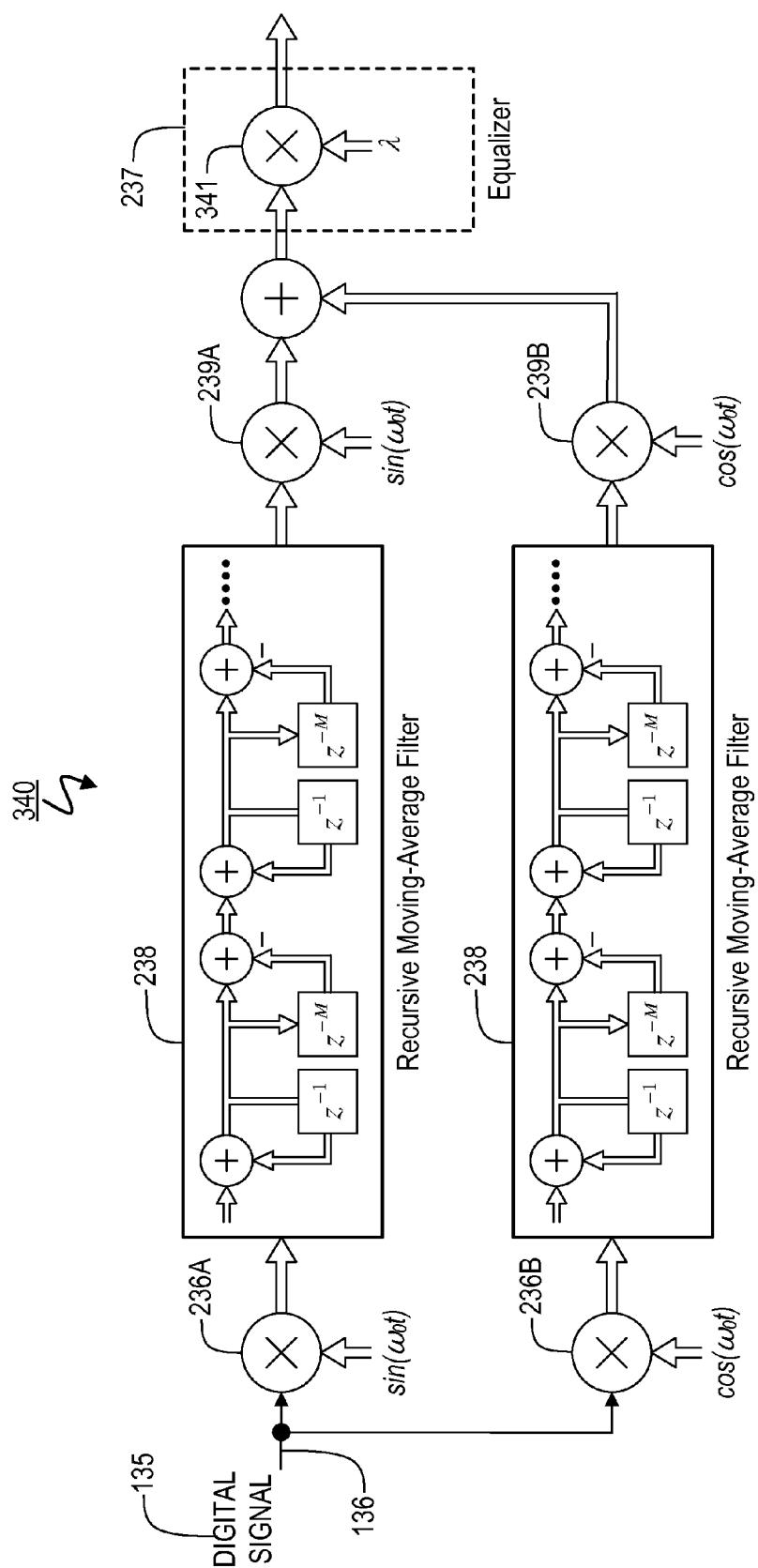
FIG. 14B is a block diagram of a Bandpass Moving Average (BMA) signal reconstruction filter according to a representative embodiment of the invention that includes a single, real tap equalizer and recursive moving average filters with quadrature frequency conversion.

The BMA equalizer 237, shown as a complex single tap filter in FIG. 14A and alternatively as a real single tap filter in FIG. 14B, corrects for phase and/or amplitude (i.e., gain) offsets that may occur among the various MBO parallel processing branches due to: (1) analog component tolerances and (2) DFL signal transfer functions (STF) that deviate from an ideal all-pass response (i.e., the DFL STF is approximately all-pass, but not precisely all-pass, across the bandwidth of a given MBO processing branch). The degree to which the DFL STF deviates from an ideal all-pass response is directly related to the bandwidth of a given MBO processing branch. When all the MBO branches have equal processing bandwidth (i.e., uniform spacing of processing branch center frequencies), the bandwidth of each MBO processing branch is given by $f_S/(N\cdot M)$, where $f_S$ is the converter sample rate, N is the converter excess-rate oversampling ratio, and M is the converter interleave factor. A single tap equalizer adds little additional complexity to the BMA 340 filter (i.e., one or two multipliers), and therefore, is preferable for large interleave factors, such as for $M\geq50$, because relatively narrow MBO processing branch bandwidths result in DFL STFs that deviate little from an ideal all-pass response. However, the added complexity of multi-tap equalizers (i.e., implemented as transversal or recursive structures) is preferable for small interleave factors, such as for $M\leq10$, because wider MBO processing branch bandwidths result in DFL STFs that exhibit greater deviation from an ideal all-pass response. As will be readily appreciated, the BMA equalizer 237 can be moved upstream of the moving-moving average filter 328, and/or any portion or all of the equalizer 237 desired transfer function can be moved upstream of the moving average filter 328, without affecting the overall transfer function of BMA filter 340.

The moving average prototype filters 238 utilized in the Bandpass Moving Average (BMA) signal reconstruction method preferably have the general transfer function $$F(z) = \prod_{i=0}^{R-1} \left( \frac{1 - z^{-2NM/K_i}}{1 - z^{-1}} \right)^{p_i},$$

where filter parameters R, $K_i$ and $p_i$ are integers, and the exponent $-2\cdot N\cdot M/K_i$ is also an integer. The complexity of the prototype moving average filter increases as the number of cascaded stages S increases, and therefore, S which is given by:

$$S = \sum_{i=0}^{R-1} p_i,$$

is preferably small, e.g., $S\leq3$. The quantization noise attenuation ($A_{QN}$) of the BMA filter bank increases with increasing prototype filter impulse response length, L, given by $$L = 1 + \sum_{i=0}^{R-1} p_i \cdot (2NM/K_i - 1).$$

The amplitude and phase distortion introduced by the BMA filter bank is minimized (i.e., maximum SDR) for prototype filter impulse responses of length $L\leq4\cdot N\cdot M-1$, where as before, M is the MBO converter interleave factor and N is the MBO converter excess-rate oversampling ratio, preferably such that $N<<M$. Thus, for maximum converter resolution, the prototype filter parameters R, $K_i$ and $p_i$ preferably result in a prototype filter of length $L=4\cdot N\cdot M-1$, or as close to that as possible. However, filter quantization noise attenuation ($A_{QN}$) is not a one-to-one function of L, as illustrated by the results in Table 2, which gives $A_{QN}$ and SDR for exemplary prototype moving average filter responses with M=64. Specifically, some L-length prototype moving average filters realize greater quantization noise attenuation than other L-length prototype moving average filters. More preferably, therefore, the three BMA prototype filter parameters are optimized, for example using trial-and-error or a conventional constrained optimization method, such that both signal-to-distortion ratio (SDR) and quantization noise attenuation ($A_{QN}$) meet the minimum levels needed to achieve a specified MBO converter resolution (e.g., both SDR and $A_{QN}$ preferably exceeding ~60 dB for 10-bit resolution).

TABLE 2

Exemplary Prototype Responses for Bandpass Moving Average Signal Reconstruction (N = 1, M = 64)

| Prototype Transfer Function | Filter Length (L) | P = 2 | | P = 4 | |
|---|---|---|---|---|---|
| | | $A_{QN}$ (dB) | SDR (dB) | $A_{QN}$ (dB) | SDR (dB) |
| $F(z) = \left(\frac{1-z^{-NM}}{1-z^{-1}}\right)^4$ | 4NM − 3 | 35 | 105 | 60 | 105 |
| $F(z) = \left(\frac{1-z^{-NM}}{1-z^{-1}}\right)^3 \left(\frac{1-z^{-NM/2}}{1-z^{-1}}\right)^2$ | 4NM − 4 | 34 | 129 | 59 | 129 |
| $F(z) = \left(\frac{1-z^{-NM}}{1-z^{-1}}\right)^3 \left(\frac{1-z^{-NM/4}}{1-z^{-1}}\right)^6$ | 9/2 NM − 8 | 34 | 76 | 58 | 76 |
| $F(z) = \left(\frac{1-z^{-2NM}}{1-z^{-1}}\right) \left(\frac{1-z^{-NM/2}}{1-z^{-1}}\right)^4$ | 4NM − 4 | 36 | 120 | 60 | 120 |
| $F(z) = \left(\frac{1-z^{-2NM}}{1-z^{-1}}\right) \left(\frac{1-z^{-NM}}{1-z^{-1}}\right)^2$ | 4NM − 2 | 38 | 72 | 64 | 72 |
| $F(z) = \left(\frac{1-z^{-NM}}{1-z^{-1}}\right)^3 \left(\frac{1-z^{-NM/2}}{1-z^{-1}}\right) \left(\frac{1-z^{-NM/4}}{1-z^{-1}}\right)^2$ | 4NM − 5 | 34 | 148 | 58 | 148 |
| $F(z) = \left(\frac{1-z^{-2NM}}{1-z^{-1}}\right) \left(\frac{1-z^{-NM/2}}{1-z^{-1}}\right)^3 \left(\frac{1-z^{-NM/4}}{1-z^{-1}}\right)^2$ | 4NM − 5 | 36 | 138 | 59 | 138 |
| $F(z) = \left(\frac{1-z^{-2NM}}{1-z^{-1}}\right) \left(\frac{1-z^{-NM}}{1-z^{-1}}\right) \left(\frac{1-z^{-NM/4}}{1-z^{-1}}\right)^4$ | 4NM − 5 | 37 | 132 | 62 | 132 |
| $F(z) = \left(\frac{1-z^{-2NM}}{1-z^{-1}}\right) \left(\frac{1-z^{-NM}}{1-z^{-1}}\right) \left(\frac{1-z^{-NM/2}}{1-z^{-1}}\right)^2$ | 4NM − 3 | 37 | 96 | 63 | 96 |

As Table 2 indicates, cascaded moving average prototype filters can realize quantization-noise-attenuation levels greater than 64 dB (i.e., ~11-bit resolution for P=4 and M=64) with negligible distortion (e.g., SDR up to 148 dB), thereby eliminating the need for the output equalizers that increase circuit complexity in ΠΔΣ ADCs. The result is that converter resolution with BMA signal reconstruction filter banks is generally limited by the quantization noise attenuation ($A_{QN}$) of the filter bank, which can be offset (i.e., to improve converter resolution) by one or more approaches: (1) increasing noise-shaped response order P, (2) increasing the number of parallel processing branches M, and/or (3) increasing the order (i.e., length) of the BMA prototype response. Conversely, converter resolution with conventional comb filter banks (i.e., ΠΔΣ ADC), is limited by signal-to-distortion ratio, which cannot be offset by any of the above three approaches. Consequently, the preferred embodiment of the MBO converter uses a Bandpass Moving Average (BMA) signal reconstruction method, instead of a conventional signal reconstruction scheme, because BMA reconstruction yields both the superior performance of conventional, transversal FIR filter banks and the low complexity of conventional comb filters, for large interleave factors (i.e., M>8). It should be noted that for converter applications that require less resolution (i.e., that can tolerate lower SDR), it is possible to increase the BMA prototype impulse response length L beyond the preferable 4·M·N−1 upper limit (e.g., see row 3 of Table 2). Also, it should be noted that for converter applications where low latency is critical, it can be advantageous to use filter lengths L that are much less than the preferable upper limit (i.e., since latency increases with increasing length L) at the expense of lower $A_{QN}$.

Besides exhibiting near-perfect reconstruction properties and realizing high levels of quantization noise attenuation, cascaded moving average prototype filters of the type given in Table 2 can be very low in complexity because they require no multiplication operations. For example, the 3-stage (i.e., S=3) prototype filter transfer function given by $$F(z) = \left(\frac{1-z^{-2NM}}{1-z^{-1}}\right)\left(\frac{1-z^{-NM}}{1-z^{-1}}\right)^2$$

Figure 14C:
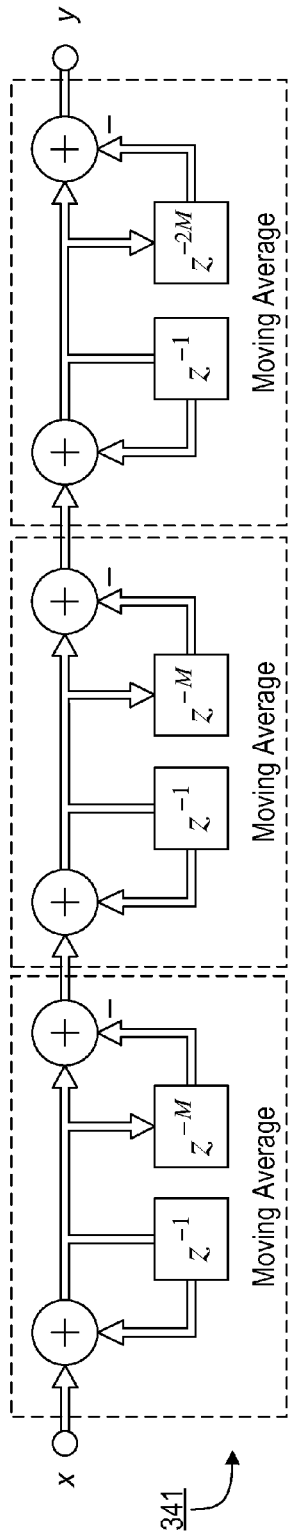
FIGS. 14C-E are block diagrams illustrating representative forms of recursive moving average prototype filters for BMA signal reconstruction.
Figure 14D:
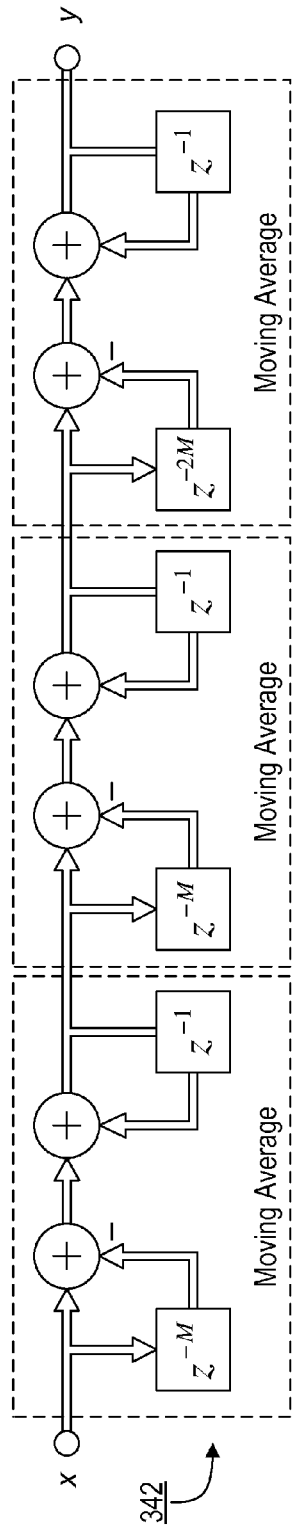
Figure 14E:
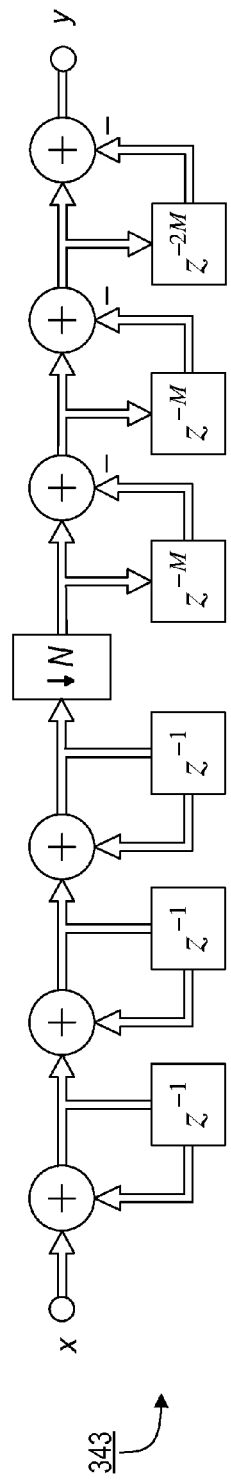

(see row 5 of Table 2) requires only 6 additions, independent of filter length (L=4·N·M−2), plus 4·M+3 registers, as illustrated by the exemplary moving average prototype filters 341-343 in FIGS. 14C-E. FIGS. 14C&D show exemplary moving average filter structures 341 in 342, respectively, for use with an excess-rate oversampling ratio of N=1, and FIG. 14E shows an exemplary moving average filter structure 343 for use with N>1. With these moving average prototype filters, the only multiplication operations required are those necessary for transforming low-pass responses to bandpass responses. Bandpass transformation based on quadrature downconversion and upconversion, as shown in FIGS. 14A&B, requires only 4 multiplies when direct digital synthesis (e.g., employing digital accumulators with sine/cosine lookup memories) is used to generate the sine ($x_n$) and cosine ($y_n$) sequences, shown in FIGS. 14A&B as $\cos(\omega_0 t)$ and $\sin(\omega_0 t)$, that are needed for the quadrature downconversion and upconversion operations. Alternatively, the sine ($x_n$) and cosine ($y_n$) sequences can be generated using CORDICs (i.e., COordinate Rotation DIgital Computer) or other recursive operations that require no lookup memory, such as those represented by the difference equations:

$x_n = -2\cos(\omega_0) \cdot x_{n-1} + x_{n-2}$ $y_n = -\sin(\omega_0) \cdot x_{n-1} - 2\cos(\omega_0) \cdot y_{n-1} + y_{n-2}$.

Although Bandpass Moving Average (BMA) signal reconstruction using cascaded moving average filter (MAF) prototypes, such as filters 341-343 described above, generally is preferred because such structures provide a substantial savings in computational complexity, particularly for interleave factors (M) greater than 8, the conventional, transversal FIR filter bank and transversal window filter approaches can provide equal or less complexity for small interleave factors.

Figure 15A:
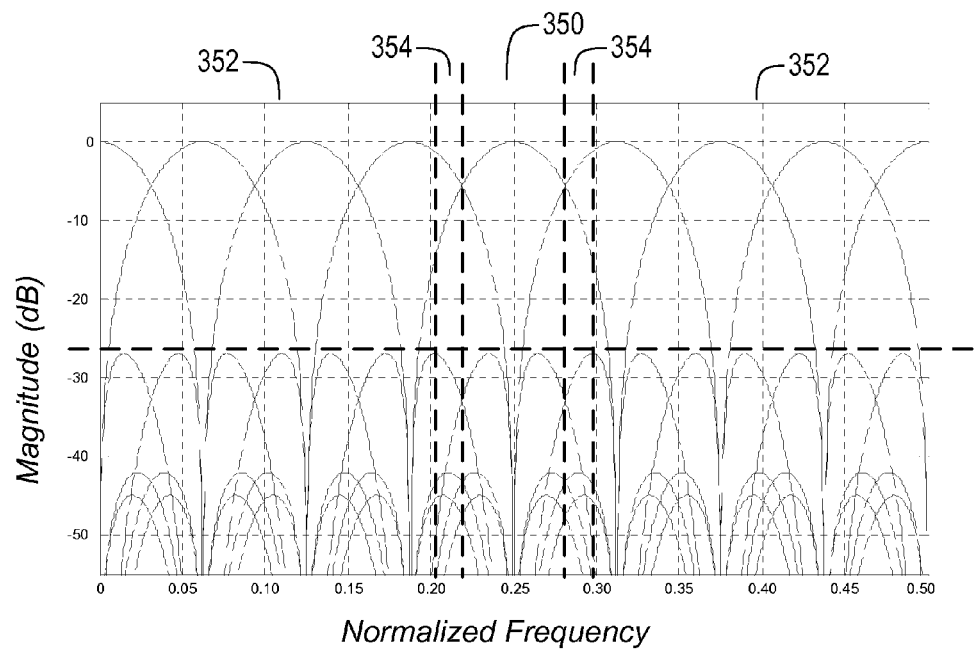
FIG. 15A illustrates frequency responses of a Bandpass Moving Average signal reconstruction filter bank used in a MBO converter according to a representative embodiment of the present invention.
Figure 15B:
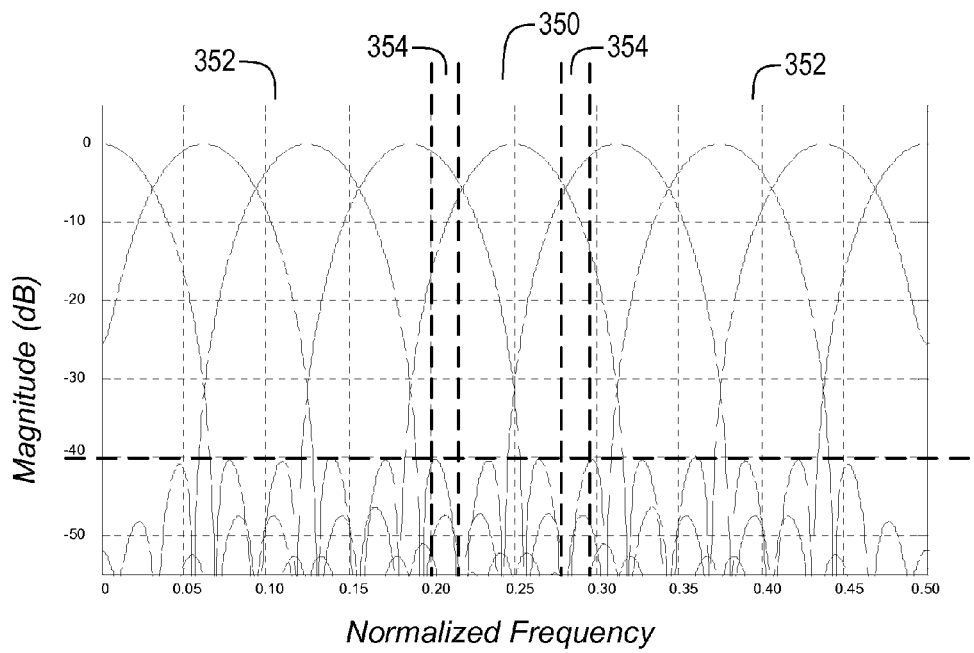
FIG. 15B illustrates the frequency responses of a conventional signal reconstruction FIR filter bank based on a Kaiser window function.

For an interleave factor of M=9, the frequency response of a Bandpass Moving Average (BMA) signal reconstruction filter bank is shown in FIG. 15A, based on moving average filters 341-343 described above (i.e., row 5 in Table 2) for evenly-spaced (i.e., uniformly-spaced) center frequencies, and after accounting for the frequency translation effects of the downconversion and upconversion processes. Each of these bandpass filters includes a passband region 350, stopband regions 352 in which all frequencies are suppressed with an attenuation of at least 25 dB (resulting in a quantization noise attenuation of 64 dB for fourth-order noise shaping and M=64), and transition regions 354 between the passband region 350 and the stopband regions 352. For the filters centered at zero frequency and $\frac{1}{2} \cdot f_S$, the transition regions 354 together occupy only approximately the same bandwidth as the passband region 350. For all filters other than the one centered at zero frequency and $\frac{1}{2} \cdot f_S$, the transition regions 354 together only occupy approximately half of the bandwidth of the passband region 350. In addition, the amplitude and phase distortion of such a filter bank are negligible compared to a bank of filters that does not exhibit near-perfect reconstruction properties (e.g., $\mathrm{sinc}^{P+1}$ filters). For comparison, the frequency response of a conventional FIR filter bank (i.e., Kaiser window prototype with $\beta=3$) system is shown in FIG. 15B for M=9.

As discussed in the Noise Shaping Filter Considerations section, a representative embodiment of the invention can employ multiple processing branches (M) where, due to the dependence of the noise shaping filter response on the coarse tuning (delay) parameter ($T_1$), the quantization noise notch frequencies ($f_{notch}$) are not uniformly spaced and the orders (P) of the quantization noise-shaped responses are not the same across the converter processing branches. In this representative embodiment of the invention, it is preferable that the BMA reconstruction filter center frequencies and bandwidths are also non-uniform, but rather that center frequencies are aligned with the notch frequencies ($f_{notch}$) and bandwidths are dependent upon the noise shaping orders (P) of the DFLs in the respective processing branches. For DFLs with relatively higher order noise-shaped responses (i.e., lower $T_1$ relative to $1/f_S$), it is preferable for the BMA reconstruction filters to have wider (preferably proportionally wider) bandwidths. Conversely, for DFLs with relatively lower order noise-shaped responses (i.e., higher $T_1$ relative to $1/f_S$), it is preferable for the BMA reconstruction filters to have narrower (preferably proportionally narrower) bandwidths. Under these non-uniform conditions, it still is possible to realize near-perfect signal reconstruction using the BMA method.

In applications involving very high conversion rates, multirate filter structures based on polyphase decomposition can significantly reduce the clock speeds at which the BMA circuitry (e.g., digital multipliers and adders) operates. For example, consider a moving average operation with transfer function $$T_{mAvg}(z) = \frac{1 - z^{-N}}{1 - z^{-1}}$$

The above moving average operation can be represented by the difference equation $y_n = x_n - x_{n-N} + y_{n-1}$.

and therefore, the difference equations for the first two output samples (i.e., n=1, 2) are $y_2 = x_2 - x_{2-N} + y_1$ and $y_1 = x_1 - x_{1-N} + y_0$.

Substitution of $y_1$ into $y_2$ results in $y_2 = x_2 - x_{2-N} + (x_1 - x_{1-N} + y_0) = x_2 + x_1 - x_{2-N} - x_{1-N} + y_0$.

and the preceding equation can be generalized to $y_n = x_n + x_{n-1} - x_{n-N} - x_{n-N-1} + y_{n-2}$.

Because the calculation of $y_n$ requires only inputs and outputs that have been delayed by two or more samples in the above example, the moving average function can be instantiated as a structure with two polyphase processing paths, each running at half the effective clock rate.

Figure 14F:
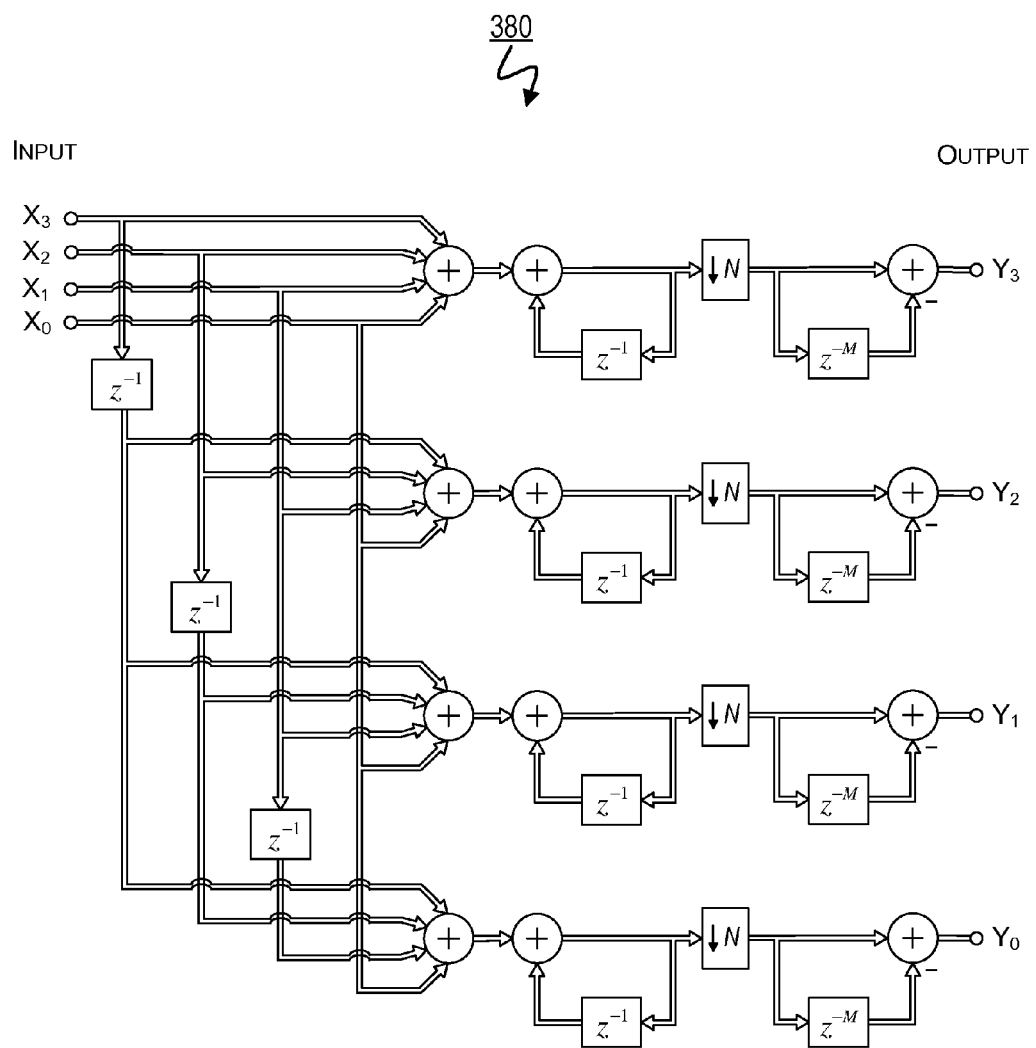
FIG. 14F is a simplified block diagram of a multirate, recursive moving average filter having a polyphase decomposition factor of $m=4$.

The above technique can be extended to reduce clock rates further by using additional hardware to increase the number of polyphase processing paths. For example, FIG. 14F shows a block diagram for a moving average filter 380 implemented using four polyphase processing paths (i.e., polyphase decomposition factor of m=4). As illustrated in FIG. 14C-E, the basic recursive form of the moving average filter requires two adders and M registers. Also, as shown in FIG. 14F for a polyphase decomposition factor of m=4, a multirate implementation of the filter requires 24 adders and 4·M+7 registers for integer ratios of M/n. In general, for a polyphase decomposition factor of m and for M processing branches, the multirate moving average filter requires $m^2 + 2 \cdot m$ adders and $m \cdot (M+2) - 1$ registers for integer ratios of M/n. Thus, ignoring registers, the complexity of the multirate, moving average filter increases as $O(m^2)$ relative to the basic form of the filter.

Compared to conventional $\mathrm{sinc}^{P+1}$ filters, the results in Table 2 indicate that cascaded moving average prototype filters provide comparable quantization noise attenuation with superior signal-to-distortion ratio performance. An additional benefit to the cascaded moving average filter can be lower processing latency. Processing latency is determined by the filter length (L) such that latency $\approx L/(2 \cdot f_{CLK})$, where $f_{CLK}$ is the effective filter clock rate. Specifically, compared to conventional $\mathrm{sinc}^{P+1}$ filters for fourth-order noise shaping where L=5·N·M−4, the exemplary cascaded moving average filter response given in the fifth row of Table 2 has a significant latency advantage for large M since L=4·N·M−2. This advantage can be significant in applications involving control systems and servo mechanisms.

Overall Converter Considerations

The instantaneous bandwidth of the MBO converter technology (e.g., as shown in FIG. 6) is limited only by the maximum sample rate ($f_S$) of the sampling/quantization circuits 114. This sample rate, in turn, can be maximized by implementing circuits 114 as high-speed comparators (i.e., 1-bit quantizers), which currently can have instantaneous bandwidths greater than 10 GHz (i.e., $f_S$=20 GHz). Comparators having such bandwidths are commercially available in SiGe and InP™ integrated circuit process technology.

As noted previously, the resolution performance of the MBO converter can be increased without increasing the converter sample rate by increasing the interleave factor (i.e., the number of processing branches, M), the order of the DFL noise-shaped response P, and/or the stopband attenuation of the Bandpass Moving Average (BMA) signal reconstruction filters. In addition, the MBO converter technology is relatively insensitive to impairments such as clock jitter and thermal noise that degrade the performance of other high-speed converter architectures. This is because impairments such as clock jitter and hard limiter (comparator) noise are subject to the DFL noise-shaped response in a similar manner to quantization noise, exhibiting a frequency response that enables significant attenuation by the BMA filters (e.g., filters 115 and 125).

Simulated resolution performance results for the MBO converter are given in Table 3 for various interleave factors and DFL noise shaping orders.

TABLE 3

Simulated Performance Results for MBO Converter

| Interleave Factor (M) | Noise Shaping Order (P) | Effective Bits of Resolution (B) |
| --- | --- | --- |
| 128 | 2 | 7.3 |
| 64 | 2 | 6.8 |
| 32 | 2 | 5.9 |
| 16 | 2 | 4.6 |
| 128 | 4 | 12.3 |
| 64 | 4 | 10.4 |
| 32 | 4 | 8.4 |
| 16 | 4 | 4.5 |

Summarizing, as compared to the conventional methods, the Multi-Channel Bandpass Oversampling (MBO) converter generally can provide high-resolution, linear-to-discrete signal transformation (ADC conversion):

- with instantaneous bandwidth limited only by the maximum clock frequency of a one-bit comparator (e.g., greater than 10 GHz instantaneous bandwidth with commercially available SiGe or InP™ process technology);
- with conversion resolution and accuracy that are independent of instantaneous bandwidth or sample rate;
- with scalable conversion resolution that is a function of the number of processing branches (interleave factor), the order of the noise-shaped response in the DFL array, and the quality of the Bandpass Moving Average filters (i.e., with conversion accuracy that increases with increasing interleave factor, noise-shaped response order and/or bandpass-filter quality);
- with conversion resolution that, due to noise shaping, is relatively insensitive to traditional analog-to-digital conversion impairments, such as clock jitter, thermal noise, quantizer errors, and component tolerances that affect settling-time, bandwidth and gain;
- with continuous-time noise shaping based on Diplexer Feedback Loops that can be implemented using distributed-element, microwave design principles and can be actively calibrated using relatively simple control loops and error metrics;
- with digital-signal-processing operations that can be implemented using low-complexity moving average filters and using polyphase decomposition to reduce required clock rates; and
- with a novel method that combines frequency interleaving with bandpass oversampling to eliminate the need for complex analog signal reconstruction filters (i.e., analysis/synthesis filter banks).

Figure 16:
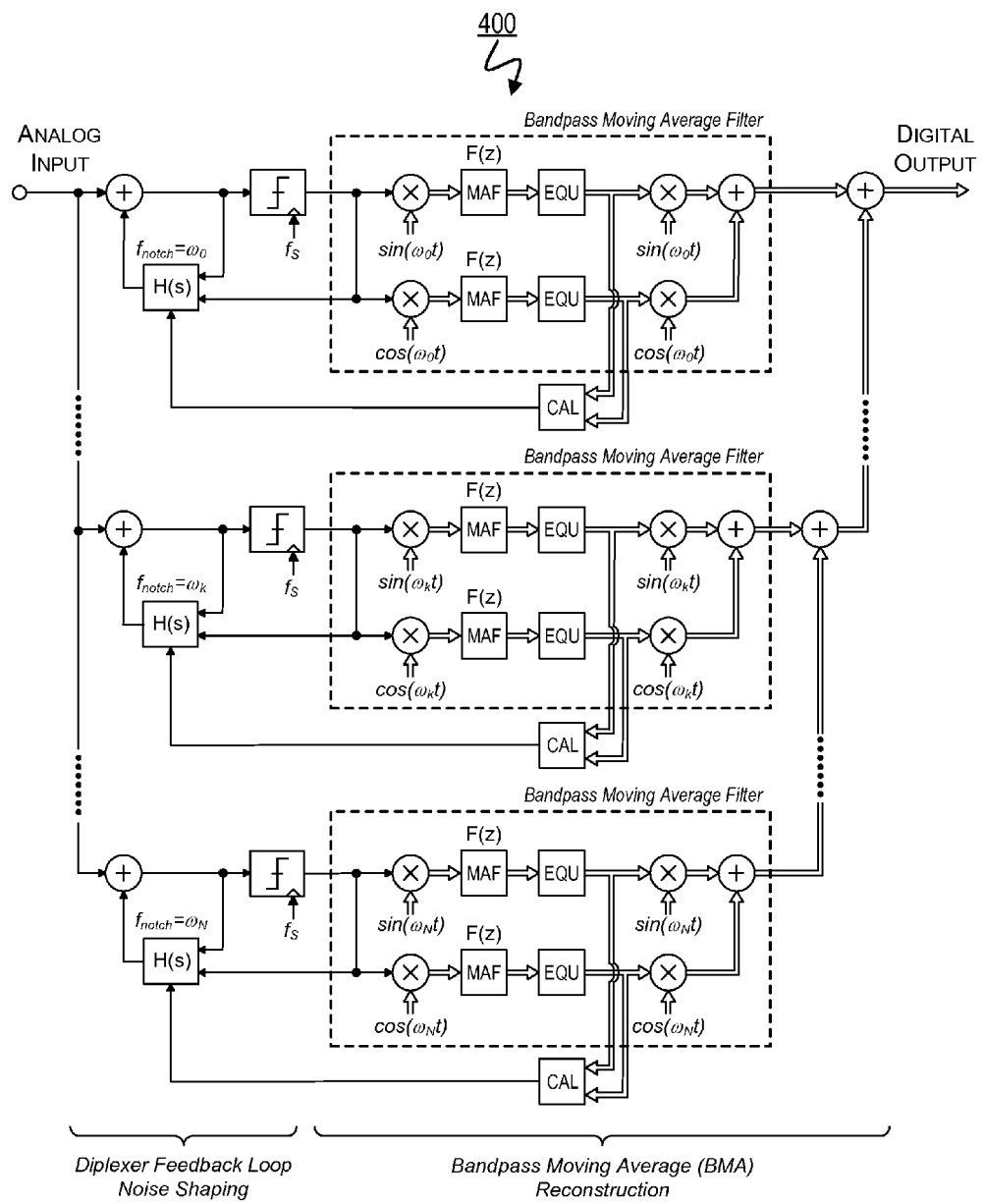
FIG. 16 is a block diagram of a complete MBO converter according to a representative embodiment of the present invention, which incorporates multiple Diplexer Feedback Loop (DFL) noise shaping circuits in conjunction with a Bandpass Moving Average (BMA) filter bank for signal reconstruction.
Figure 17:
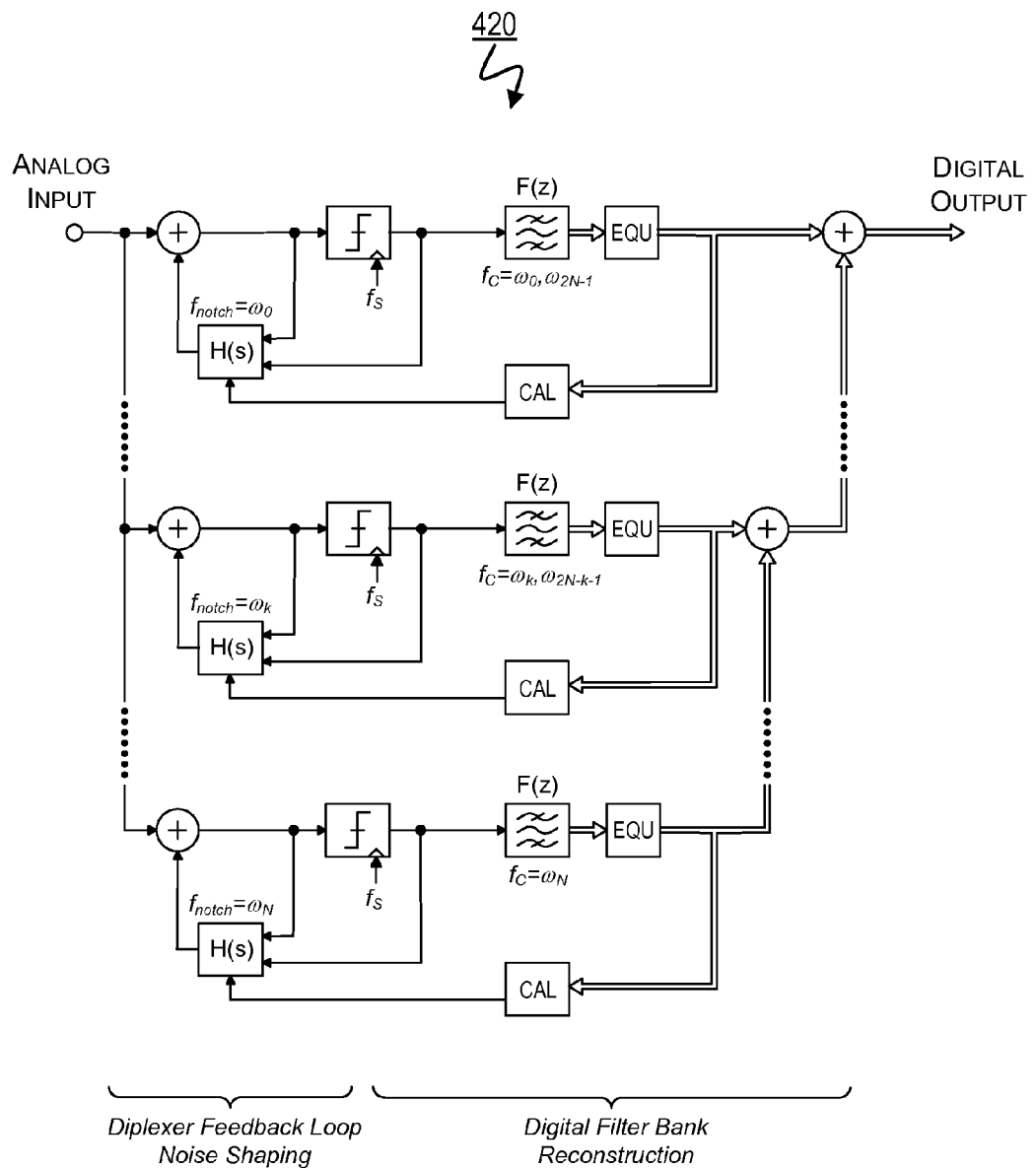
FIG. 17 is a block diagram of a complete MBO converter according to a first alternate representative embodiment of the present invention, which incorporates multiple Diplexer Feedback Loop (DFL) noise shaping circuits in conjunction with a conventional FIR filter bank for signal reconstruction.
Figure 18:
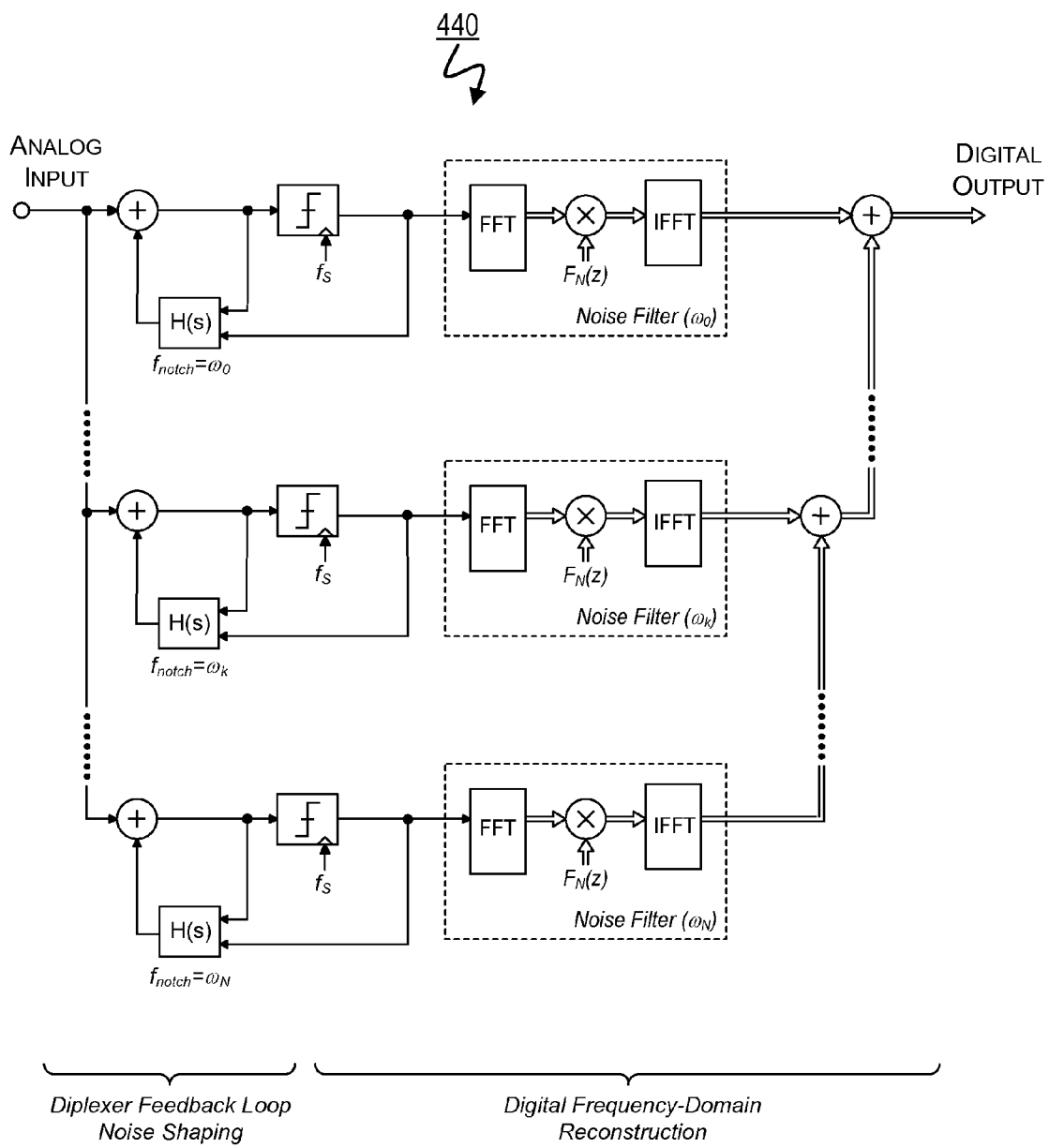
FIG. 18 is a block diagram of a complete MBO converter according to a second alternate embodiment of the present invention, which incorporates multiple Diplexer Feedback Loop (DFL) noise shaping circuits in conjunction with a frequency-domain filter bank for signal reconstruction.

FIG. 16 illustrates a complete MBO converter 400 having single-stage (i.e., second-order), DFL noise shaping of the type illustrated in FIG. 7 and signal reconstruction via the preferred method of BMA reconstruction (i.e., with filter center frequencies corresponding to the centers for the frequency bands that are being processed in the respective branches). FIG. 17 illustrates a complete MBO converter 420 having single-stage, DFL noise shaping of the type illustrated in FIG. 7 and signal reconstruction via the alternative method of a conventional filter bank. FIG. 18 illustrates a complete MBO converter 440 having single-stage, DFL noise shaping of the type illustrated in FIG. 7 and bandpass filters implemented through the use of linear convolution by discrete Fourier transform.

Figure 19:
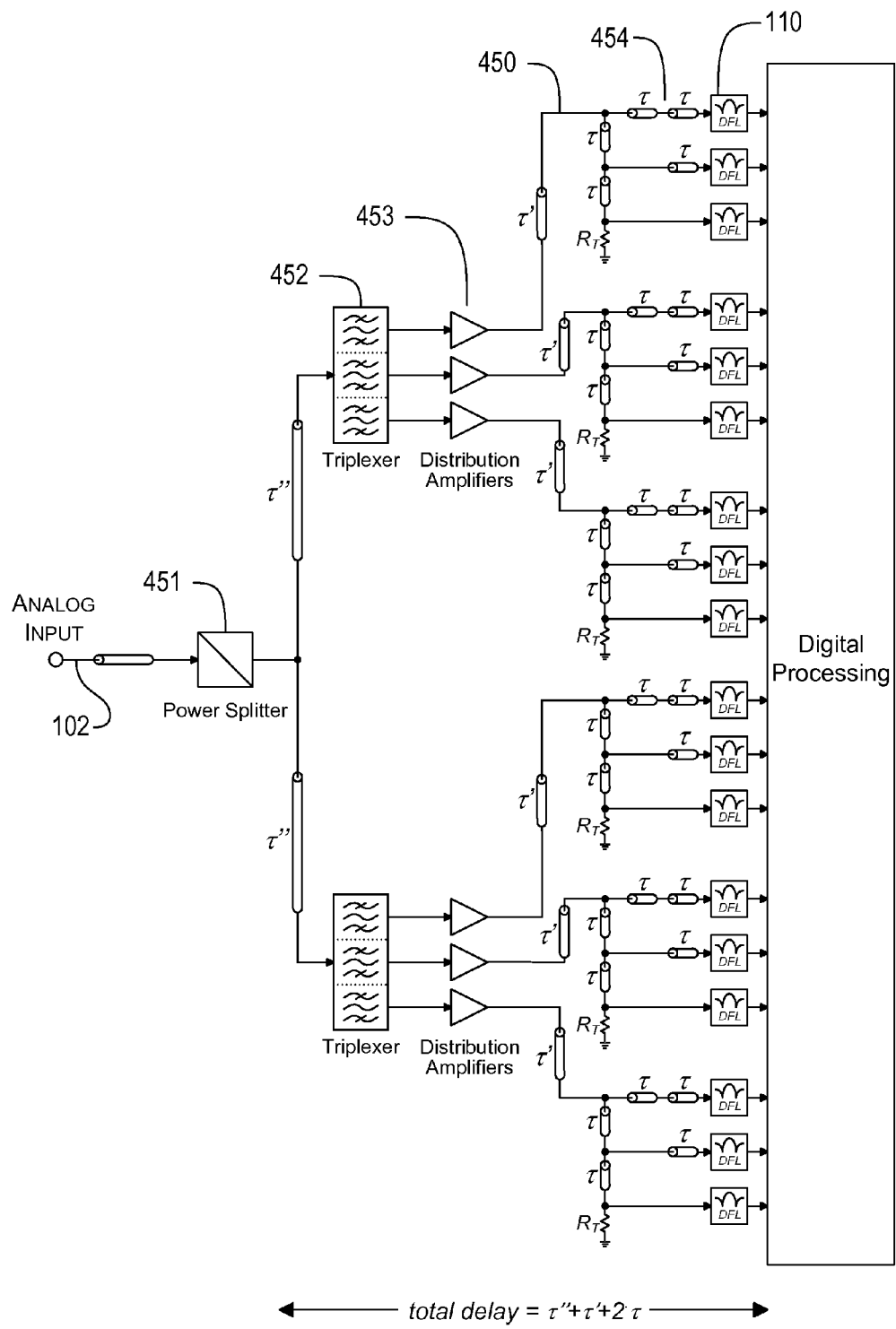
FIG. 19 is a block diagram of a complete MBO converter illustrating an exemplary method for signal distribution across multiple converter processing branches.

Because the input to each DFL noise shaping circuit can be designed for high impedance (>200 ohms), it is possible to "tap off" multiple noise shaping circuits 113 from a single controlled impedance transmission (i.e., signal distribution) line 450 as shown in FIG. 19. For a 50-ohm system with noise shaping circuits 113 having greater than 200 ohm input impedances, preferably fewer than 8 noise shapers 113 are tapped off the same transmission (i.e., signal distribution) line 450 to prevent appreciable loss of signal integrity. The tapped transmission line arrangement simplifies the distribution of the data converter's single analog input to the multiple noise shapers in the array. As shown in FIG. 19, this tapped transmission line technique can be combined with conventional signal-distribution approaches, such as those employing power splitters 451, m-ary diplexers 452 and distribution amplifiers 453, to achieve an optimal trade-off between signal integrity, additive noise, and circuit complexity. Specifically, FIG. 19 shows an exemplary embodiment that combines splitters 451, triplexers 452, distribution amplifiers 453, and the tapped transmission line 450 methods for signal distribution in a system comprising twelve noise shapers 113 (i.e., M=12).

Severe propagation skew (i.e., delay offsets) between the DFLs in the converter array can degrade conversion accuracy. Therefore, to ensure that the analog input signal propagates with equal (or approximately equal) delay to the output of each noise shaper in the array, transmission delay introduced by the tapped transmission line preferably is compensated with added delay 454 at the DFL inputs, as shown in FIG. 19. In the exemplary embodiment shown in FIG. 19, the delay between the analog input and each of the twelve DFL outputs is $\tau''+\tau'+2\tau$.

Because the MBO converter is composed of multiple, independent parallel-processing branches, by isolating or combining MBO processing branches it is possible for the MBO converter to operate in multiple modes. Exemplary operating modes include, but are not limited to: (1) a converter with M distinct channels (i.e., channel being defined by the center frequency $\omega_0$ at which data conversion takes place) where each channel has a conversion bandwidth of $\frac{1}{2} \cdot f_S/M$ (i.e., $f_S$ being the MBO converter sample rate and M being the MBO converter interleave factor, with decimation by N having already occurred in the BMA filter bank); (2) a converter with two channels where the first channel has a conversion bandwidth of ½·$f_S$·(M−2)/M and the second channel has a conversion bandwidth of $f_S$/M (i.e., one wide-bandwidth channel and one narrow-bandwidth channel, with decimation by N having already occurred in the BMA filter bank); (3) a converter with one channel having a processing bandwidth equal to ½·$f_S$; and (4) a converter with n<M channels where each channel has a conversion bandwidth≧½·$f_S$/M (i.e., an arbitrary mix of wide-bandwidth and narrow-bandwidth channels, with decimation by N having already occurred in the BMA filter bank). In general, the number MBO operating modes is restricted only by the constraints that: (1) the total number of output channels does not exceed the MBO converter interleave factor M, and (2) the sum total of all channel processing bandwidths does not exceed the MBO converter Nyquist bandwidth of ½·$f_S$.

Multi-mode operation of the MBO converter is enabled by the addition of an innovation referred to herein as an Add-Multiplex Array (AMA), which is illustrated by the exemplary, simplified block diagram in FIG. 20. As shown in FIG. 20, the AMA 500 is placed between the MBO processing branches 110-140 and the MBO converter output 104. The exemplary AMA 500 consists of: (1) adders 131A-C with two inputs and one output, (2) interleaving multiplexers 502A-C with two inputs and one output, and (3) mode-select multiplexers 503A-C with two-inputs and one output. However, in alternate embodiments these two-input/one-output functions can be substituted with multiple-input/multiple-output equivalents, such as, for example, by replacing two two-input/one-output functions with one four-input/two-output function. As illustrated in FIG. 20, the output of each MBO processing branch (e.g., 110-140) is coupled to one input of an adder 131A&B and one input (i.e., inputs D1a&b and D2a&b) of an interleaving multiplexer 502A&B. The output of each interleaving multiplexer 502A-C is coupled to one input (i.e., inputs S1a-c) of a mode-select multiplexer 503A-C, the other input (i.e., inputs S2a-c) of each mode-select multiplexer 503A-C being coupled to the output of an adder 131A-C. The output of each mode-select multiplexer 503A&B in turn is coupled to one input of an adder 131C and one input (i.e., inputs D1c&D2c) of an interleaving multiplexer 502C. The arrangement described above and shown in FIG. 20 for M=4 processing branches, can likewise be extended to an arbitrary number of processing branches. Once again, as used herein, the term "coupled", or any other form of the word, is intended to mean either directly connected or connected through one or more other processing blocks, e.g., for the purpose of preprocessing.

Referring to the simplified AMA block diagram in FIG. 20, each of the mode-select multiplexers 503A-C is used to choose between a first data stream S1a-c, consisting of alternating samples from two distinct data sources (e.g., processing branch 110 output and processing branch 120 output), and a second data stream S2a-c, which is the sum of the samples from the same two distinct data sources. It should be noted that the samples in the first data stream (i.e., S1a-c) are alternated between the two distinct sources in a manner that effectively reduces the data rate of each data source by a factor of two. A reduction in data rate by a factor of two is conventionally referred to as decimation-by-two, or down-sample-by-two. It should further be noted that samples in the second data stream (i.e., S2a-c) are generated by a summation operation between two distinct data sources (e.g., processing branch 110 output and processing branch 120 output) that involves no data rate decimation. Therefore, the data rates at both inputs (e.g., S1a and S2a) of the mode-select multiplexer 503A-C inputs are equal. Furthermore, each of the alternating samples in the first data stream represents a signal that has half the bandwidth of the signal represented by the sum of samples in the second data stream. Thus, moving through the AMA chain, as data sources pass through interleaving (i.e., alternating samples) paths, channel bandwidth and data rate are reduced (i.e., decimated), whereas as data sources pass through summation (i.e., adder) paths, bandwidth and data rate are preserved (i.e., no decimation). At one extreme is the case where the interleave path is routed through all the mode-select multiplexers 503A-C, resulting in a multi-channel mode of operation with M distinct channels, each having a data rate of $f_S$/M (i.e., each of the distinct channels has a bandwidth of ½·$f_S$/M). At the other extreme is the case where the summation path is routed through all the mode-select multiplexers 503A-C, resulting in a single-channel mode of operation with an output data rate of $f_S$ (i.e., the output bandwidth is ½·$f_S$).

At the output 104 of AMA 500, distinct converter channels can be recovered as necessary (i.e., this step is unnecessary in the single-channel mode of operation) using a demultiplexing operation that extracts and collects samples from the MBO converter output data stream 104 at regular intervals, as determined by the mode-select multiplexer configuration. For example, when the MBO converter is configured for multi-channel operation with M distinct channels, each of the M distinct channels can be recovered by extracting and collecting samples from the MBO output, y(n), at M-sample intervals. More specifically, for M distinct channels, the first channel, $y_1(n)$, consists of samples $$y_1(n)=\{y(1), y(M+1), y(2M+1), y(3M+1), \ldots\},$$

the second channel, $y_2(n)$, consists of samples $$y_2(n)=\{y(2), y(M+2), y(2M+2), y(3M+2), \ldots\},$$

and accordingly, the last channel, $y_M(n)$, consists of samples $$y_M(n)=\{y(M), y(2M), y(4M), y(4M), \ldots\}.$$

Demultiplexing techniques, such as that described above, are conventionally well understood. Also, since the AMA operation is most efficiently implemented when the number of MBO processing branches is a power of two, an interleave factor of M=$2^n$, for integer n, is preferable for a multi-mode converter based on the MBO method.

Finally, it should be noted that the frequency bands processed by the branches (e.g., 110 or 120) may be of equal or unequal widths. That is, rather than frequencies that are spaced uniformly across the converter output bandwidth, such frequencies instead can be non-uniformly spaced.

System Environment

Generally speaking, except where clearly indicated otherwise, all of the systems, methods, functionality and techniques described herein can be practiced with the use of one or more programmable general-purpose computing devices. Such devices typically will include, for example, at least some of the following components interconnected with each other, e.g., via a common bus: one or more central processing units (CPUs); read-only memory (ROM); random access memory (RAM); input/output software and circuitry for interfacing with other devices (e.g., using a hardwired connection, such as a serial port, a parallel port, a USB connection or a FireWire connection, or using a wireless protocol, such as Bluetooth or a 802.11 protocol); software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive or a solid-state drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., a hard disk or solid-state drive), are downloaded into RAM and then are executed by the CPU out of RAM. However, in some cases the process steps initially are stored in RAM or ROM.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, workstations, personal (e.g., desktop, laptop, tablet or slate) computers and/or even smaller computers, such as PDAs, wireless telephones or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality of this invention. Such media include, by way of example, magnetic disks, magnetic tape, optically readable media such as CDs and DVDs, or semiconductor memory such as PCMCIA cards, various types of memory cards, USB memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server device, computer-readable medium or other storage device, client device, or any other kind of device, such references should be understood as encompassing the use of plural such processors, computers, server devices, computer-readable media or other storage devices, client devices, or any other devices, except to the extent clearly indicated otherwise. For instance, a server generally can be implemented using a single device or a cluster of server devices (either local or geographically dispersed), e.g., with appropriate load balancing.

Additional Considerations

In the event of any conflict or inconsistency between the disclosure explicitly set forth herein or in the attached drawings, on the one hand, and any materials incorporated by reference herein, on the other, the present disclosure shall take precedence. In the event of any conflict or inconsistency between the disclosures of any applications or patents incorporated by reference herein, the more recently filed disclosure shall take precedence.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a continuous-time, continuously variable signal into a sampled and quantized signal, comprising:
an input line for accepting an input signal that is continuous in time and continuously variable; and
a processing branch coupled to the input line, said processing branch including: (a) a continuous-time quantization-noise-shaping circuit, (b) a sampling/quantization circuit coupled to an output of the continuous-time quantization-noise-shaping circuit, (c) a digital bandpass filter coupled to an output of the sampling/quantization circuit, and (d) a line coupling the output of the sampling/quantization circuit back into the continuous-time quantization-noise-shaping circuit;
wherein said continuous-time quantization-noise-shaping circuit comprises an adder that includes a plurality of inputs and an output, with the input signal being coupled to one of the inputs of the adder, the output of the adder being coupled to one of the inputs of the adder through a first filter having a first transfer function, and the output of the sampling/quantization circuit being coupled to one of the inputs of the adder through a second filter having a second transfer function,
wherein the continuous-time quantization-noise-shaping circuit has a noise transfer function with a minimum at a particular frequency,
wherein a minimum in the quantization-noise transfer function of the quantization-noise-shaping continuous-time circuit corresponds to a frequency band selected by the digital bandpass filter, and
wherein each of the first transfer function and the second transfer function is at least one of a weighted sum or difference of two filter responses that have group delay and insertion gain that: (i) are approximately constant over the frequency band selected by the digital bandpass filter, and (ii) approach zero at frequencies outside the frequency band selected by the digital bandpass filter.

2. An apparatus according to claim 1, wherein the continuous-time quantization-noise-shaping circuit has a noise transfer function that shapes quantization noise in the frequency band of the digital bandpass filter with an equivalent of a second-order response.

3. An apparatus according to claim 1, wherein the continuous-time quantization-noise-shaping circuit has a noise transfer function that shapes quantization noise in the frequency band of the digital bandpass filter with an equivalent of a fourth-order response.

4. An apparatus according to claim 1, wherein the continuous-time quantization-noise-shaping circuit has a noise transfer function that shapes quantization noise in the frequency band of the digital bandpass filter with an equivalent of a sixth-order response.

5. An apparatus according to claim 1, wherein the sampling/quantization circuit is a single-bit quantizer.

6. An apparatus according to claim 1, wherein the sampling/quantization circuit is a multi-bit quantizer.

7. An apparatus according to claim 1, further comprising an active calibration component that adjusts a parameter of at least one component of the continuous-time quantization-noise-shaping circuit.

8. An apparatus according to claim 1, wherein each of the first transfer function and the second transfer function non-trivially modifies at least one of amplitude and phase.

9. An apparatus according to claim 8, wherein the first transfer function delays by no less than ¼ of a sampling period used by the sampling/quantization circuit ($T_S$).

10. An apparatus according to claim 9, wherein each of the first transfer function and the second transfer function comprises delay elements that are implemented using transmission lines.

11. An apparatus according to claim 8, wherein each of the first transfer function and the second transfer function comprises low-pass filtering with a 3 dB corner frequency that is no more than $3 \cdot f_S$ and no less than the bandwidth of the continuous-time, continuously variable input signal, where $f_S$ is the sample rate of the sampling/quantization circuit.

12. An apparatus according to claim 8, wherein the continuous-time quantization-noise-shaping circuit shapes quantization noise with a second-order response.

13. An apparatus according to claim 8, wherein the continuous-time quantization-noise-shaping circuit shapes quantization noise with a fourth-order response.

14. An apparatus according to claim 8, wherein the continuous-time quantization-noise-shaping circuit shapes quantization noise with a sixth-order response.

15. An apparatus according to claim 1, wherein each of the first transfer function and the second transfer function is one of the weighted sum or difference of two lowpass filter responses.

16. An apparatus according to claim 1, wherein the first filter is implemented as a first component followed by a third component, and wherein the second filter is implemented as a second component followed by the third component.

17. An apparatus according to claim 1, wherein at least a portion of the second transfer function is integrated into the sampling/quantization circuit.

18. An apparatus according to claim 1, further comprising a configurable component that adjusts the response of the quantization-noise-shaping continuous-time circuit by varying a parameter of at least one component of the continuous-time quantization-noise-shaping circuit.

19. An apparatus according to claim 18, wherein the configurable component dynamically adjusts the noise transfer function of the quantization-noise-shaping continuous-time circuit to minimize at least one of absolute value or power of residual quantization noise at an output of the digital bandpass filter.

20. An apparatus according to claim 18, wherein the configurable component controls the location of the spectral minimum in the noise transfer function of the continuous-time quantization-noise-shaping continuous-time circuit, so that the spectral minimum can be placed at arbitrary locations.

21. An apparatus according to claim 1, further comprising at least one additional processing branch coupled to the input line, and wherein each of said processing branches converts a different frequency band of the input signal.

22. An apparatus according to claim 21, wherein there are a total of M said processing branches, wherein the sampling/quantization circuit in each said processing branch samples at a rate of $2 \cdot N \cdot M \cdot BW$ samples per second, with BW being the bandwidth of the frequency band for the corresponding processing branch, and wherein M×N is at least 16.

23. An apparatus according to claim 21, wherein there are at least 16 said processing branches.

24. An apparatus according to claim 21, wherein the minima of the noise transfer functions of the continuous-time quantization-noise-shaping circuits in said processing branches are spaced at equal frequency intervals.

25. An apparatus according to claim 21, wherein the minima of the noise transfer functions of the continuous-time quantization-noise-shaping circuits in said processing branches are spaced at non-equal frequency intervals.

26. An apparatus according to claim 21, wherein the digital bandpass filter in each of a plurality of said processing branches comprises a frequency downconverter, a low-pass filter, and a frequency upconverter.

27. An apparatus according to claim 26, wherein at least one of the digital bandpass filters incorporates a recursive moving average structure.

28. An apparatus according to claim 26, wherein at least one of the digital bandpass filters is comprised of cascaded moving average filter stages that collectively provide spectral minima at frequencies other than multiples of $f_S/(N \cdot M)$, where $f_S$ is the sample rate of the sampling/quantization circuit, N is an excess-rate oversampling ratio, and M is the number of said processing branches.

29. An apparatus according to claim 26, wherein at least one of the digital bandpass filters is implemented as a polyphase decomposition structure.

30. An apparatus according to claim 29, wherein a polyphase decomposition factor, m, of the polyphase decomposition structure is a submultiple of the number of processing branches, M.

31. An apparatus according to claim 26, wherein at least one of the digital bandpass filters is comprised of cascaded moving average filter stages, wherein each of the stages averages the same number of samples, and wherein the number of stages is other than one plus an effective noise-shaping order of the continuous-time quantization-noise-shaping circuit response.

32. An apparatus according to claim 31, wherein the number of moving average stages is one of zero, two, three, or four plus an effective noise-shaping order of the continuous-time quantization-noise-shaping circuit response.

33. An apparatus according to claim 26, wherein at least one of the digital bandpass filters is comprised of cascaded moving average filter stages, and wherein at least one of the stages averages a number of samples that is different by more than one from a number of samples averaged by the other stages.

34. An apparatus according to claim 33, wherein the number of samples averaged by one of the stages is different from the other stages by more than ¼·M·N and less than 2·M·N, where N is an excess-rate oversampling ratio and M is the number of processing branches.

35. An apparatus according to claim 26, wherein at least one of the digital bandpass filters is comprised of cascaded moving average filter stages having an impulse response length that is at least 2·N·M−5, where N is an excess-rate oversampling ratio and M is the number of processing branches.

36. An apparatus according to claim 26, wherein at least one of the digital bandpass filters is comprised of cascaded moving average filter stages having an impulse response length that is at least 4·N·M−5, where N is an excess-rate oversampling ratio and M is the number of processing branches.

37. An apparatus according to claim 26, wherein at least one of the digital bandpass filters is comprised of a recursive window filter having an impulse response length that is at least 2·N·M−2, where N is an excess-rate oversampling ratio and M is the number of processing branches.

38. An apparatus according to claim 26, wherein at least one of the digital bandpass filters is comprised of a recursive window filter having an impulse response length that is at least 4·N·M−4, where N is an excess-rate oversampling ratio and M is the number of processing branches.

39. An apparatus according to claim 26, wherein at least one of the digital bandpass filters further includes an equalizer.

40. An apparatus according to claim 39, wherein the equalizer has a single complex tap.

41. An apparatus according to claim 39, wherein the equalizer has a single real tap.

42. An apparatus according to claim 39, wherein the equalizer has plural complex taps.

43. An apparatus according to claim 39, wherein the equalizer has plural real taps.

44. An apparatus according to claim 26, wherein sine and cosine sequences are used for quadrature downconversion and upconversion and are generated using a direct digital synthesis method based on digital accumulators and sinusoid lookup tables.

45. An apparatus according to claim 26, wherein sine and cosine sequences are used for quadrature downconversion and upconversion and are generated using recursive structures.

46. An apparatus according to claim 21, wherein the sampling/quantization circuit in each of a plurality of said processing branches samples at a frequency of at least 1 gigahertz (GHz).

47. An apparatus according to claim 21, wherein the digital bandpass filters in different ones of said processing branches select different frequency bands that collectively cover a desired frequency range.

48. An apparatus according to claim 21, wherein the digital bandpass filters in different ones of said processing branches have at least one of: (i) center frequencies that are spaced at equal intervals, and (ii) bandwidths that are equal to each other.

49. An apparatus according to claim 21, wherein the digital bandpass filters in different ones of said processing branches have at least one of: (i) center frequencies that are spaced at non-equal intervals, and (ii) bandwidths that are not all equal to each other.

50. An apparatus according to claim 21, wherein a configuration means is provided to enable plural modes of operation, including: (i) a mode for operation as a single, wideband converter with high output data rate, and (ii) a mode for operation as plural, independent converters having an arbitrary mix of narrowband and wideband outputs at various sample rates.

51. An apparatus according to claim 50, wherein the configuration means comprises an add-multiplex array.

52. An apparatus according to claim 50, wherein the number of processing branches M is a power of two.

53. An apparatus according to claim 21, wherein there are at least 4 said processing branches, and in each of a plurality of said processing branches: the continuous-time quantization-noise-shaping circuit includes at least a second-order feedback filter, the sampling/quantization circuit samples at a frequency of at least 1 gigahertz (GHz), and the digital bandpass filter attenuates shaped quantization noise by at least 40 dB and introduces total aliasing distortion power limited to less than 40 dB below data converter signal level.

54. An apparatus according to claim 21, wherein the continuous-time quantization-noise-shaping circuits in different ones of said processing branches have identical, or substantially identical, circuit configurations, and wherein different processing branches operate on different frequency bands by setting corresponding parameter values.

55. An apparatus according to claim 54, wherein at least one of the lowpass filter responses is between second to fifth order, inclusively.

56. An apparatus according to claim 21, further comprising an adder coupled to outputs of said processing branches.

* * * * *

UNITED STATES PATENT AND TRADEMARK OFFICE
CERTIFICATE OF CORRECTION

PATENT NO. : 8,299,947 B2  
APPLICATION NO. : 12/985238  
DATED : October 30, 2012  
INVENTOR(S) : Christopher Pagnanelli Page 1 of 1

It is certified that error appears in the above-identified patent and that said Letters Patent is hereby corrected as shown below:

In column 17 lines 46-59, replace the entire equation with the following equation:

$$NTF(s) = \frac{1 + G \cdot \left( \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k} \right)}{1 + G \cdot \left( \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k} \right) - \left( \varphi_{10} \cdot \frac{\beta''_{100} \cdot e^{-sT_{10}}}{\sum_{k=0}^{5} \beta''_{10k} \cdot s^k} + \varphi_{11} \cdot \frac{\beta''_{110} \cdot e^{-sT_{11}}}{\sum_{k=0}^{5} \beta''_{11k} \cdot s^k} \right)}$$

In column 21 line 67, change "(e.g., $T_1$, $T_2$, $T_3$, $T_4$, $\varphi_0$, $\varphi_1$, $\beta_0$, $\beta_1$, and $\beta_2$" to --(e.g., $T_1$, $T_2$, $T_3$, $T_4$, $\varphi_0$, $\varphi_1$, $\beta_0$, $\beta_1$, and $\beta_3$--.

In claim 55, change "claim 54" to --claim 15--.

Signed and Sealed this  
Twelfth Day of February, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,299,947 B2  Page 1 of 1
APPLICATION NO. : 12/985238
DATED : October 30, 2012
INVENTOR(S) : Christopher Pagnanelli It is certified that error appears in the above-identified patent and that said Letters Patent is hereby corrected as shown below:

In column 17 lines 46-59, replace the entire equation with the following equation:

$$NTF(s) = \frac{1 + G \cdot \left( \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k} \right)}{1 + G \cdot \left( \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k} \right) - \left( \varphi_{10} \cdot \frac{\beta''_{100} \cdot e^{-sT_{10}}}{\sum_{k=0}^{5} \beta''_{10k} \cdot s^k} + \varphi_{11} \cdot \frac{\beta''_{110} \cdot e^{-sT_{11}}}{\sum_{k=0}^{5} \beta''_{11k} \cdot s^k} \right)}$$

In column 21 line 67, change "(e.g., $T_1$, $T_2$, $T_3$, $T_4$, $\varphi_0$, $\varphi_1$, $\beta_0$, $\beta_1$, and $\beta_2$" to
--(e.g., $T_1$, $T_2$, $T_3$, $T_4$, $\varphi_0$, $\varphi_1$, $\beta_0$, $\beta_1$, and $\beta_3$--.

In column 42 line 58 (Claim 55, line 1), change "claim 54" to --claim 15--.

This certificate supersedes the Certificate of Correction issued February 12, 2013.

Signed and Sealed this
Nineteenth Day of March, 2013

Teresa Stanek Rea
*Acting Director of the United States Patent and Trademark Office*